(12) United States Patent
Kim et al.

(10) Patent No.: US 9,431,522 B2
(45) Date of Patent: Aug. 30, 2016

(54) METHODS OF MANUFACTURING FINFET SEMICONDUCTOR DEVICES USING SACRIFICIAL GATE PATTERNS AND SELECTIVE OXIDIZATION OF A FIN

(71) Applicant: Samsung Electronics Co., Ltd., Suwon-si, Gyeonggi-do (KR)

(72) Inventors: Sungmin Kim, Incheon (KR); Sung-Dae Suk, Seoul (KR); Jaehoo Park, Hwasung-si (KR); Dongho Cha, Seongnam-si (KR); Daewon Ha, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/003,288

(22) Filed: Jan. 21, 2016

(65) Prior Publication Data

US 2016/0141392 A1    May 19, 2016

Related U.S. Application Data

(62) Division of application No. 14/262,937, filed on Apr. 28, 2014, now Pat. No. 9,276,087.

(30) Foreign Application Priority Data

May 10, 2013 (KR) ........................ 10-2013-0053207
Jun. 18, 2013 (KR) ........................ 10-2013-0069736

(51) Int. Cl.
*H01L 21/84* (2006.01)
*H01L 29/66* (2006.01)
*H01L 21/02* (2006.01)
*H01L 21/308* (2006.01)
*H01L 21/762* (2006.01)
*H01L 29/06* (2006.01)

(52) U.S. Cl.
CPC ... *H01L 29/66795* (2013.01); *H01L 21/02233* (2013.01); *H01L 21/308* (2013.01); *H01L 21/76224* (2013.01); *H01L 21/845* (2013.01); *H01L 29/0649* (2013.01); *H01L 29/6656* (2013.01); *H01L 29/66545* (2013.01)

(58) Field of Classification Search
CPC .................. H01L 21/02225; H01L 21/02227; H01L 21/8232
See application file for complete search history.

(56) References Cited

U.S. PATENT DOCUMENTS

| | | |
|---|---|---|
| 7,074,662 B2 | 7/2006 | Lee et al. |
| 7,122,431 B2 | 10/2006 | Kim et al. |
| 7,326,634 B2 | 2/2008 | Lindert et al. |

(Continued)

FOREIGN PATENT DOCUMENTS

| | | |
|---|---|---|
| KR | 10-2005-0055978 A | 6/2005 |
| KR | 10-2005-0107090 A | 11/2005 |

(Continued)

*Primary Examiner* — Cheung Lee
(74) *Attorney, Agent, or Firm* — Myers Bigel & Sibley, P.A.

(57) ABSTRACT

A method of manufacturing a semiconductor device includes patterning a substrate to form an active fin, forming a sacrificial gate pattern crossing over the active fin on the substrate, forming an interlayer insulating layer on the sacrificial gate pattern, removing the sacrificial gate pattern to form a gap region exposing the active fin in the interlayer insulating layer, and oxidizing a portion of the active fin exposed by the gap region to form an insulation pattern between the active fin and the substrate.

16 Claims, 58 Drawing Sheets

(56) References Cited

U.S. PATENT DOCUMENTS

| | | |
|---|---|---|
| 7,396,710 B2 | 7/2008 | Okuno |
| 7,495,285 B2 | 2/2009 | Lee |
| 7,541,645 B2 | 6/2009 | Kim et al. |
| 7,701,008 B2 | 4/2010 | Yeo et al. |
| 7,879,660 B2 | 2/2011 | Booth, Jr. et al. |
| 7,879,677 B2 | 2/2011 | Lee |
| 7,972,914 B2 | 7/2011 | Kim et al. |
| 8,048,723 B2 | 11/2011 | Chang et al. |
| 8,174,073 B2 | 5/2012 | Lee et al. |
| 8,263,462 B2 | 9/2012 | Hung et al. |
| 8,389,347 B2 | 3/2013 | Tezuka et al. |
| 2007/0194353 A1 | 8/2007 | Snyder |
| 2008/0237655 A1 | 10/2008 | Nakabayashi et al. |
| 2012/0083107 A1 | 4/2012 | Chang et al. |
| 2012/0113730 A1 | 5/2012 | Cristoloveanu et al. |
| 2014/0231872 A1 | 8/2014 | Colinge et al. |
| 2014/0239393 A1* | 8/2014 | Kuo ............... H01L 29/785 257/347 |
| 2014/0264592 A1 | 9/2014 | Oxland et al. |

FOREIGN PATENT DOCUMENTS

| | | |
|---|---|---|
| KR | 10-2006-0124904 A | 12/2006 |
| KR | 10-2007-0070890 A | 7/2007 |
| KR | 10-0905178 B1 | 6/2009 |

* cited by examiner

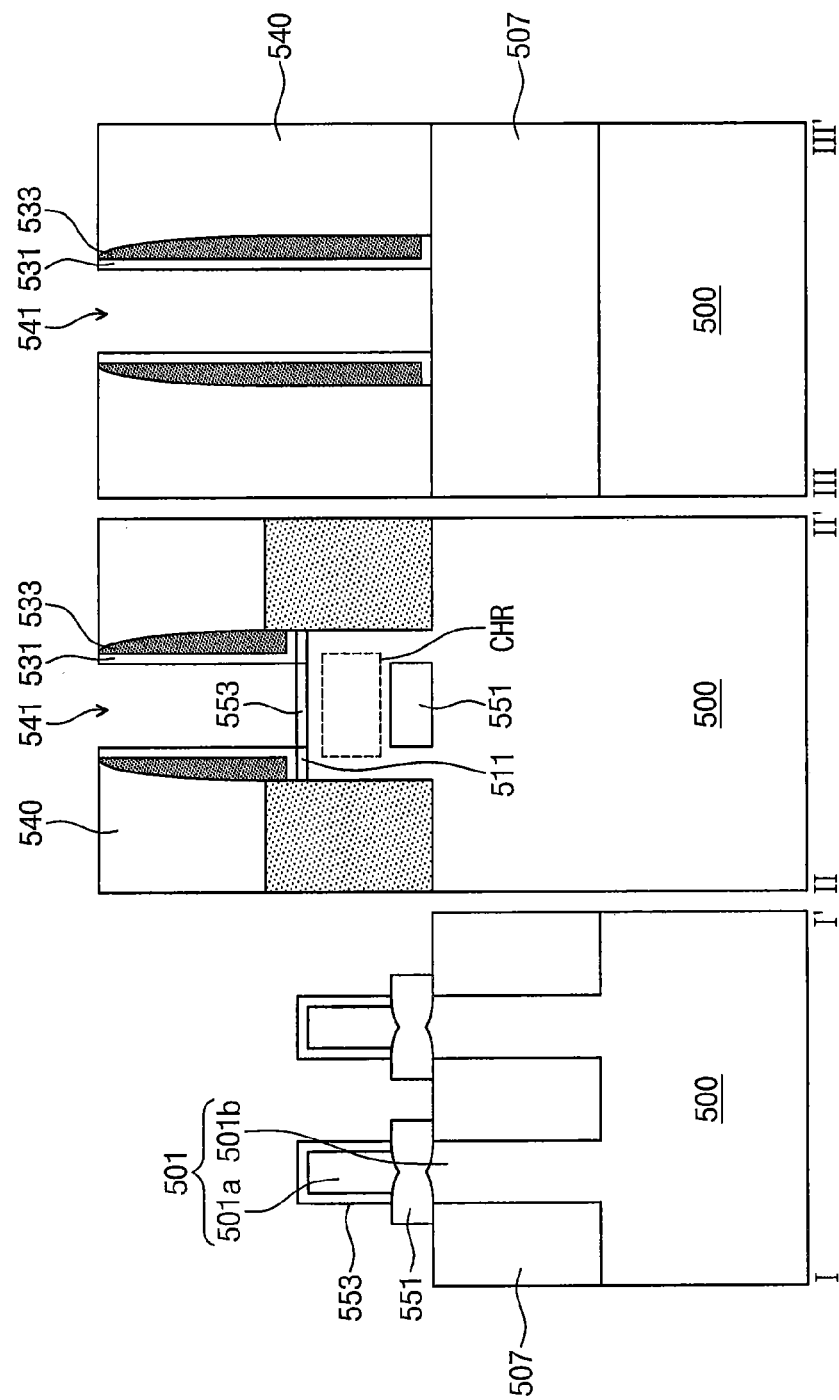

METHODS OF MANUFACTURING FINFET SEMICONDUCTOR DEVICES USING SACRIFICIAL GATE PATTERNS AND SELECTIVE OXIDIZATION OF A FIN

CROSS-REFERENCE TO RELATED APPLICATIONS

This application is a divisional of U.S. patent application Ser. No. 14/262,937, filed Apr. 28, 2014, which itself is a U.S. non-provisional patent application claiming priority under 35 U.S.C. §119 to Korean Patent Application Nos. 10-2013-0053207 and 10-2013-0069736, filed on May 10, 2013 and Jun. 18, 2013, respectively, the disclosures of all of which are hereby incorporated by reference in their entireties.

BACKGROUND

The inventive concepts relate to methods of manufacturing a semiconductor device and, more particularly, to methods of manufacturing a semiconductor device including a fin field effect transistor (FINFET).

Semiconductor devices include integrated circuits having metal-oxide-semiconductor field effect transistors (MOSFETs). As sizes and design rules of semiconductor devices have been reduced, sizes of MOSFETs have been more and more reduced. Size reduction of MOSFETs may cause a short channel effect, so that operation characteristics of semiconductor devices may be deteriorated. Thus, various researches are being conducted for highly integrated semiconductor devices that can have excellent performance. One such device is a FINFET.

SUMMARY

Embodiments of the inventive concepts may provide methods of manufacturing a semiconductor device capable of reducing or improving a short channel effect.

Embodiments of the inventive concepts may also provide methods of manufacturing a semiconductor device capable of improving self-heating characteristics.

Embodiments of the inventive concepts may further provide methods of manufacturing a semiconductor device capable of improved electrical characteristics.

In one aspect, a method of manufacturing a semiconductor device may include: patterning a substrate to form an active fin; forming a sacrificial gate pattern crossing over the active fin on the substrate; forming an interlayer insulating layer on the sacrificial gate pattern; removing the sacrificial gate pattern to form a gap region exposing the active fin in the interlayer insulating layer; and oxidizing a portion of the active fin exposed by the gap region to form an insulation pattern between the active fin and the substrate.

In some embodiments, patterning the substrate to form the active fin may include: patterning the substrate to form a first portion of an active fin; forming device isolation patterns having sidewalls aligned with sidewalls of the first portion of the active fin on or in the substrate; and etching upper portions of the device isolation patterns to form a second portion of the active fin. The second portion may have sidewalls exposed by the etched device isolation patterns.

In some embodiments, oxidizing the portion of the active fin to form the insulation pattern between the active fin and the substrate may include: performing an oxidation process on the second portion of the active fin.

In some embodiments, the insulation pattern may be connected to the device isolation patterns which are adjacent to each other with the insulation pattern therebetween.

In some embodiments, oxidizing the portion of the active fin to form the insulation pattern between the active fin and the substrate may further include: etching portions of the sidewalls of the second portion of the active fin before performing the oxidation process.

In some embodiments, oxidizing the portion of the active fin to form the insulation pattern between the active fin and the substrate may further include: oxidizing a portion of the substrate under the second portion of the active fin by the oxidation process.

In some embodiments, the active fin may include a first region under the sacrificial gate pattern and second regions at both sides of the sacrificial gate pattern. In this case, the method may further include: etching the second regions of the active fin to expose the substrate at both sides of the sacrificial gate pattern; and growing an epitaxial layer from the exposed substrate to form source/drain regions.

In another aspect, a method of manufacturing a semiconductor device may include: patterning a semiconductor substrate to form an active pattern; forming oxidation reducing spacers on upper sidewalls of the active pattern; forming a dummy gate pattern crossing over the active pattern and the oxidation reducing spacers; forming protecting spacers on both sidewalls of the dummy gate pattern, the protecting spacers comprising a material having an etch selectivity with respect to the oxidation reducing spacers; removing the dummy gate pattern to form a gate region exposing lower sidewalls of the active pattern between the protecting spacers; oxidizing the lower sidewalls of the active pattern exposed by the gate region to form a local insulation pattern in the active pattern; and forming a gate electrode in the gate region.

In another aspect, a method of manufacturing a semiconductor device may include forming a fin that protrudes away from a substrate. A device isolation region is formed on sidewalls of the fin, and an insulation pattern is formed in the fin such that the device isolation region directly contacts the insulation pattern. A gate pattern is formed crossing over the fin. A source region and a drain region are epitaxially grown from the fin such that the source region and the drain region are on opposite sides of the gate pattern.

In some embodiments, the forming a device isolation region on sidewalls of the fin and an insulation pattern in the fin such that the device isolation region directly contacts the insulation pattern comprises forming the device isolation region on a first portion of the sidewalls of the fin that are adjacent the substrate so as to expose a second portion of the sidewalls that are remote from the substrate and oxidizing the fin at an interface between the first and second portions to form the insulation pattern in the fin that directly contacts the device isolation region.

In some embodiments, the epitaxially growing a source region and a drain region from the fin such that the source region and the drain region are on opposite sides of the gate pattern comprises exposing two spaced-apart top portions of the fin that are remote from the substrate, epitaxially growing the source region and the drain region from the fin at the respective two spaced-apart top portions of the fin, and forming the gate pattern between the source region and the drain region.

Moreover, in some embodiments, the exposing two spaced-apart top portions of the fin that are remote from the substrate is preceded by forming a sacrificial gate pattern across the fin to define the two spaced-apart patterns of the fin. The forming the gate pattern between the source and drain regions is preceded by removing the sacrificial gate pattern.

BRIEF DESCRIPTION OF THE DRAWINGS

The inventive concepts will become more apparent in view of the attached drawings and accompanying detailed description.

FIGS. 2A to 11A are perspective views illustrating a method of manufacturing a semiconductor device according to some embodiments of the inventive concepts;

FIGS. 2B to 11B are cross-sectional views taken along lines I-I' of FIGS. 2A to 11A, respectively;

FIGS. 2C to 11C are cross-sectional views taken along lines II-II' of FIGS. 2A to 11A, respectively;

FIGS. 13A to 26A are perspective views illustrating a method of manufacturing a semiconductor device according to other embodiments of the inventive concepts;

FIGS. 13B to 26B are cross-sectional views taken along lines II-IF, and to illustrate a method of manufacturing a semiconductor device according to other embodiments of the inventive concepts;

DETAILED DESCRIPTION OF THE EMBODIMENTS

Figure 1:
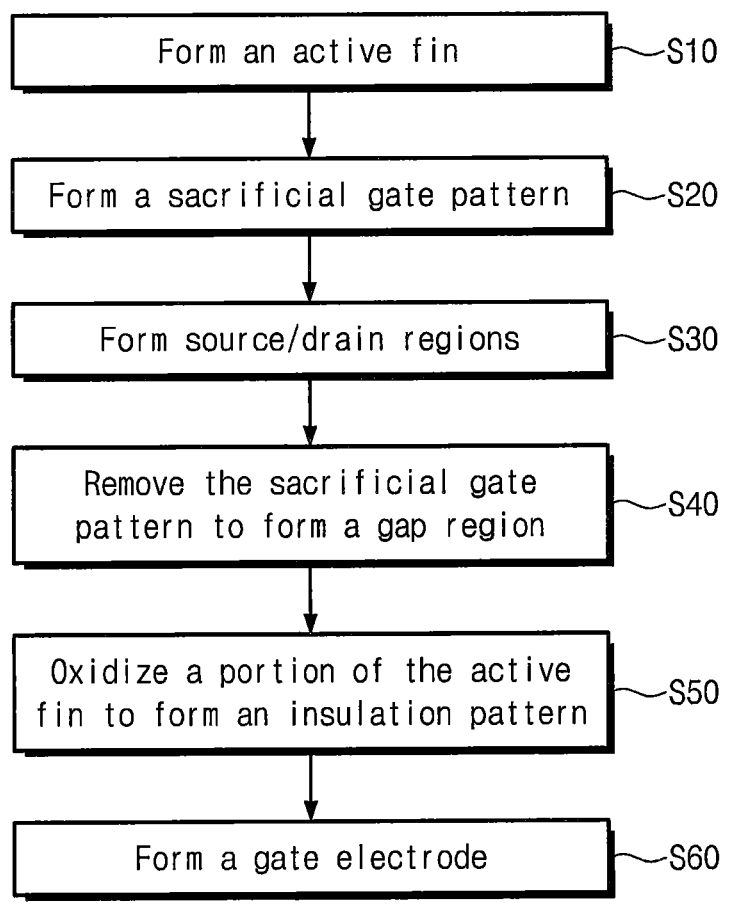
FIG. 1 is a flowchart illustrating a method of manufacturing a semiconductor device according to some embodiments of the inventive concepts.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the inventive concepts. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal example views of the inventive concepts. Accordingly, shapes of the example views may be modified according to manufacturing techniques and/or allowable errors. Therefore, the embodiments of the inventive concepts are not limited to the specific shape illustrated in the example views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Example embodiments of aspects of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

FIG. 1 is a flowchart illustrating a method of manufacturing a semiconductor device according to some embodiments of the inventive concepts. FIGS. 2A to 11A are perspective views illustrating a method of manufacturing a semiconductor device according to some embodiments of the inventive concepts. FIGS. 2B to 11B are cross-sectional views taken along lines I-I' of FIGS. 2A to 11A, respectively. FIGS. 2C to 11C are cross-sectional views taken along lines II-II' of FIGS. 2A to 11A, respectively.

Figure 2A:
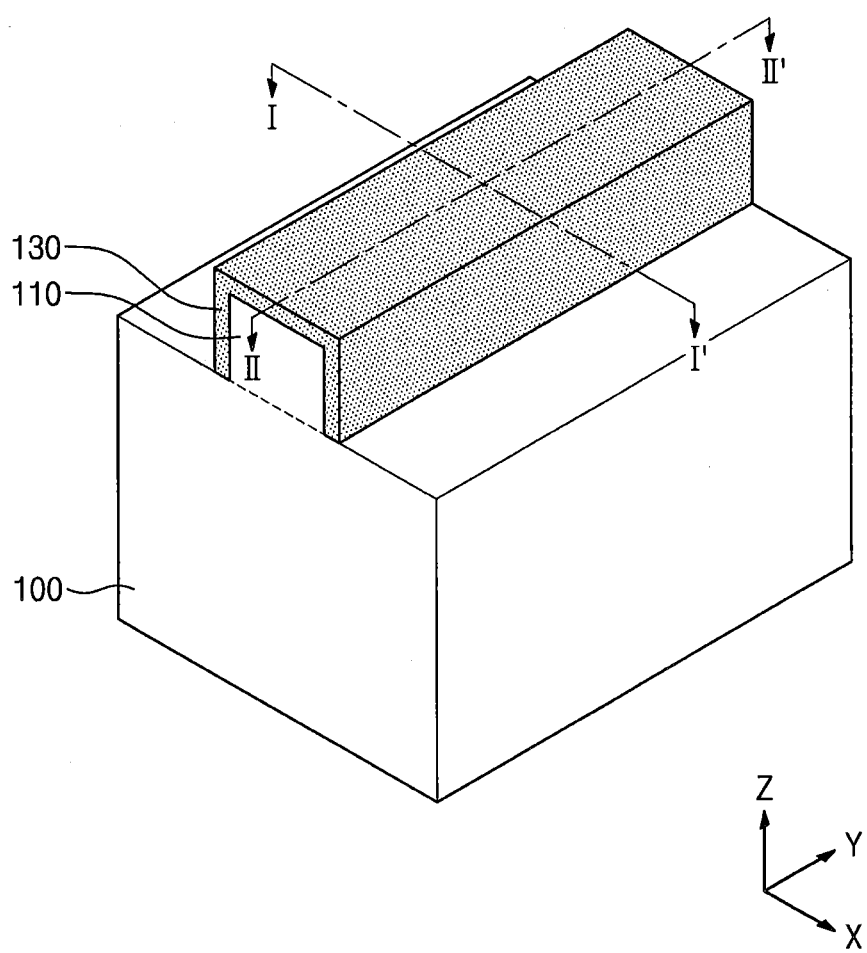
Figure 2B:
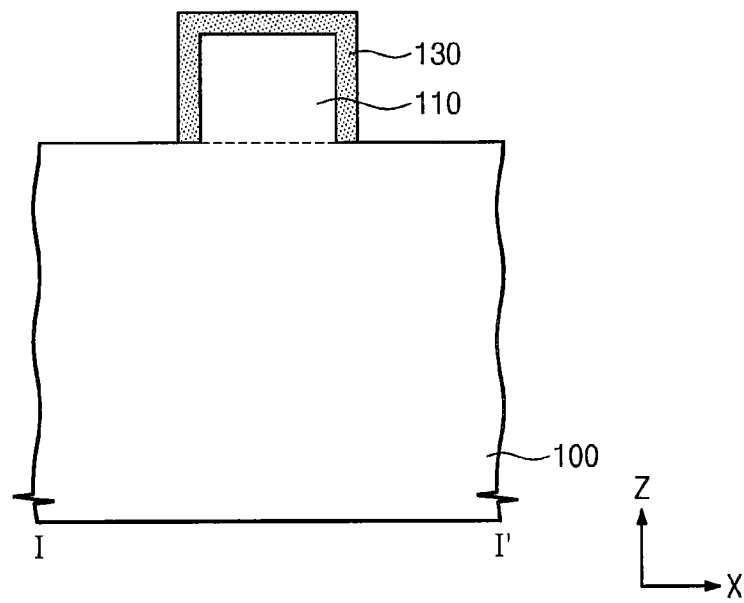
Figure 2C:
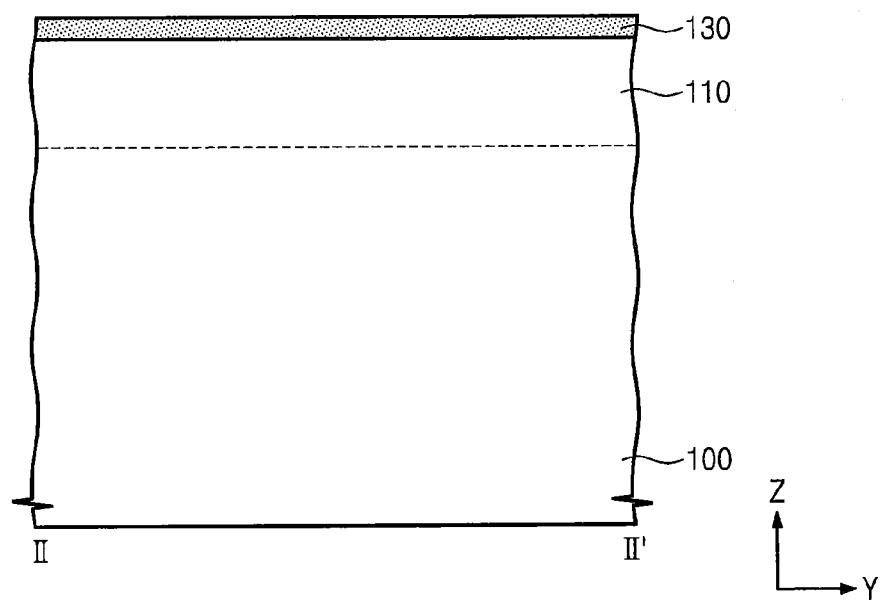

Referring to FIGS. 2A, 2B, and 2C, a substrate 100 may be patterned to form a first portion 110 of an active fin. The substrate 100 may be a silicon substrate or a silicon-on-insulator (SOI) substrate. A capping layer (not shown) may be formed on the substrate 100 including the first portion 110 of the active fin and then the capping layer may be etched to form a capping pattern 130 on, and in some embodiments covering, a top surface and sidewalls of the first portion 110 of the active fin. For example, the capping pattern 130 may include silicon nitride (SiN).

Figure 3A:
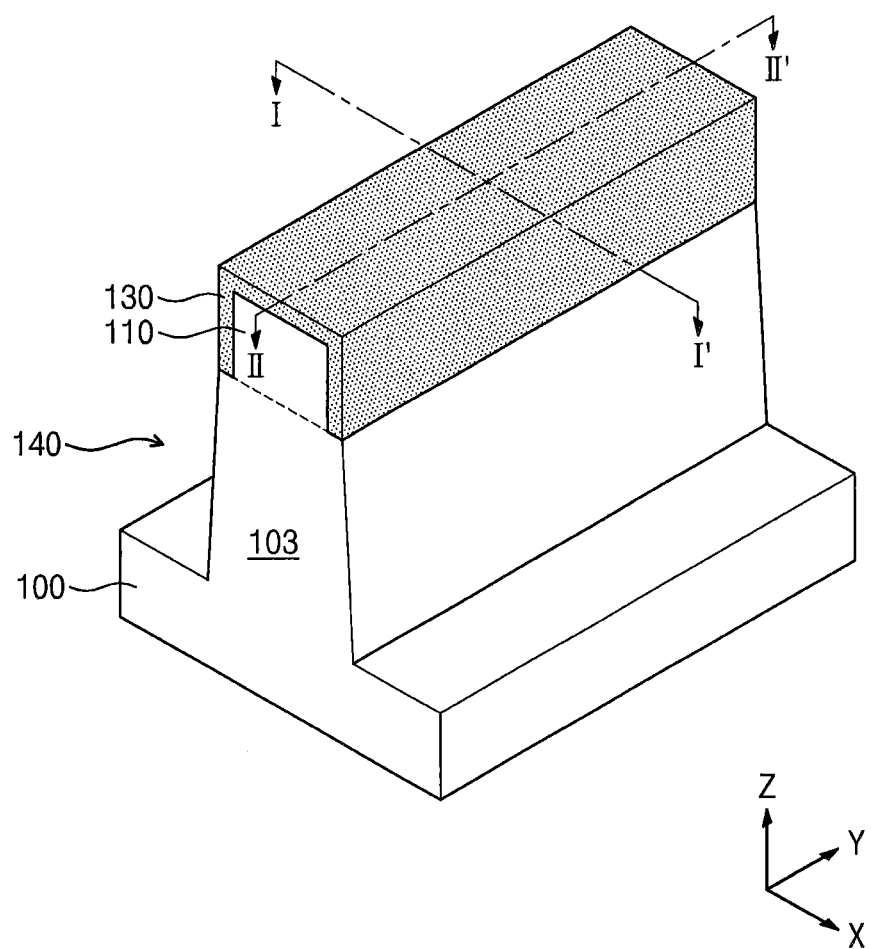
Figure 3B:
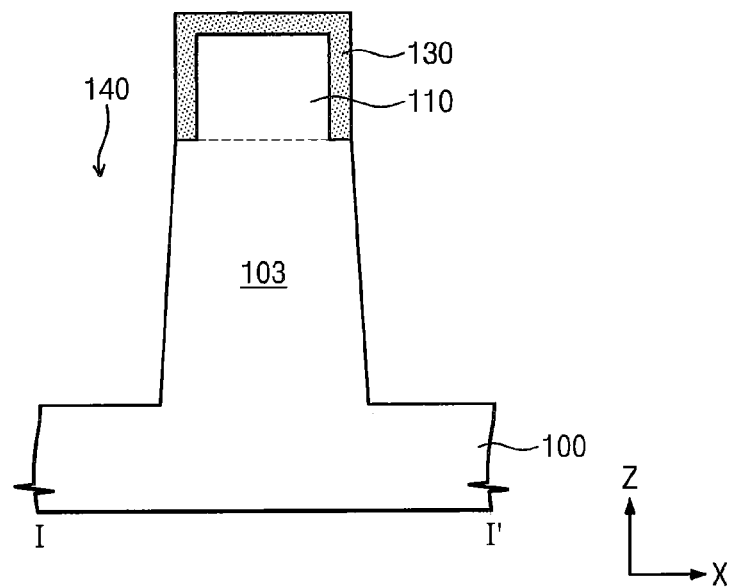
Figure 3C:
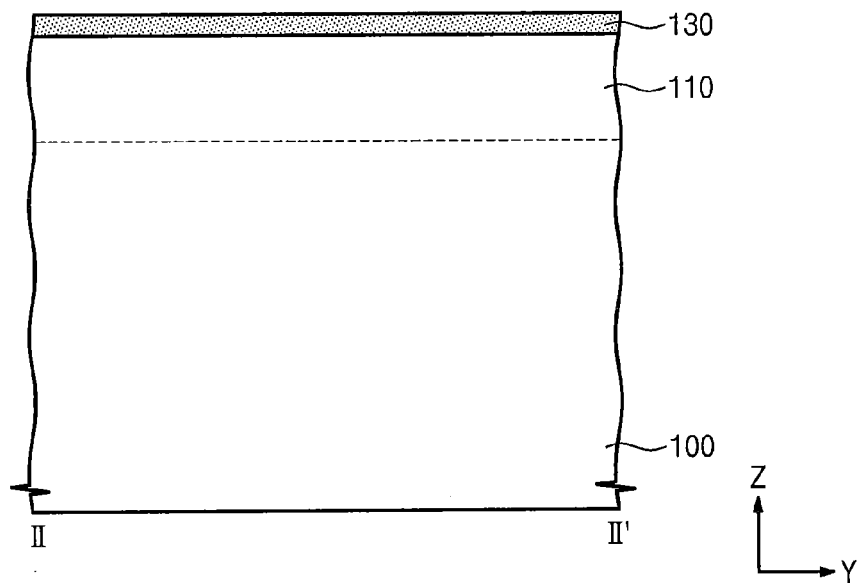

Referring to FIGS. 3A, 3B, and 3C, the substrate 100 may be etched using the capping pattern 130 as an etch mask, thereby forming trenches 140 defining an active pattern 103 in the substrate 100. The etching process may be performed using an etch recipe having an etch selectivity with respect to the capping pattern 130. In some embodiments, a width of each of the trenches 140 may become progressively less toward a bottom surface of each of the trenches 140.

Referring to FIGS. 1, 4A, 4B, and 4C, device isolation patterns 105 may be formed in the trenches 140 and then upper portions of the device isolation patterns 105 may be etched to expose sidewalls of an upper portion of the active pattern 103. Hereinafter, the upper portion of the active pattern 103, which has the sidewalls exposed by the device isolation patterns 105, is defined as a second portion 120 of the active fin. Thus, the active fin AF consisting of the first portion 110 and the second portion 120 may be formed on the substrate 100 (which may correspond to Block S10 of FIG. 1). The active fin AF and the active pattern 103 may constitute one body. In more detail, a device isolation layer (not shown) in, and in some embodiments filling, the trenches 140 may be formed on the resultant structure including the trenches 140. The device isolation layer may be planarized to expose a top surface of the capping pattern 130. Subsequently, the device isolation layer may be etched to expose sidewalls of the capping pattern 130. Thus, the device isolation patterns 105 may be formed in the trenches 140, respectively. Upper portions of the device isolation patterns 105 may be etched to expose both sidewalls of the upper portion of the active pattern 103, thereby forming the second portion 120 of the active fin. The first portion 110 of the active fin AF may have a first width W1, and the second portion 120 of the active fin AF may have a second width W2. The second width W2 may be greater than the first width W1.

Figure 4A:
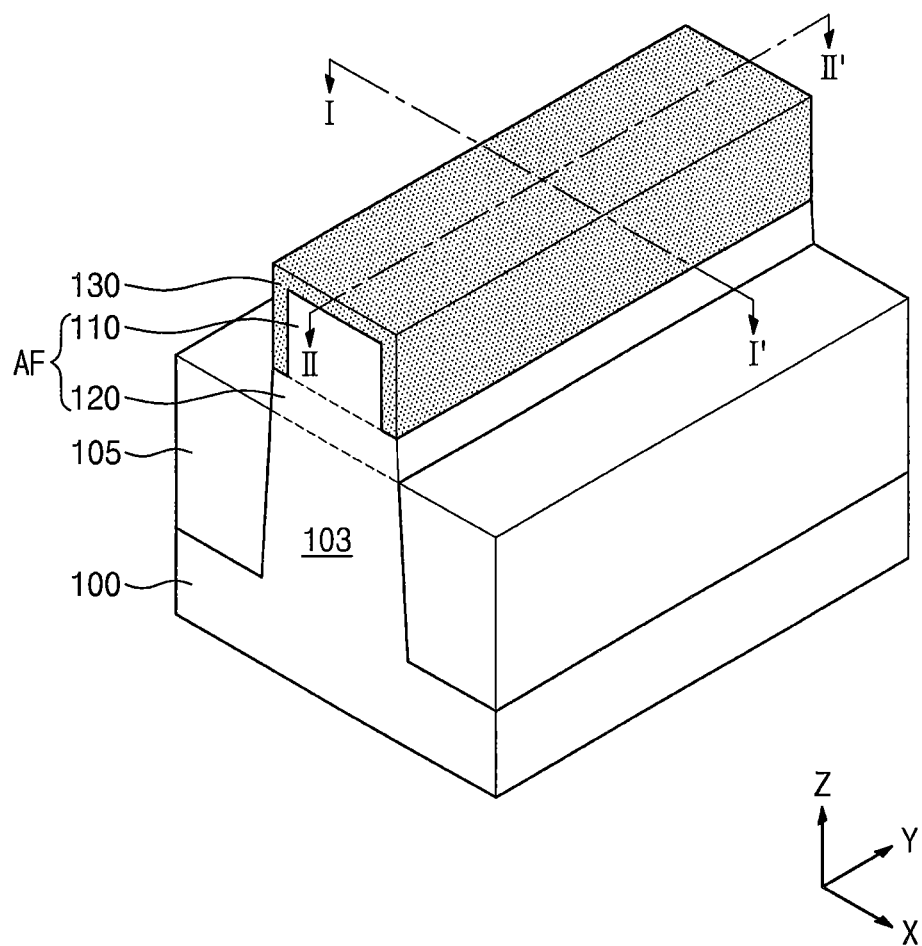
Figure 4B:
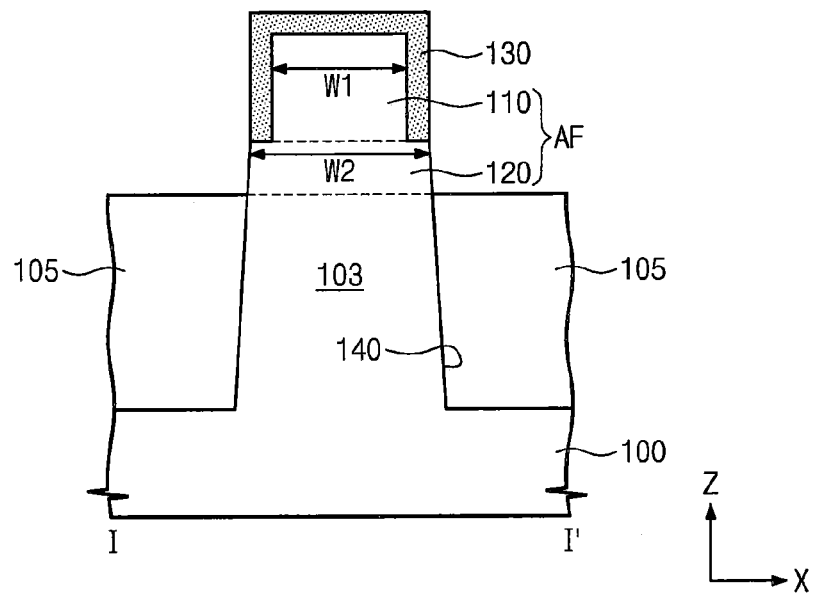
Figure 4C:
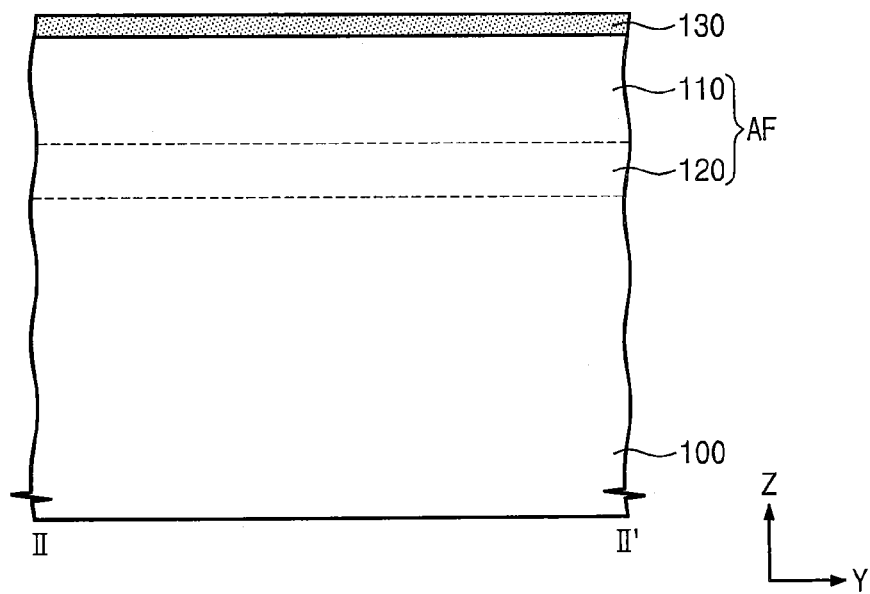
Figure 5A:
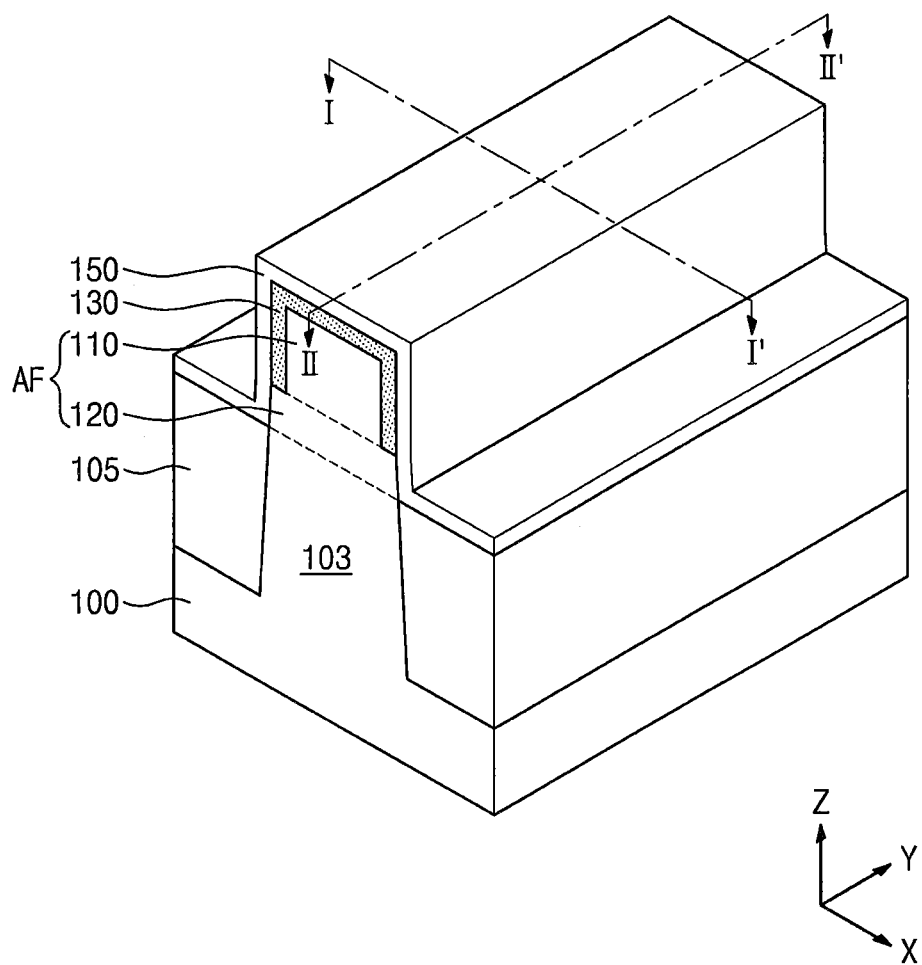
Figure 5B:
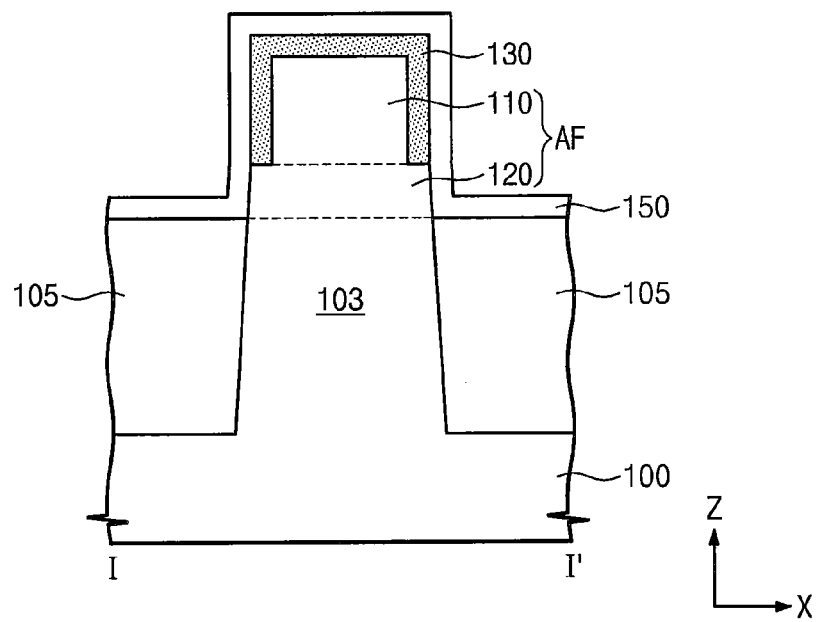
Figure 5C:
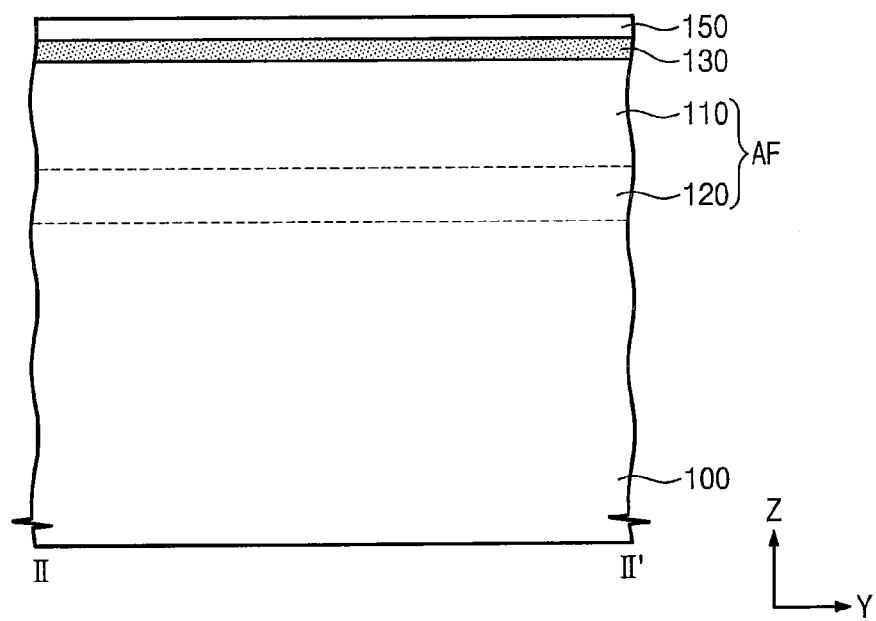
Figure 6A:
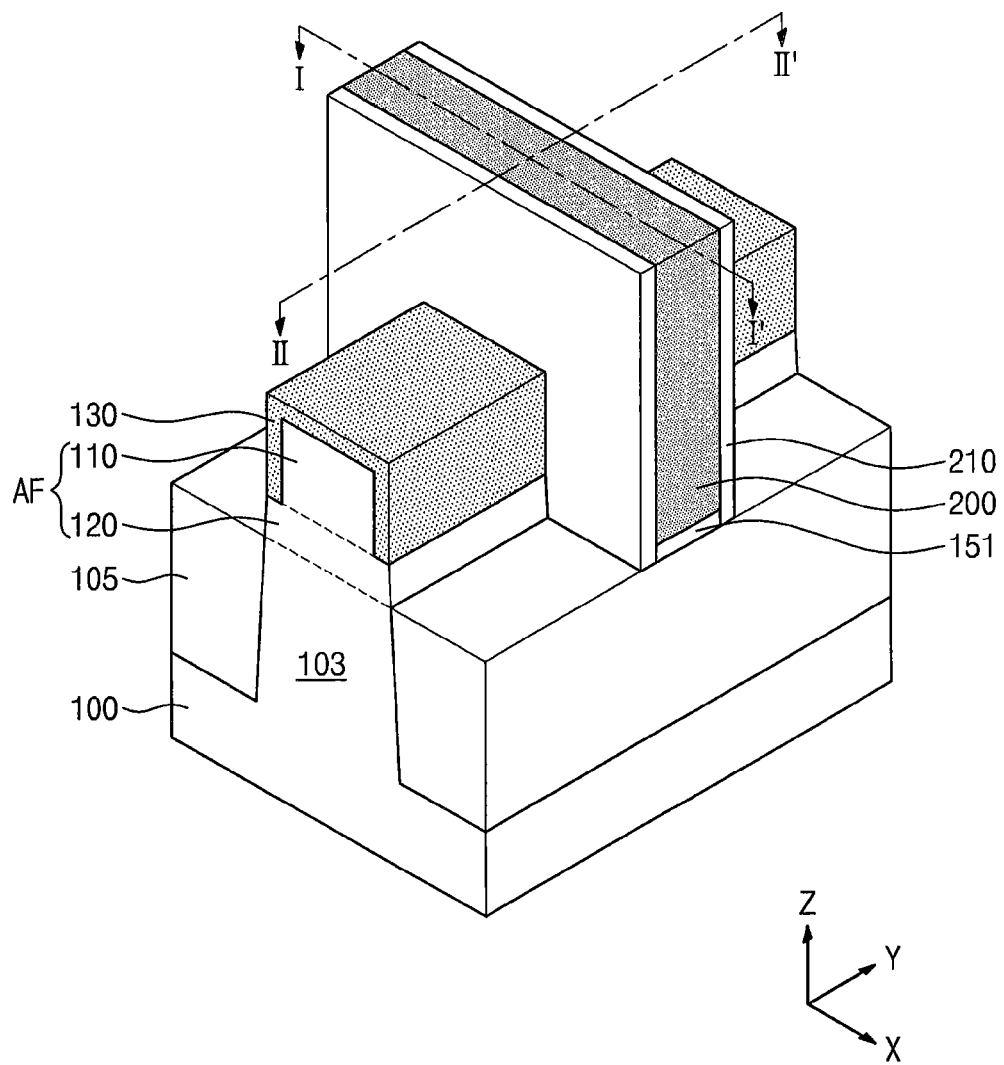
Figure 6B:
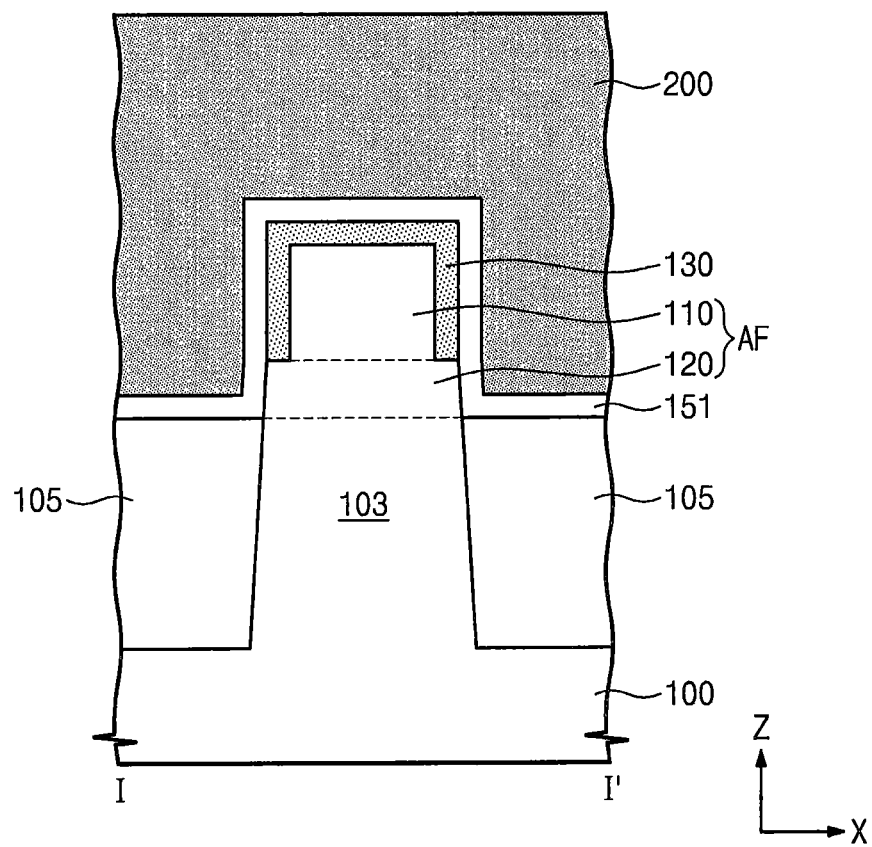
Figure 6C:
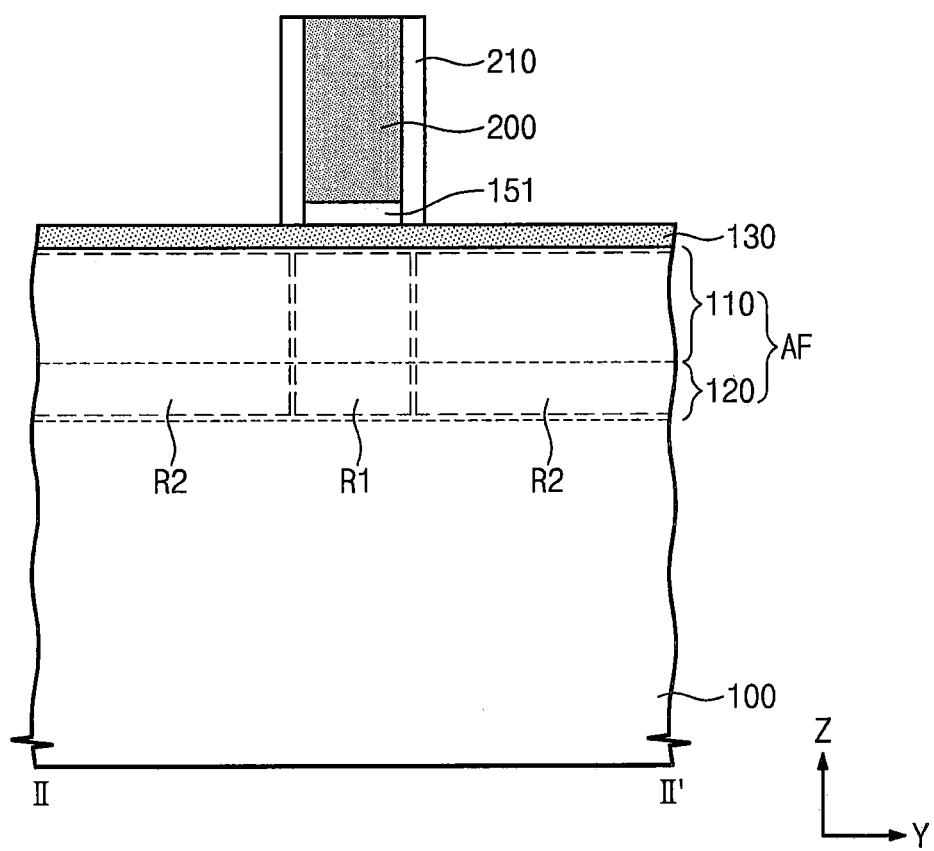

Referring to FIGS. 5A, 5B, and 5C, an etch stop layer 150 may be formed on the resultant structure of FIGS. 4A to 4C. The etch stop layer 150 may cover the top surface and the sidewalls of the capping pattern 130, the sidewalls of the second portion 120 of the active fin AF, and top surfaces of the device isolation patterns 105. In some embodiments, the etch stop layer 150 may include silicon oxide. In other embodiments, the formation of the etch stop layer 150 may be omitted.

Referring to FIGS. 1, 6A, 6B, and 6C, a sacrificial gate pattern 200 may be formed to cross over the active fin AF on the substrate 100 (which may correspond to Block S20 of FIG. 1). First, a sacrificial gate layer (not shown) may be formed on the etch stop layer 150. The sacrificial gate layer may be patterned to form the sacrificial gate pattern 200. The sacrificial gate pattern 200 may be formed by performing an etching process having an etch selectivity with respect to the etch stop layer 150. The sacrificial gate pattern 200 is formed to cross over the active fin AF, so that a first region R1 and second regions R2 may be defined in the active fin AF. The first region R1 is a portion of the active fin AF, which is disposed under the sacrificial gate pattern 200 and overlaps with the sacrificial gate pattern 200. The second regions R2 are other portions of the active fin, which are disposed at both sides of the sacrificial gate pattern 200 and are laterally separated from each other by the first region R1. After the formation of the sacrificial gate pattern 200, the etch stop layer 150 at both sides of the sacrificial gate pattern 200 may be removed to form an etch stop pattern 151 under the sacrificial gate pattern 200. The etch stop pattern 151 may extend along a bottom surface of the sacrificial gate pattern 200 to cover the top surface and sidewalls of the capping pattern 130, the sidewalls of the second portion 120 of the active fin AF, and the top surfaces of the device isolation patterns 105.

Thereafter, gate spacers 210 may be formed on both sidewalls of the sacrificial gate pattern 200, respectively. The gate spacers 210 may include, for example, silicon nitride (SiN). A gate spacer layer (not shown) may be formed on the resultant structure including the sacrificial gate pattern 200 and then the gate spacer layer may be etched to expose the top surfaces of the device isolation patterns 105. Additionally, portions of sidewalls of the second regions R2 of the active fin AF may be exposed by etching the gate spacer layer.

Referring to FIGS. 1, 7A, 7B, and 7C, source/drain regions 300 may be formed at both sides of the sacrificial gate pattern 200 (which may correspond to Block S30 of FIG. 1). The source/drain regions 300 may be formed at positions of the second regions R2 of the active fin AF. First, the capping pattern 130 at both sides of the sacrificial gate pattern 200 may be removed to expose the second regions R2 of the active fin AF. The exposed second regions R2 may be removed and then an epitaxial process may be performed on the substrate 100, thereby forming the source/drain regions 300. For example, the source/drain regions 300 may include silicon-germanium (SiGe), silicon (Si) and/or silicon carbide (SiC) that are epitaxially grown from the substrate 100. In some embodiments, if the semiconductor device includes a complementary metal-oxide-semiconductor (CMOS) structure, a first epitaxial layer may be formed for a source/drain of a N-type metal-oxide-semiconductor field effect transistor (NMOSFET) and a second epitaxial layer may be formed for a source/drain of a P-type MOSFET (PMOSFET). The first epitaxial layer may be configured to generate a tensile strain, and the second epitaxial layer may be configured to generate a compressive strain. In some embodiments, the first epitaxial layer may be formed of silicon carbide (SiC) and the second epitaxial layer may be formed of silicon-germanium (SiGe). However, the inventive concepts are not limited thereto. The source/drain regions 300 may be doped with dopants during the epitaxial process and/or after the epitaxial process.

Referring to FIGS. 1, 8A, 8B, and 8C, a lower interlayer insulating layer 350 may be formed on the resultant structure having the source/drain regions 300. The lower interlayer insulating layer 350 may be formed to cover the source/drain regions 300 and the sacrificial gate pattern 200. The lower interlayer insulating layer 350 may include a silicon oxide layer, a silicon nitride layer, a silicon oxynitride layer, and/or low-k dielectric layers. The lower interlayer insulating layer 350 may be etched to expose a top surface of the sacrificial gate pattern 200. Thereafter, the sacrificial gate pattern 200 may be removed to form a gap region 360 exposing the capping pattern 130 and the second portion 120 of the active fin AF between the gate spacers 210 (which may correspond to Block S40 of FIG. 1). Forming the gap region 360 may include performing an etching process having an etch selectivity with respect to the gate spacers 210, the lower interlayer insulating layer 350 and the etch stop pattern 151 to etch the sacrificial gate pattern 200. Additionally, forming the gate region 360 may further include removing the etch stop pattern 151 to expose the capping pattern 130 and the second portion 120 of the active fin AF. As described with reference to FIGS. 4A to 4C, the first portion 110 of the active fin AF capped by the capping pattern 130 may have the first width W1, and the second portion 120 of the active fin AF may have the second width W2. The second width W2 may be greater than the first width W1.

Figure 9A:
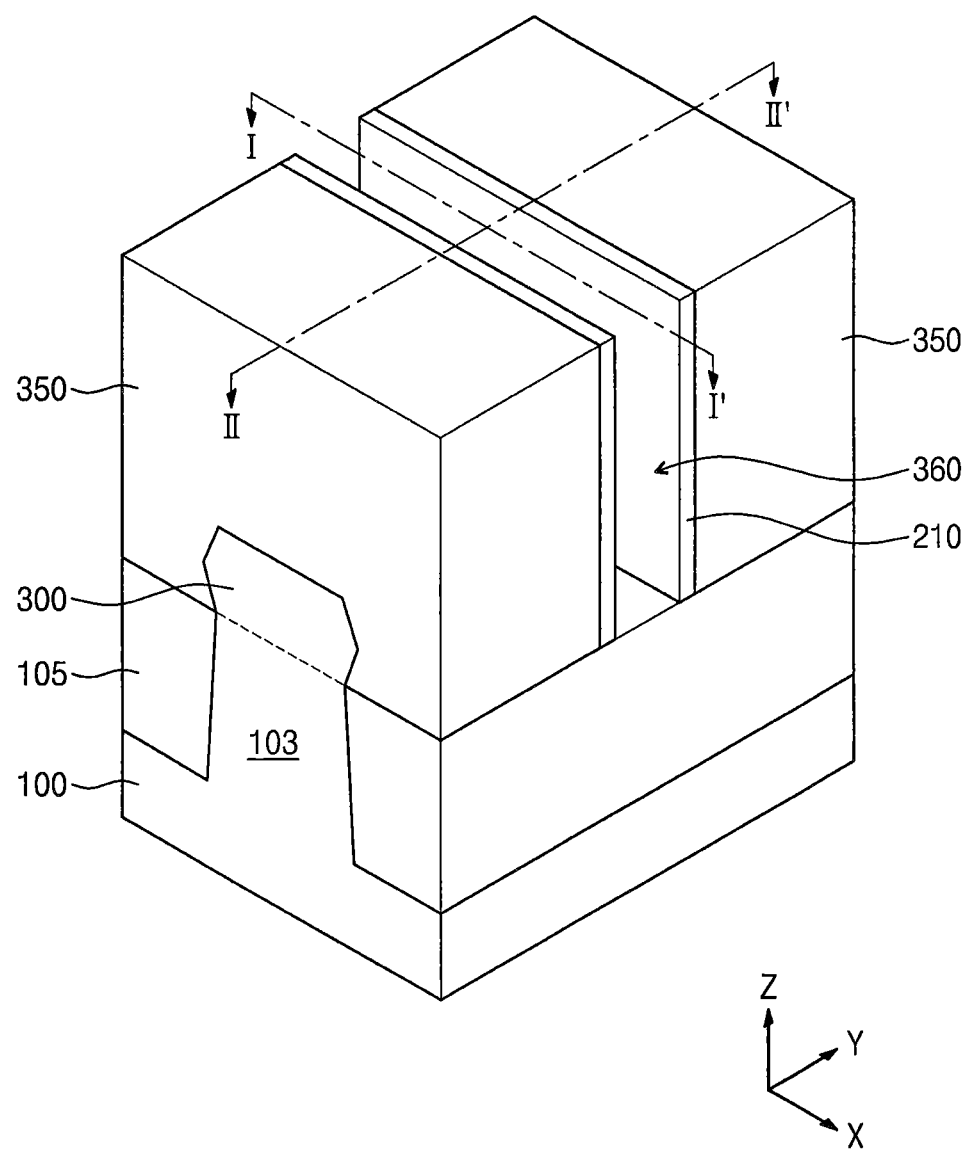
Figure 9B:
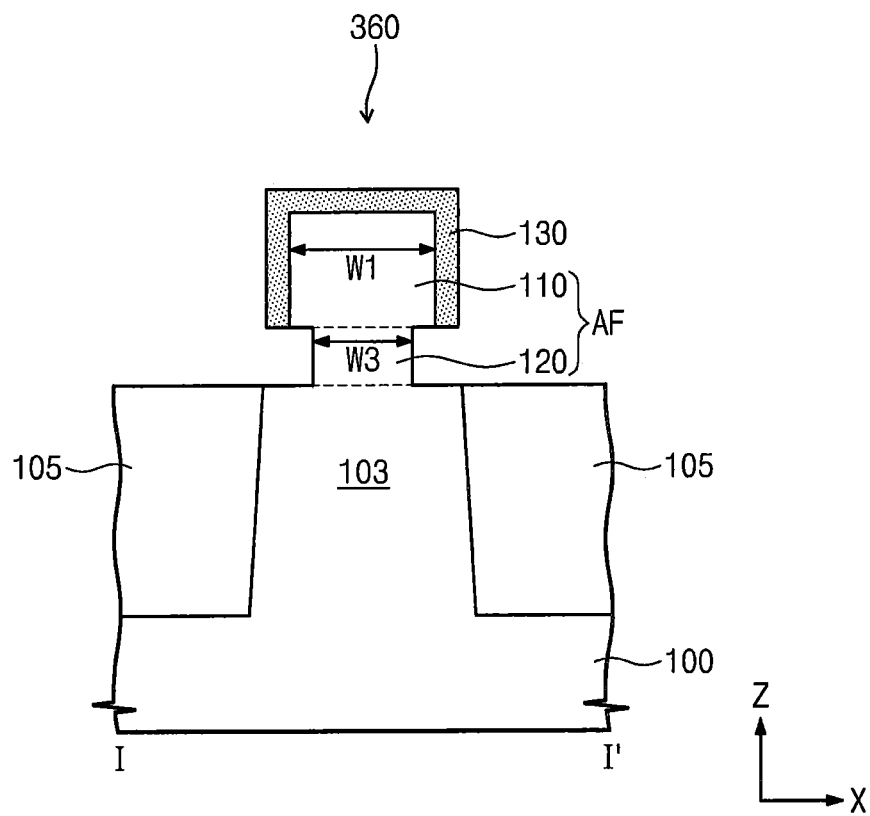
Figure 9C:
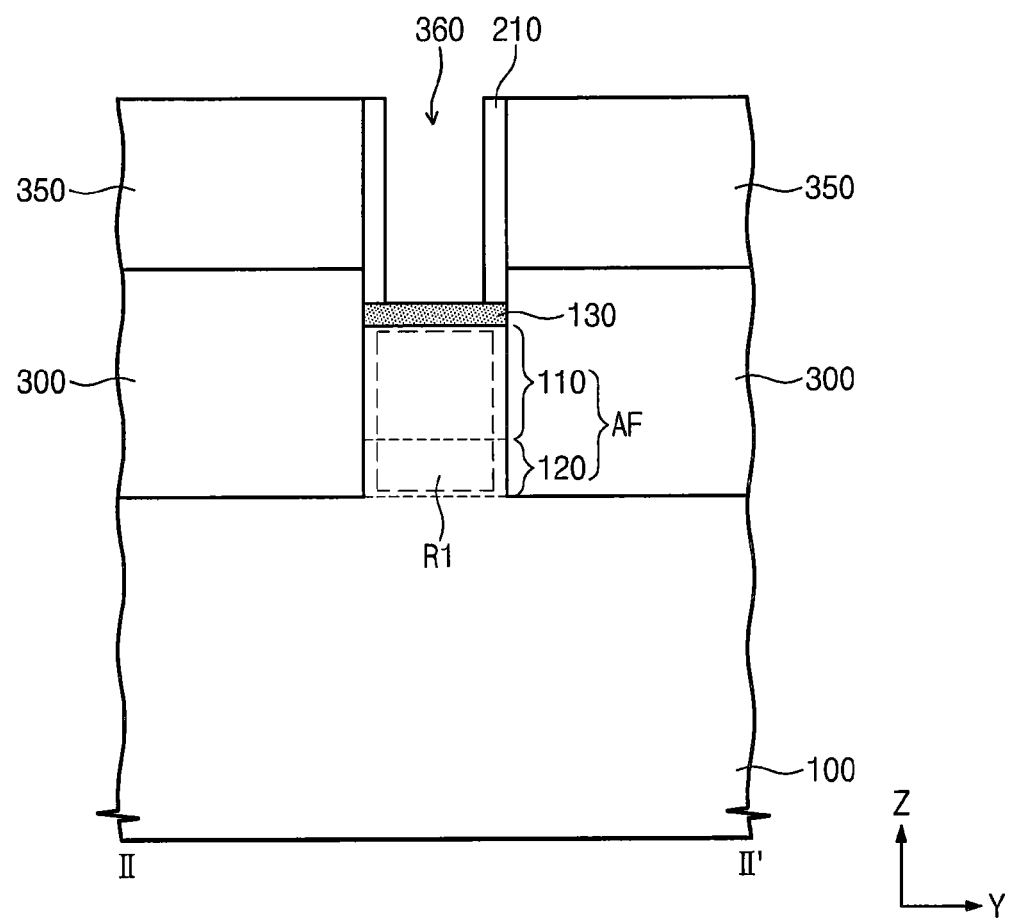

Referring to FIGS. 9A, 9B, and 9C, both sidewalls of the second portion 120 of the active fin AF, which are exposed by the gap region 360, may be etched to reduce the width of the second portion 120 of the active fin AF. Thus, a second portion 120 of the active fin AF may be formed to have a third width W3. The third width W3 may be less than the second width W2. In some embodiments, the third width W3 may be less than the first with W1 of the first portion 110 of the active fin AF. The etching process of the second portion 120 of the active fin AF may be performed using an etch recipe having an etch selectivity with respect to the capping pattern 130. In the event that the both sidewalls of the second portion 120 of the active fin AF are etched, the second portion 120 of the active fin AF may be easily oxidized during a subsequent oxidation process. However, the inventive concepts are not limited thereto. In other embodiments, the etching process of the second portion 120 of the active fin AF may be omitted.

Referring to FIGS. 1, 10A, 10B, and 10C, the second portion 120 of the active fin AF may be oxidized to form an insulation pattern 125 (which may correspond to Block S50 of FIG. 1). In more detail, an oxidation process may be performed on the resultant structure including the gap region 360. Oxygen atoms provided by the oxidation process may be provided into the second portion 120 of the active fin AF exposed by the gap region 360. The second portion 120 of the active fin AF and a portion of the substrate 100 under the second portion 120 may be oxidized to form the insulation pattern 125 during the oxidation process. The first portion 110 of the active fin AF capped by the capping pattern 130 may not be oxidized during the oxidation process. For example, the insulation pattern 125 may include silicon oxide. The insulation pattern 125 may be connected to the device isolation patterns 105 that are adjacent to each other with the insulation pattern 125 therebetween. The insulation pattern 125 may be disposed between the source/drain regions 300 and may be disposed under the first portion 110 of the active fin AF. The first portion 110 of the active fin AF may be separated from the substrate 100 by the insulation pattern 125. A bottom surface L1 of the insulation pattern 125 may be lower than the top surfaces U1 of the device isolation patterns 105.

Figure 10A:
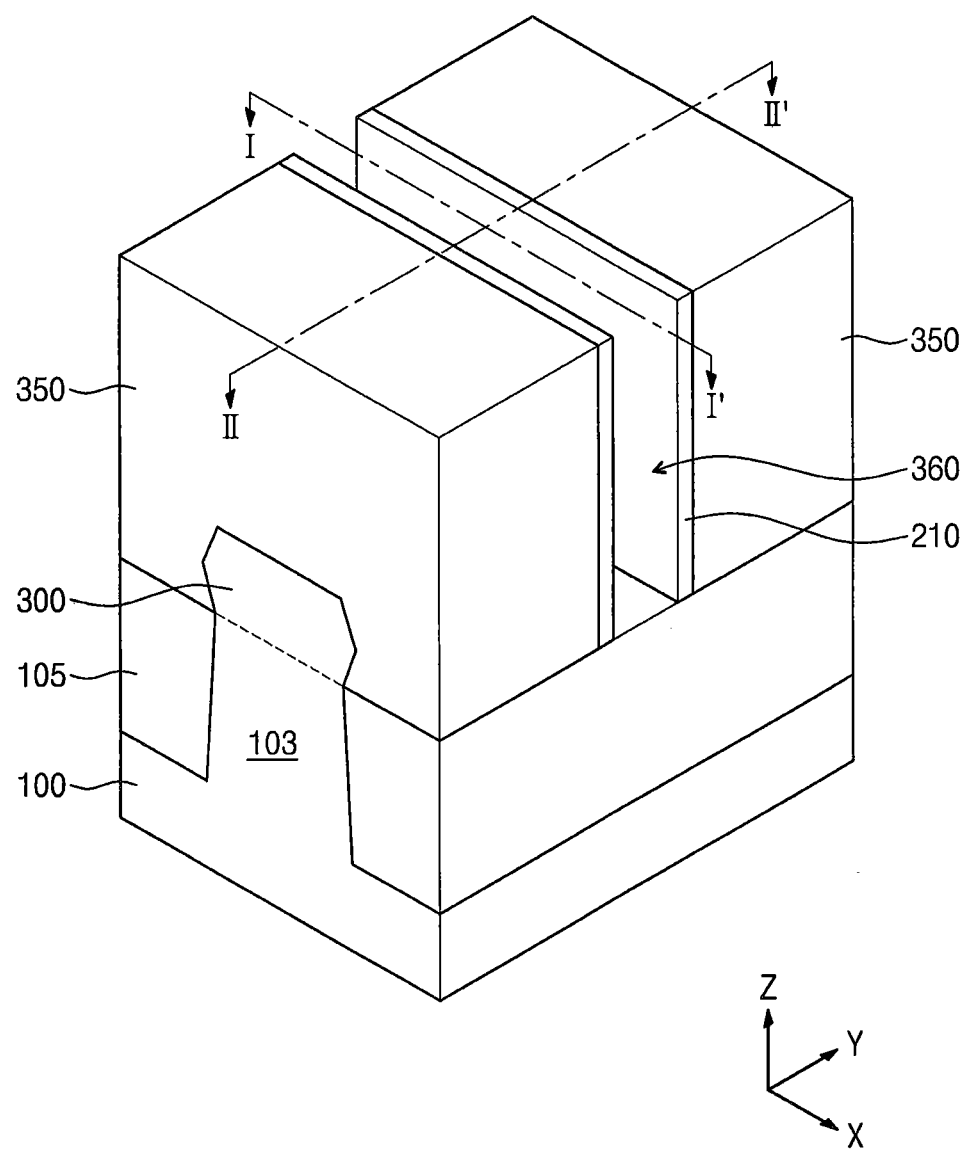
Figure 10B:
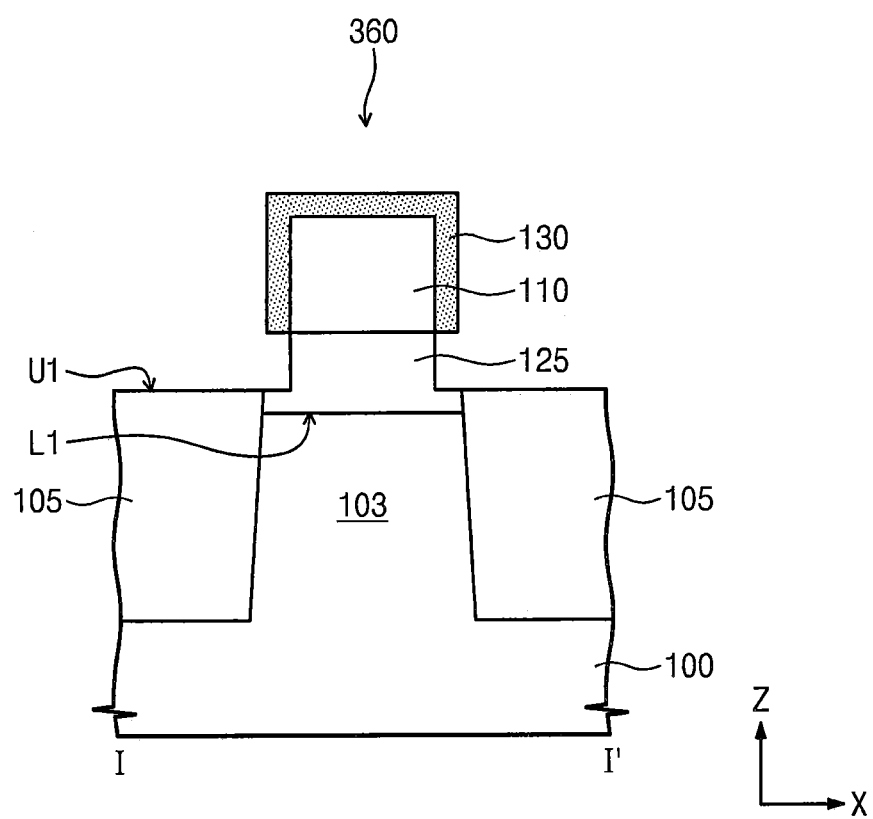
Figure 10C:
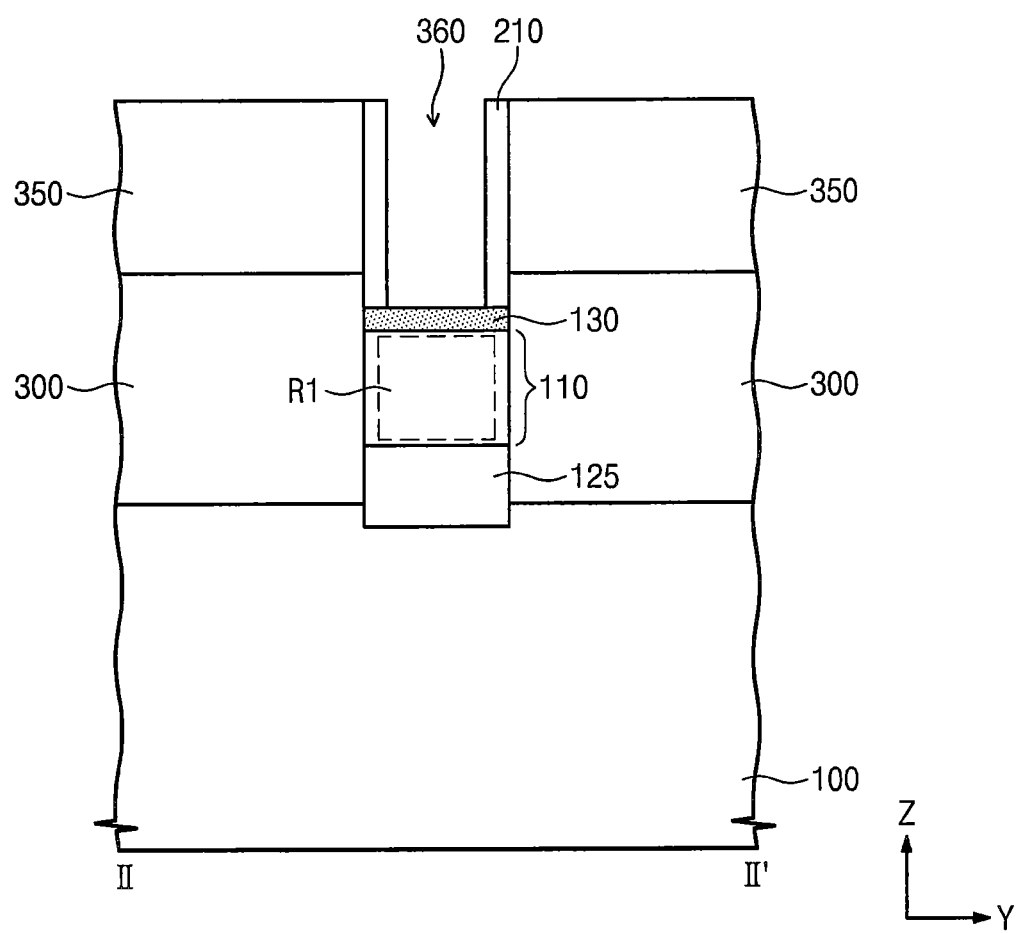

Accordingly, FIGS. 1-10C illustrate a method of manufacturing a semiconductor device according to various embodiments, wherein a fin 103 is formed to protrude away from a substrate 100 (FIGS. 3A-3C); a device isolation region 105 is formed on sidewalls of the fin (FIGS. 4A-4C) and an insulation pattern 125 is formed in the fin such that the device isolation region 105 directly contacts the insulation pattern 125 (FIGS. 10A-10C).

Moreover, FIGS. 1-10C also illustrate various embodiments wherein forming a device isolation region 105 on sidewalls of the fin 103 and an insulation pattern 125 in the fin 103 such that the device isolation region 105 directly contacts the insulation pattern 125 comprises forming the device isolation region 105 on a first portion of the sidewalls of the fin 103 that are adjacent the substrate 100, so as to expose a second portion AF of the sidewalls that are remote from the substrate 105 and oxidizing the fin 103 at an interface between the first and second portions AF and 103, respectively, to form the insulation pattern 125 that directly contacts the device isolation region 105.

Referring to FIGS. 1, 11A, 11B, and 11C, a gate dielectric pattern 410 and a gate electrode 400 may be formed to fill the gap region 360 (which may correspond to Block S60 of FIG. 1). First, the capping pattern 130 may be removed to expose the first portion 110 of the active fin AF. The capping pattern 130 may be removed by performing a wet and/or dry etching process. Thereafter, a gate dielectric layer (not shown) may be formed on the resultant structure including the gap region 360. The gate dielectric layer may partially fill the gap region 360. The gate dielectric layer may be formed to cover the first portion 110 of the active fin AF and a portion of the insulation pattern 125. The gate dielectric layer may include at least one high-k dielectric layer. For example, the gate dielectric layer may include at least one of a hafnium oxide layer, a hafnium silicate layer, a zirconium oxide layer, and/or a zirconium silicate layer. However, the gate dielectric layer is not limited to the material layers described above. For example, the gate dielectric layer may be formed by performing an atomic layer deposition (ALD) process. A gate layer (not shown) may be formed on the gate dielectric layer in, and in some embodiments to fill, the remaining portion of the gap region 360. The gate layer may include at least one of a conductive metal nitride layer (e.g., a titanium nitride layer and/or a tantalum nitride layer) and/or a metal layer (e.g., an aluminum layer and/or a tungsten layer). The gate dielectric layer and the gate layer sequentially stacked may be planarized to form the gate dielectric pattern 410 and the gate electrode 400. Top surfaces of the lower interlayer insulating layer 350 and the gate spacers 210 may be exposed by the planarization process. The gate dielectric pattern 410 may extend along a bottom surface of the gate electrode 400 and may further extend to be disposed on both sidewalls of the gate electrode 400. The portion of the gate dielectric pattern 410 on each sidewall of the gate electrode 400 may be disposed between the gate electrode 400 and each gate spacer 310. In some embodiments, if the semiconductor device includes the CMOS structure, forming the gate electrode 400 may include forming a gate electrode of an NMOSFET and forming a gate electrode of a PMOSFET. The gate electrode of the PMOSFET may be formed independently of the gate electrode of the NMOSFET. However, embodiments of the inventive concepts are not limited to the independent formation of the gate electrodes of the NMOSFET and the PMOSFET.

The first region R1 of the first portion 110 of the active fin AF, which is disposed under the gate electrode 400, may be a channel region. The channel region may be disposed between the source/drain regions 300 and may be separated from the substrate 100 by the insulation pattern 125.

Even though not shown in the drawings, an upper interlayer insulating layer may be formed on the resultant structure including the gate electrode 400. Contact holes may be formed to penetrate the upper interlayer insulating layer and the lower interlayer insulating layer 350. The contact holes may expose the source/drain regions 300. Contact plugs may be formed to fill the contact holes, respectively. Interconnections connected to the contact plugs may be formed on the upper interlayer insulating layer. As a result, the interconnections may be disposed on the upper interlayer insulating layer and may be electrically connected to the source/drain regions 300 through the contact plugs.

Figure 7A:
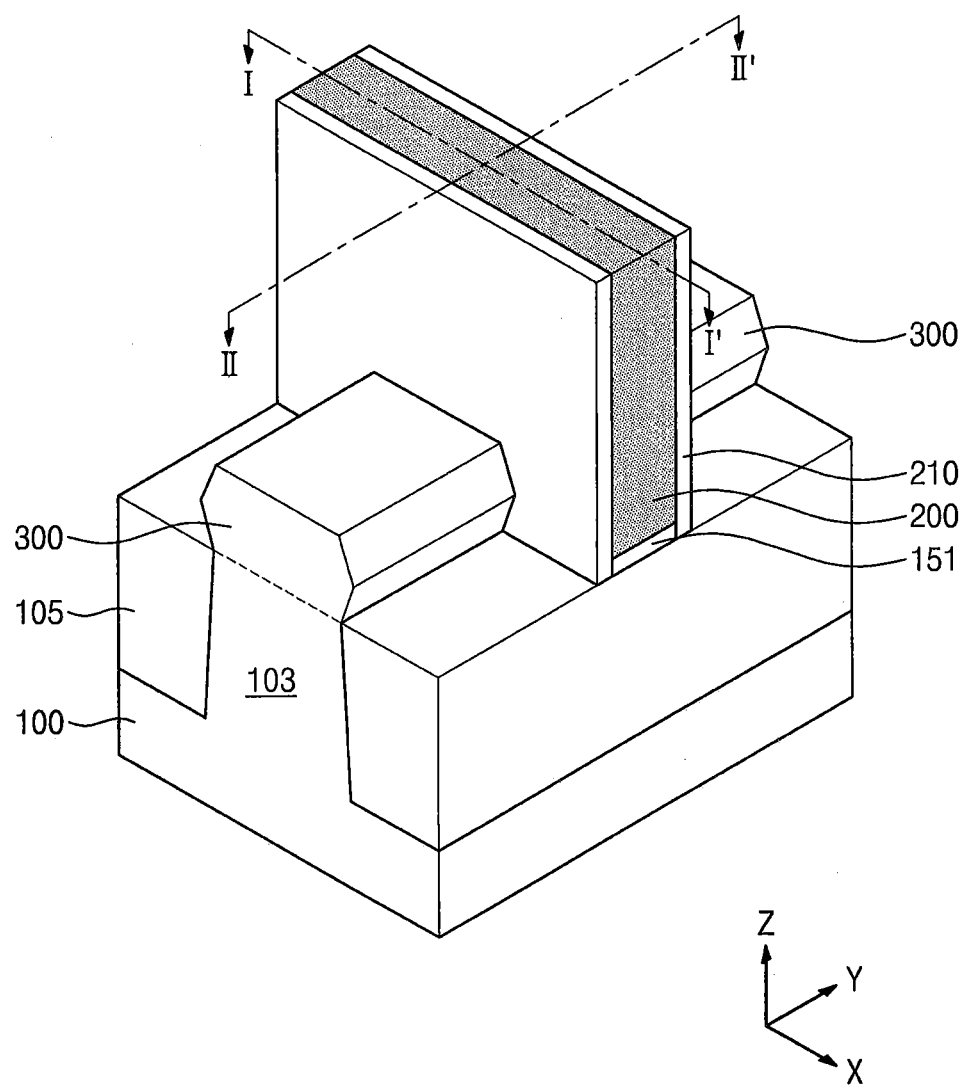
Figure 7B:
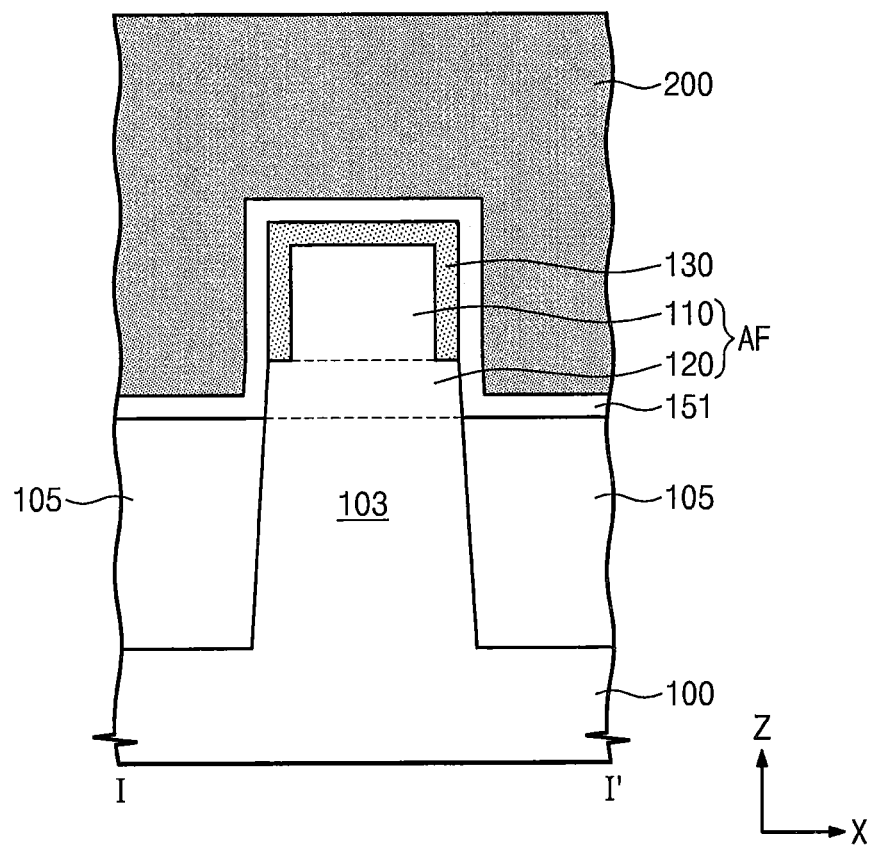
Figure 7C:
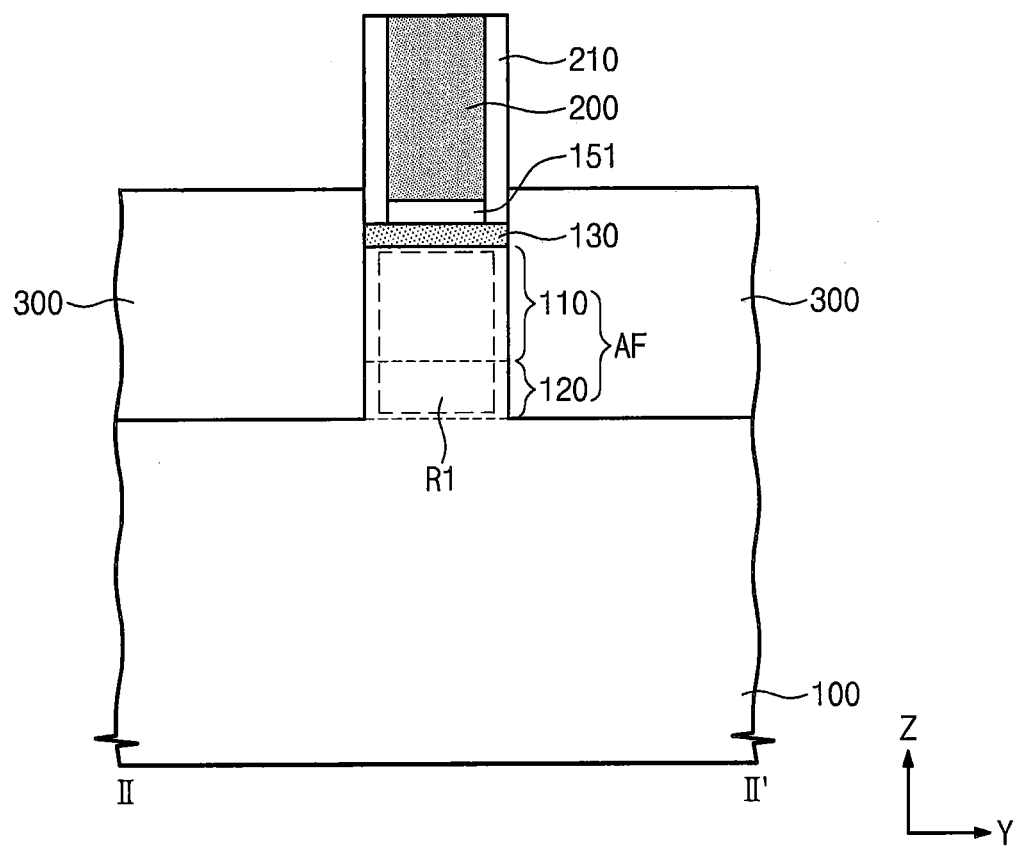
Figure 8A:
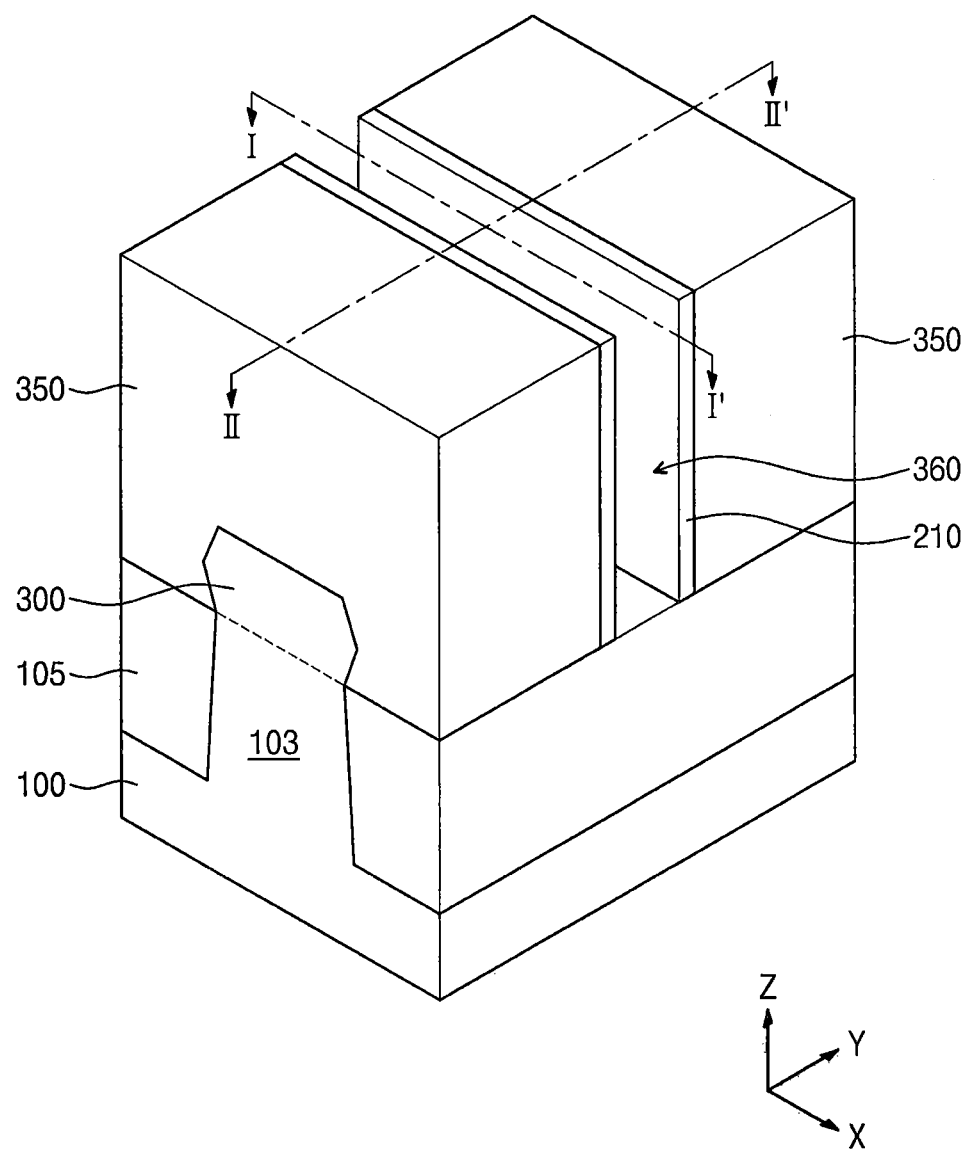
Figure 8B:
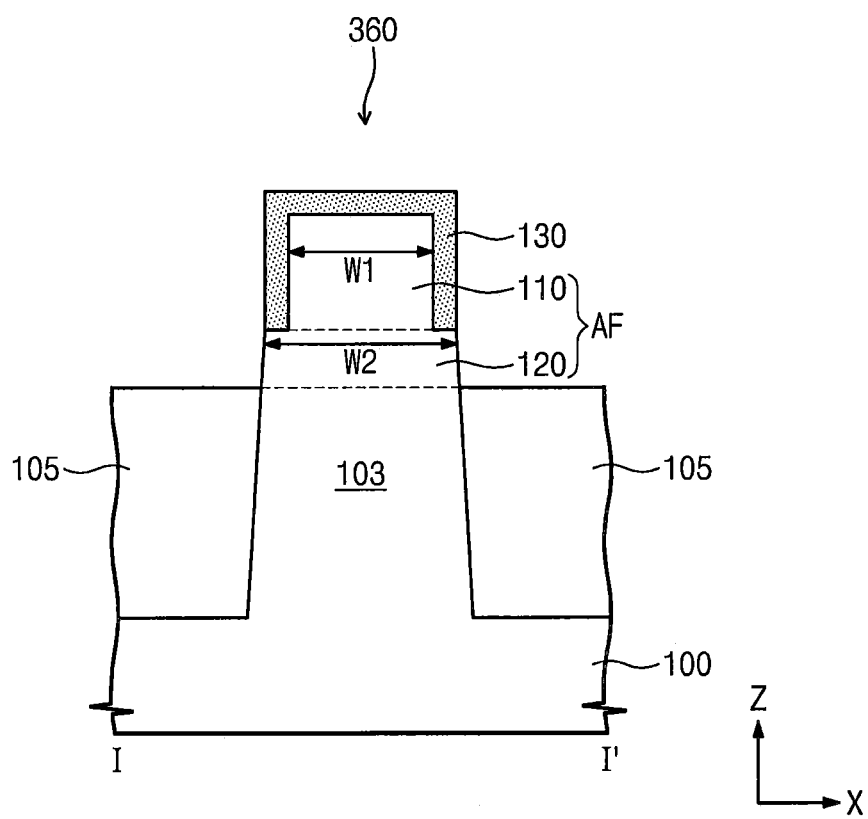
Figure 8C:
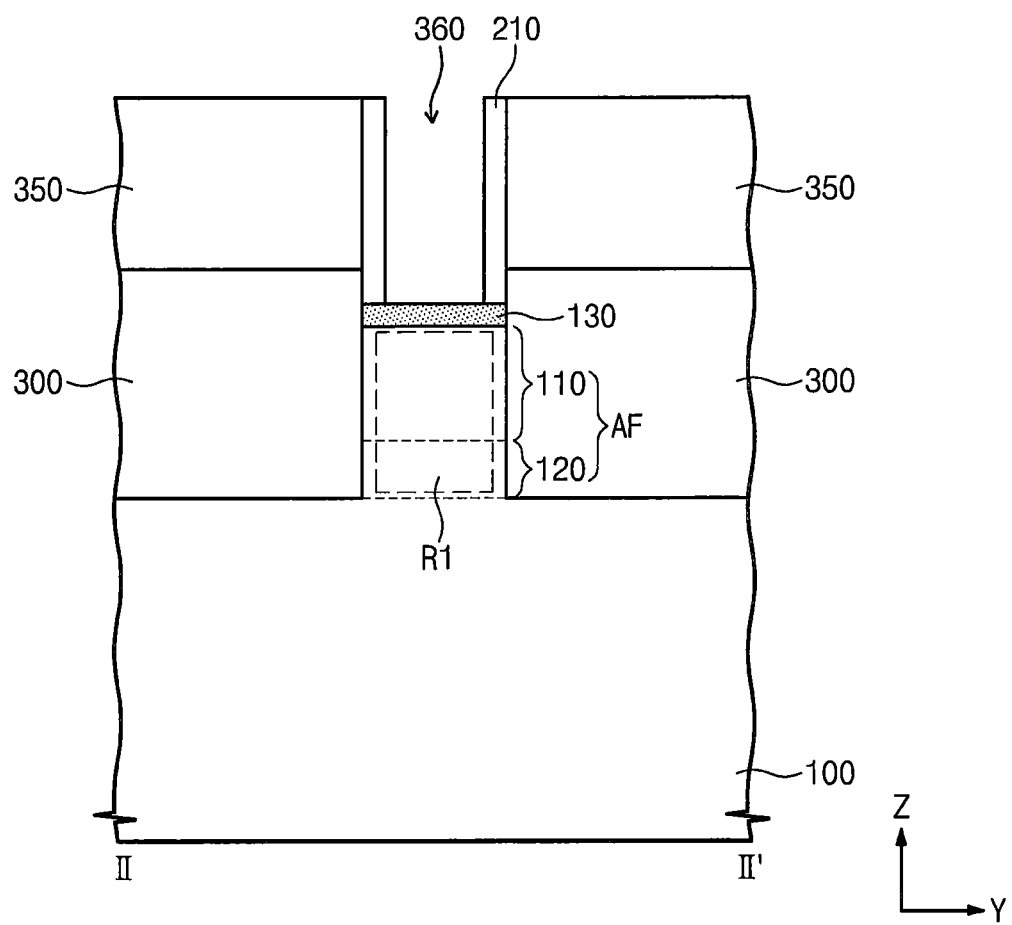
Figure 11A:
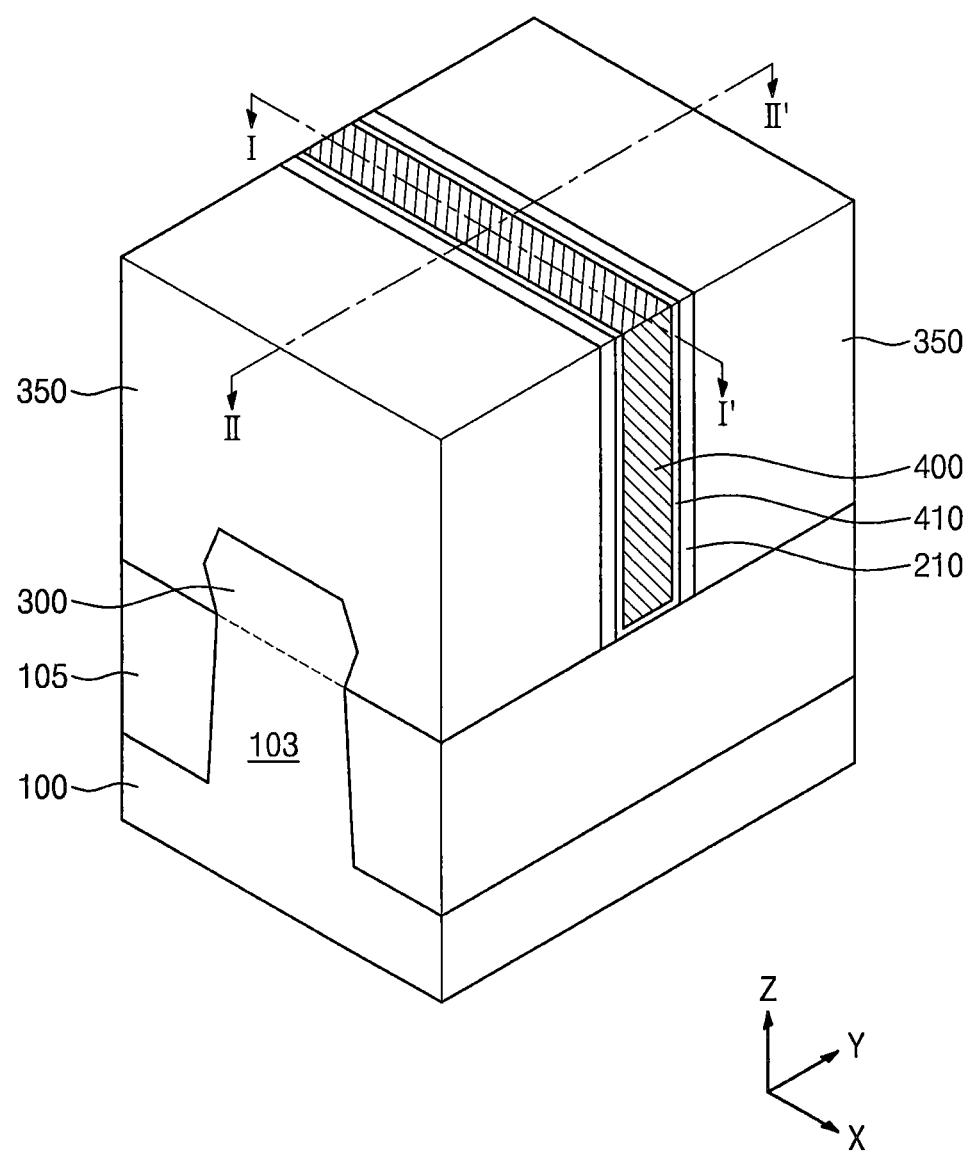
Figure 11B:
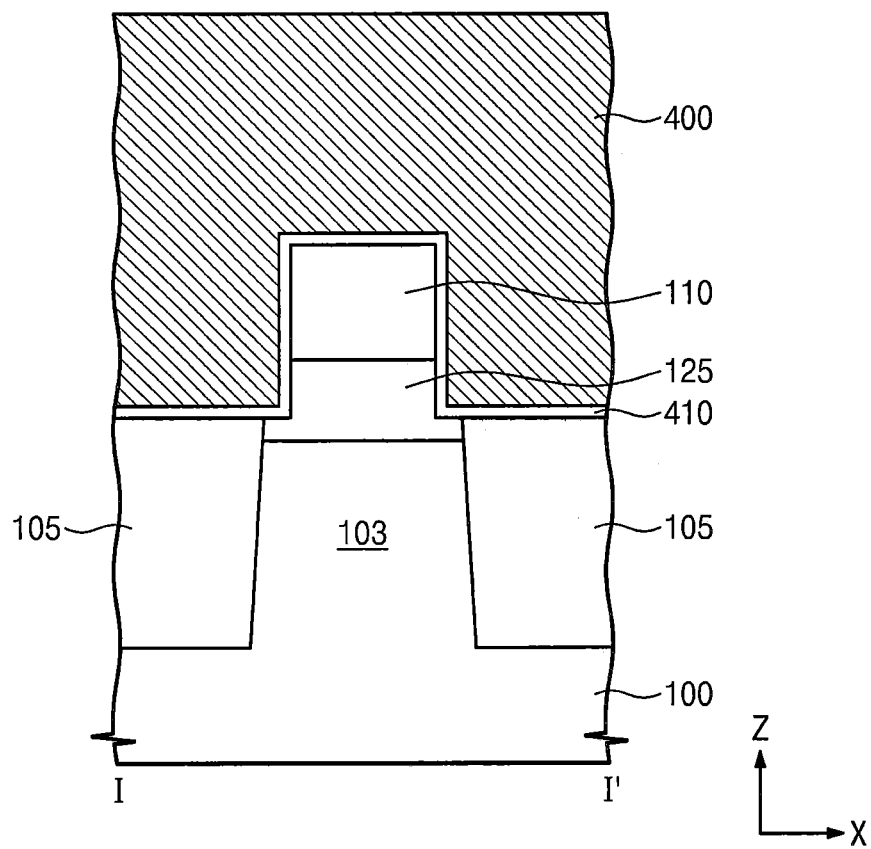
Figure 11C:
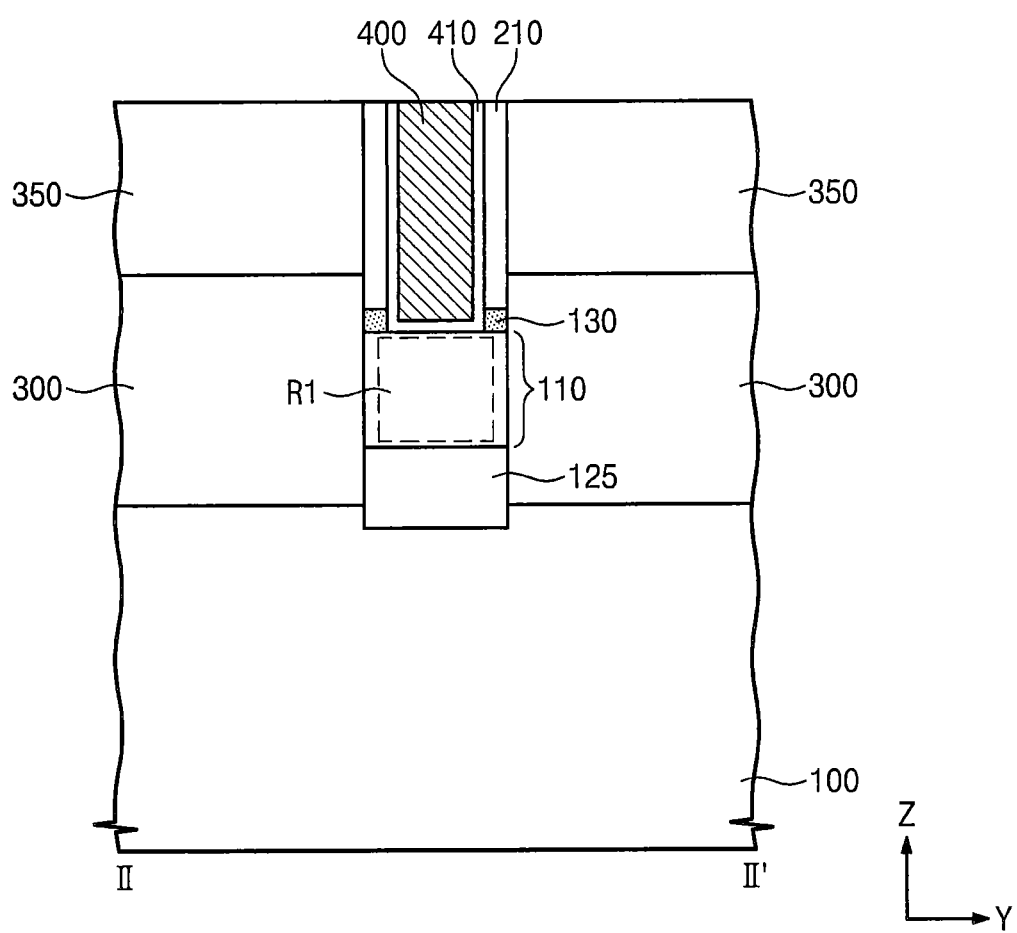

Accordingly, FIGS. 11A-11C also illustrate forming a gate pattern 400 crossing over the fin, and FIGS. 7A-7C illustrate epitaxially growing a source region 300 and a drain region 300 from the fin 103, such that the source region 300 and the drain region 300 are on opposite side of the gate pattern 400. Also, FIGS. 7A-7C illustrate various embodiments wherein epitaxially growing source and drain regions 300 from the fin 103 such that the source region and the drain region 300 are on opposite sides of the gate pattern comprises exposing two spaced-apart top portions of the fin 103 that are remote from the substrate, epitaxially growing the source region and the drain region 300 from the fin at the respective two spaced-apart top portions of the fin, and forming the gate pattern between the source and drain regions.

Moreover, FIGS. 2C-7C illustrate embodiments wherein exposing two spaced-apart top portions of the fin that are remote from the substrate is preceded by forming a sacrificial gate pattern 200 across the fin 103 to define the two spaced-apart patterns of the fin 103 and FIGS. 10A-10C illustrate embodiments wherein forming the gate pattern 400 between the source and drain regions is preceded by removing the sacrificial gate pattern 200.

Structural features of the semiconductor device according to some embodiments will be described with reference to FIGS. 11A to 11C.

Device isolation patterns 105 may be disposed in a substrate 100 to define an active pattern 103. The device isolation patterns 105 may extend in a first direction (e.g., a Y-direction). A first portion 110 of an active fin may be disposed on the substrate 100. A second direction (e.g., an X-direction) may be perpendicular to the first direction. The first portion 110 of the active fin may protrude from the substrate 100 in a third direction (e.g., a Z-direction) perpendicular to the first and second directions. The first portion 110 of the active fin may be disposed on the active pattern 103. A gate electrode 400 may be disposed on the substrate 100 and may cross over the first portion 110 of the active fin. The first portion 110 of the active fin may be a channel region disposed under the gate electrode 400. The gate electrode 400 may be formed to face a top surface and both sidewalls of the first portion 100 of the active fin. The first portion 110 of the active fin may be separated from the active pattern 103 by an insulation pattern 125 disposed under the first portion 110. The insulation pattern 125 may be formed by oxidizing a second portion of the active fin and a portion of the substrate 100. The insulation pattern 125 may be connected to the device isolation patterns 105 that are adjacent to each other with the insulation pattern 125 therebetween. Source/drain regions 300 epitaxially grown from the substrate 100 may be disposed at both sides of the gate electrode 400. The source/drain regions 300 may be directly connected to the substrate 100. The first portion 110 of the active fin may have a top surface having a level higher than a level of bottom surfaces of the source/drain regions 300 at a vertical position. The first portion 110 of the active fin may be disposed between the source/drain regions 300 at a horizontal position. The insulation pattern 125 may be disposed between the source/drain regions 300. Thus, the insulation pattern 125 may be locally disposed under the first portion 110 of the active fin. A height of a top surface of the insulation pattern 125 may be higher than a height of a bottommost surface of the gate electrode 400.

A lower interlayer insulating layer 350 may be disposed to cover the source/drain regions 300 and both sidewalls of the gate electrode 400 on the substrate 100. A gate spacer 210 may be disposed between the lower interlayer insulating layer 350 and each sidewall of the gate electrode 400. A gate dielectric pattern 410 may be disposed between each sidewall of the gate electrode 400 and the gate spacer 210. The gate dielectric pattern 410 may also be disposed between the gate electrode 400 and the first portion 110 of the active fin.

The gate dielectric pattern 410 may include at least one high-k dielectric layer. For example, the gate dielectric pattern 410 may include a hafnium oxide layer, a hafnium silicate layer, a zirconium oxide layer, and/or a zirconium silicate layer. The gate dielectric pattern 410 may laterally extend from the top surface of the first portion 110 of the active fin to at least partially cover a top surface of the device isolation pattern 105. However, in some embodiments, the top surface of the device isolation pattern 105 may have portions that are not covered by the gate dielectric pattern 410. In some embodiments, the top surface of the device isolation pattern 105, which is not covered by the gate electrode 400, may be covered by the lower interlayer insulating layer 350. The gate dielectric pattern 410 may extend along a bottom surface of the gate electrode 400.

According to the inventive concepts, the insulation pattern may be selectively formed only under the channel region. Thus, the channel region may be separated from the substrate by the insulation pattern. In other words, the field effect transistor according to the inventive concepts may be formed to have a fin-on-insulator structure, so that a short channel effect may be reduced or improved. Additionally, the source/drain regions are directly connected to the substrate, so that a leakage current and a self-heating characteristic of the field effect transistor may be reduced or improved.

Figure 12:
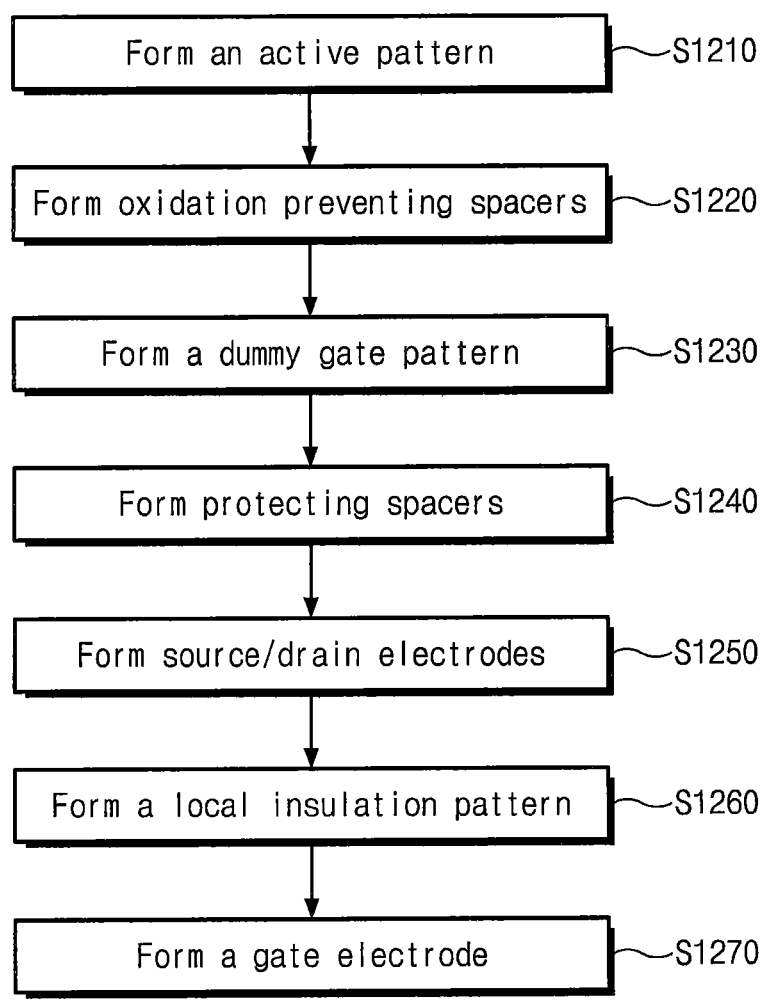
FIG. 12 is a flowchart illustrating a method of manufacturing a semiconductor device according to other embodiments of the inventive concepts.

FIG. 12 is a flowchart illustrating a method of manufacturing a semiconductor device according to other embodiments of the inventive concepts. FIGS. 13A to 26A are perspective views illustrating a method of manufacturing a semiconductor device according to other embodiments of the inventive concepts. FIGS. 13B to 26B are cross-sectional views taken along lines I-I', II-II', and III-III' to illustrate a method of manufacturing a semiconductor device according to other embodiments of the inventive concepts.

Figure 13A:
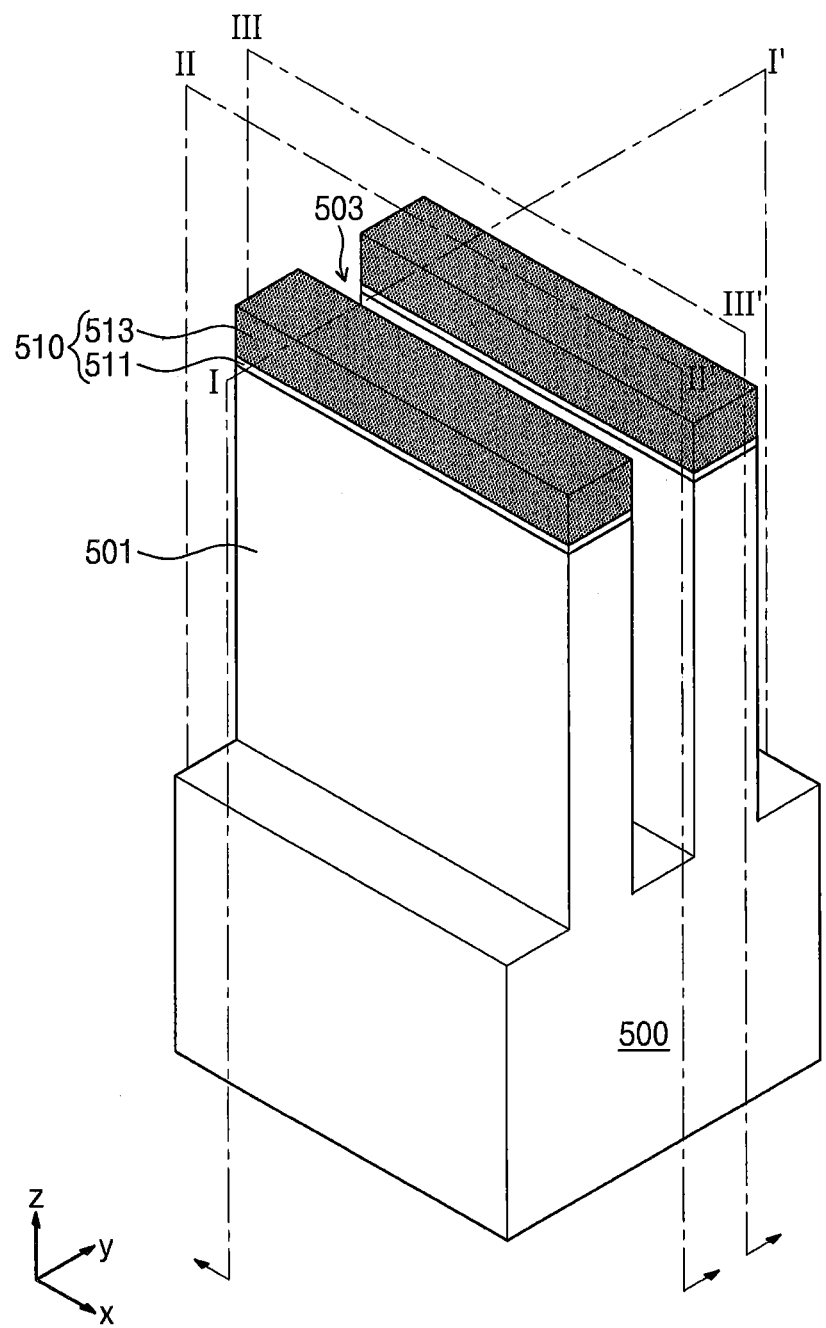
Figure 13B:
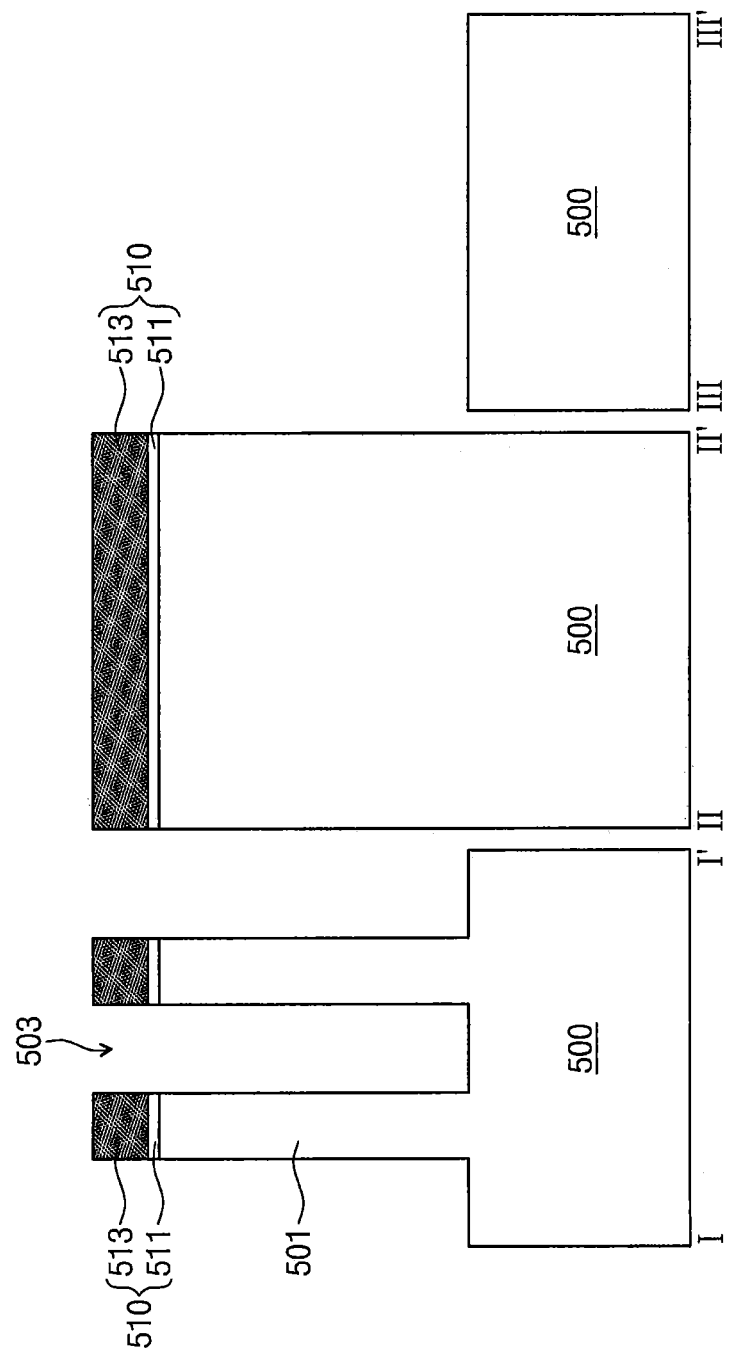

Referring to FIGS. 12, 13A, and 13C, a semiconductor substrate 500 may be patterned to form trenches 503 defining active pattern 501 (which may correspond to Block S1210 of FIG. 12).

Forming the trenches 503 may include forming a mask pattern 510 exposing predetermined regions of the semiconductor substrate 500, and anisotropically etching the semiconductor substrate 500 using the mask pattern 510 as an etch mask.

In some embodiments, the mask pattern 510 may have a line-shape extending in a first direction (i.e., an X-axis direction). The mask pattern 510 includes an oxide pattern 511 and a hard mask pattern 513 that are sequentially stacked.

In more detail, forming the mask pattern 510 may include sequentially stacking a silicon oxide layer and a hard mask layer on the semiconductor substrate 500, forming a photoresist pattern (not shown) defining the active pattern 501 on the hard mask layer, and anisotropically etching the hard mask layer and the silicon oxide layer using the photoresist pattern (not shown) as an etch mask until a top surface of the semiconductor substrate 500 is exposed. Here, the photoresist pattern (not shown) may have a line-shape extending in the first direction (i.e., the x-axis direction). The silicon oxide layer may be formed by thermally oxidizing the semiconductor substrate 500. The silicon oxide layer may relieve a stress between the semiconductor substrate 500 and the hard mask layer. The hard mask layer may be formed of a silicon nitride layer, a silicon oxynitride layer, and/or a poly-silicon layer. A thickness of the hard mask layer may be varied depending on a depth of the trenches 503 formed in the semiconductor substrate 500. Additionally, the hard mask layer may be thicker than the silicon oxide layer. In some embodiments, the photoresist pattern (not shown) may be removed after the formation of the mask pattern 510.

Subsequently, the semiconductor substrate 500 is anisotropically etched using the mask pattern 510 as an etch mask with a predetermined depth. Thus, the trenches 503 defining the active pattern 501 may be formed. The trenches 503 may have a line-shape extending in the first direction (i.e., the x-axis direction). Due to the anisotropic etching process, a lower width of the trench 503 may be less than an upper width of the trench 503. In other words, the width of each of the trenches 503 may become progressively less toward a bottom surface of each of the trenches 503.

Figure 14A:
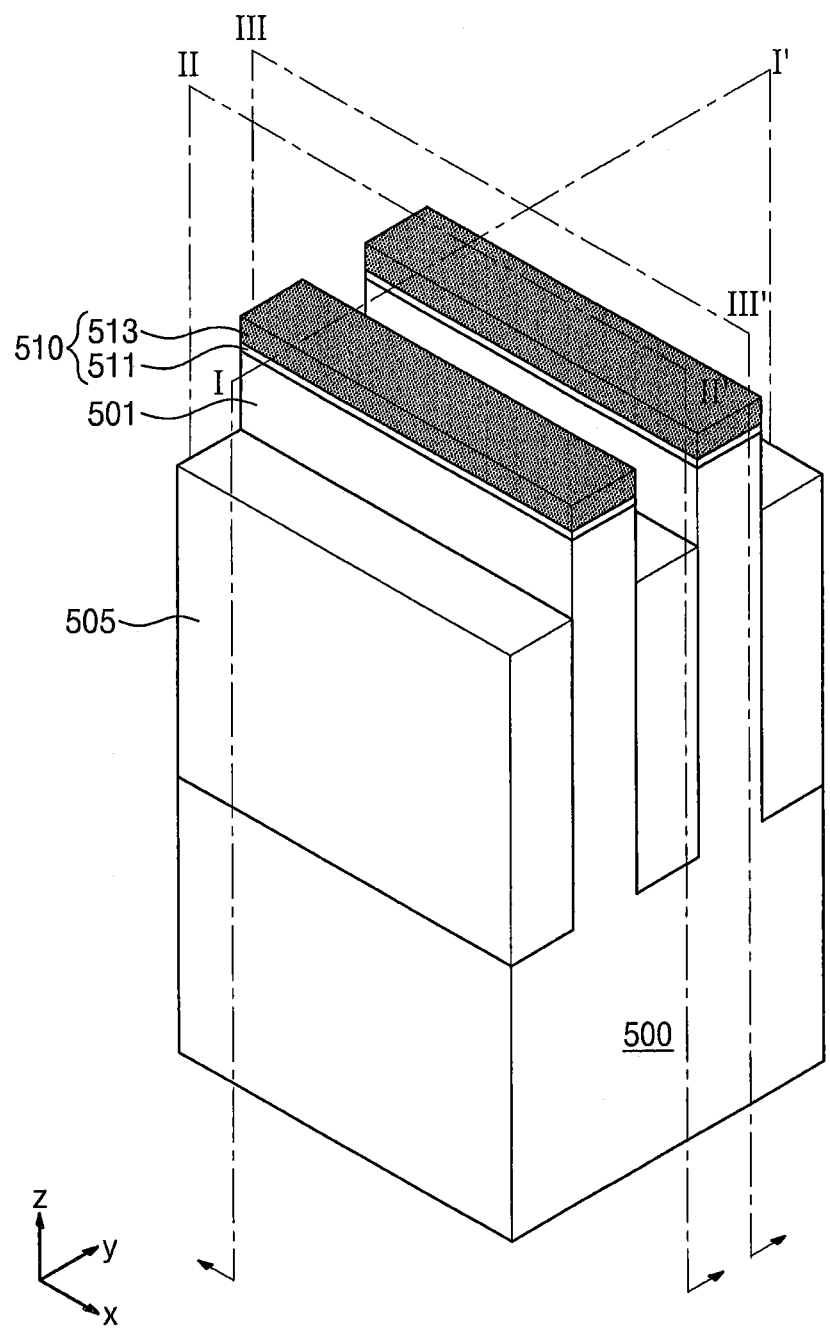
Figure 14B:
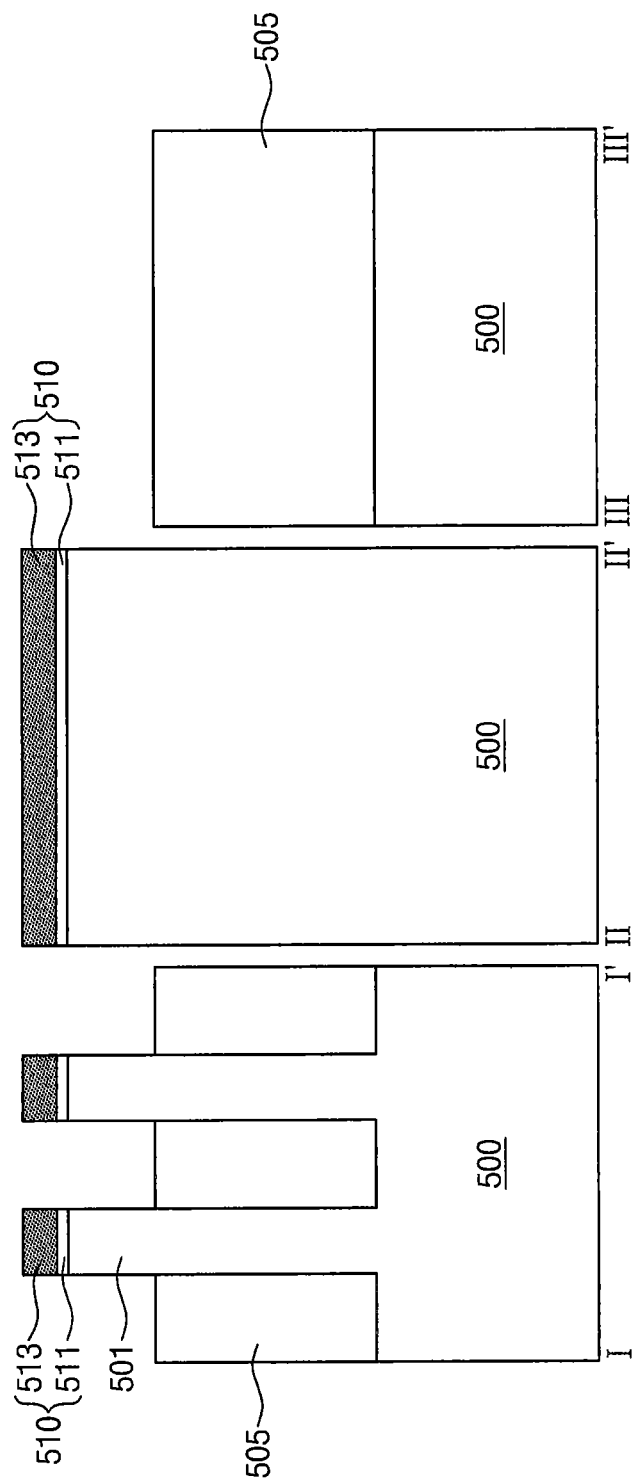

Referring to FIGS. 14A and 14B, device isolation layers 505 exposing upper sidewalls of the active pattern 501 are formed in the trenches 503, respectively. In other words, a top surface of the device isolation layer 505 may be lower than a top surface of the active pattern 501.

In some embodiments, forming the device isolation layers 505 may include forming an insulating layer in, and in some embodiments filling, the trenches 503, planarizing the insulating layer to expose a top surface of the mask pattern 510, and recessing a top surface of the planarized insulating layer to expose the upper sidewalls of the active pattern 501. Here, the insulating layer filing the trenches 503 may be deposited using a deposition technique having an excellent step coverage characteristic. Additionally, the insulating layer may be formed of an insulating material having an excellent gap fill characteristic. For example, the insulating layer may be formed of a boron-phosphor silicate glass (BPSG) layer, a high density plasma (HDP) oxide layer, an undoped silicate glass (USG) layer, and/or a Tonen silazene (TOSZ) layer. The planarization process of the inventive concepts may be performed using an etch-back method and/or a chemical mechanical polishing (CMP) method. The top surface of the planarized insulating layer may be recessed by a selective etching process using an etch recipe having an etch selectivity with respect to the active pattern 501. While the top surface of the insulating layer is recessed, a thickness of the mask pattern 510 may be reduced.

Figure 15A:
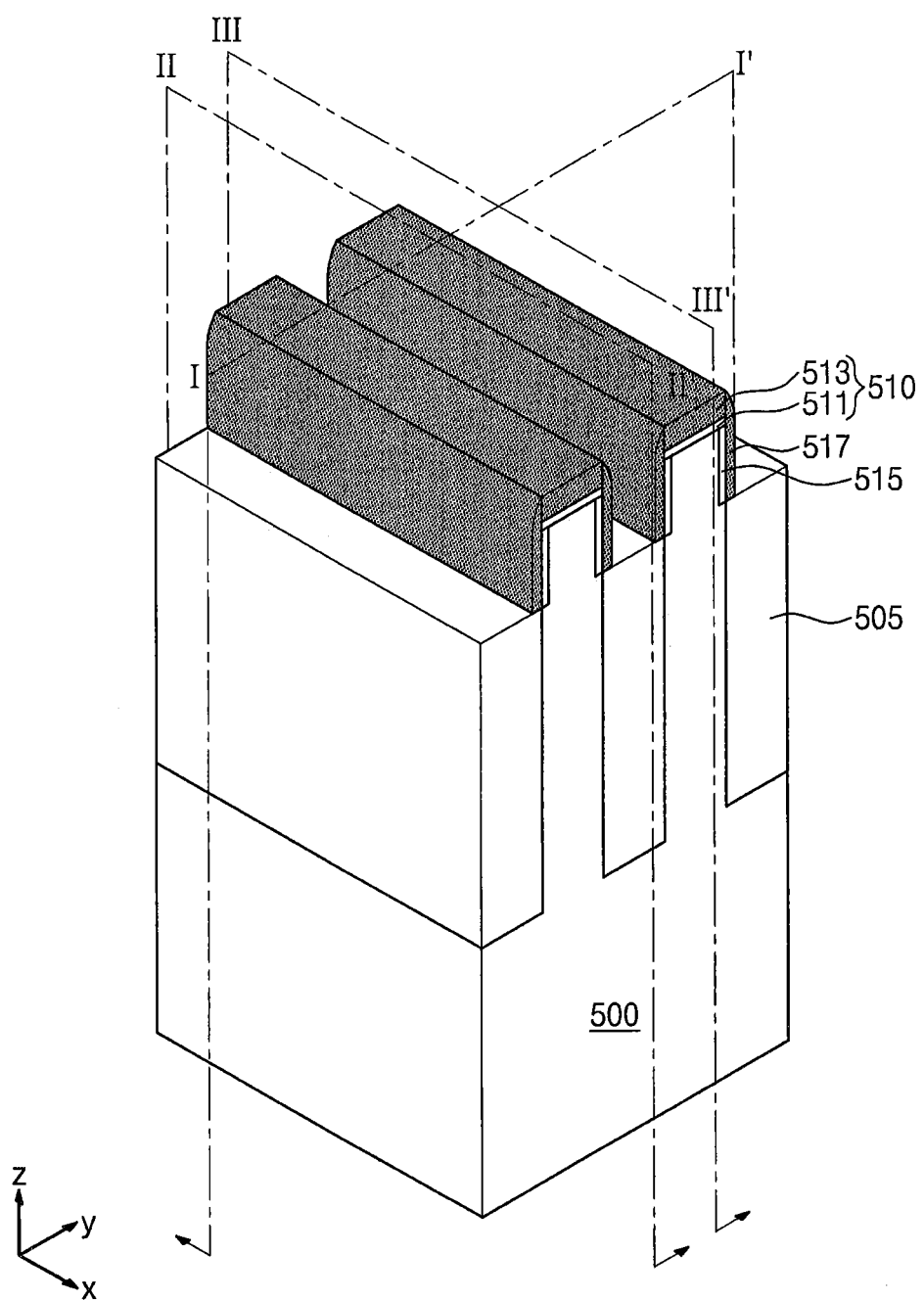
Figure 15B:
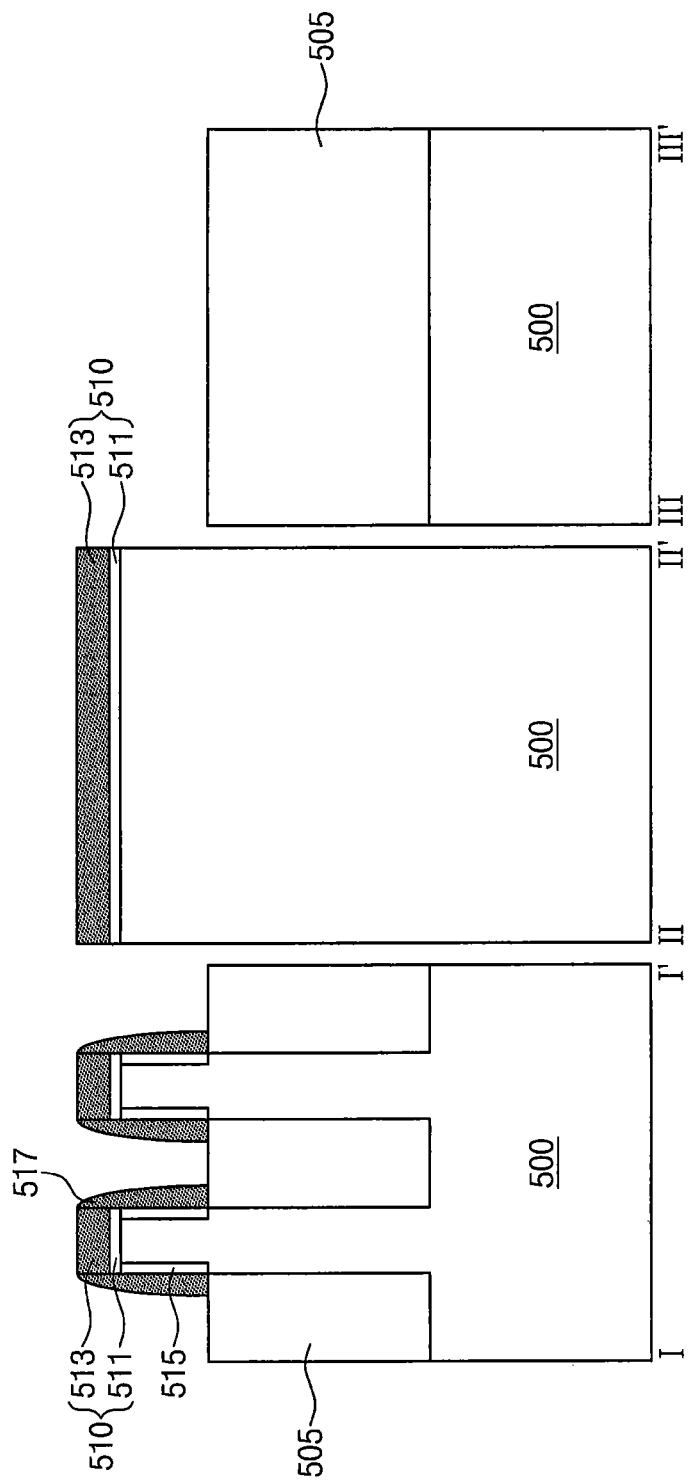

Referring to FIGS. 12, 15A, and 15B, oxidation reducing spacers 517 on, and in some embodiments covering, the upper sidewalls of the active pattern 501 are formed on the device isolation layers 505 (which may correspond to Block S1220 of FIG. 12). Additionally, the oxidation reducing spacers 517 may also cover both sidewalls of the mask pattern 510. The oxidation reducing spacers 517 may reduce, and in some embodiments may prevent, oxidation of a layer that underlies the spacer 515. Accordingly, they may also be referred to herein as "oxidation preventing spacers 517".

Forming the oxidation preventing spacers 517 may include conformally depositing an oxidation reducing or preventing layer along surfaces of the active pattern 501 and the mask pattern 510, and anisotropically etching the oxidation reducing or preventing layer by a blanket anisotropic etching process. Here, the oxidation reducing or preventing layer disposed on the top surface of the mask pattern 510 and the top surfaces of the device isolation layers 505 may be removed by the blanket anisotropic etching process performed on the oxidation reducing or preventing layer.

In some embodiments, the oxidation preventing spacers 517 may be formed of a material having an etch selectivity with respect to a silicon oxide layer. For example, the oxidation preventing spacers 517 may be formed of a silicon nitride layer and/or a silicon oxynitride layer. In some embodiments, the oxidation preventing spacers 517 may be formed of the same material as the hard mask pattern 513 of the mask pattern 510.

On the other hand, a sidewall oxide layer 515 may be formed in order to protect the upper sidewalls of the active pattern 501 before the oxidation preventing spacers 517. The sidewall oxide layer 515 may be formed by thermally oxidizing the upper sidewalls of the active pattern 501.

Figure 16A:
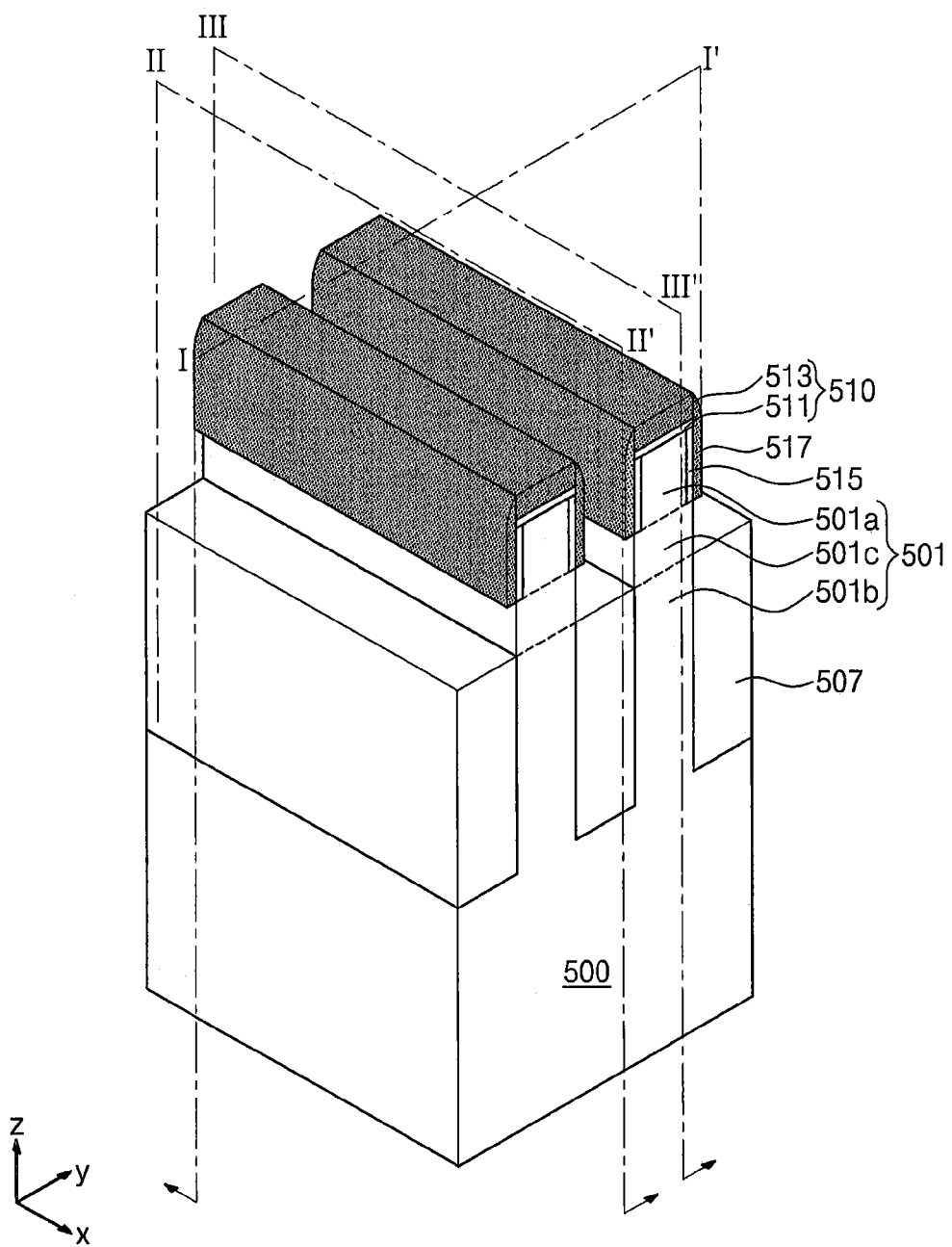
Figure 16B:
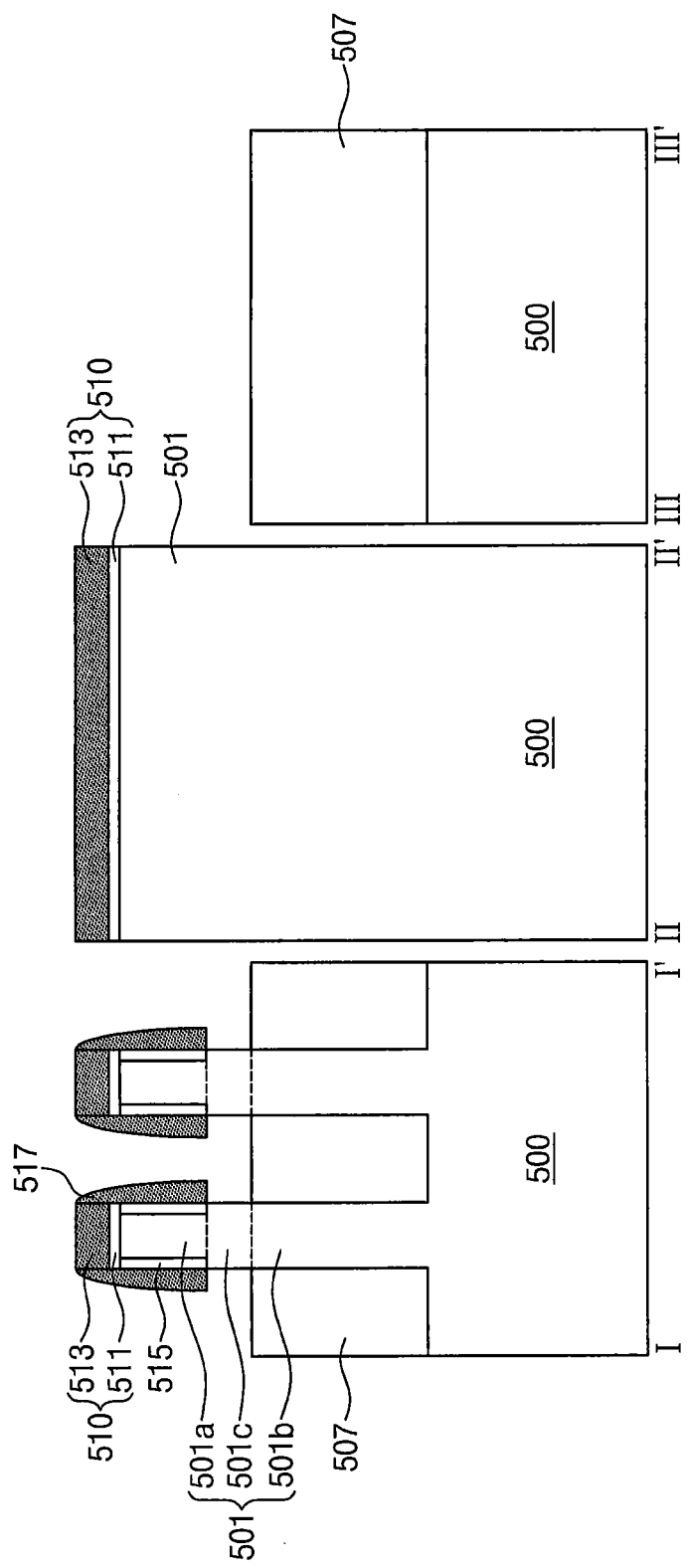

Referring to FIGS. 16A and 16B, the top surfaces of the device isolation layers 505 are recessed to form device isolation patterns 507 exposing lower sidewalls of the active pattern 501.

In some embodiments, the device isolation layers 505 may be selectively etched using an etch recipe having an etch selectivity with respect to the oxidation preventing spacers 517 and the active pattern 501, thereby forming the device isolation patterns 507. Here, an isotropic dry etching method and/or a wet etching method may be used in order to selectively etch the device isolation layers 505. Thus, bottom surfaces of the oxidation preventing spacers 517 may be spaced apart from top surfaces of the device isolation patterns 507, and a portion of the lower sidewall of the active pattern 501 may be exposed between the device isolation pattern 507 and the oxidation preventing spacer 517. In other words, the active pattern 501 may include a first portion 501a, and a second portion 501b, and a third portion 501c disposed between the first portion 501a and the second portion 501b. Sidewalls of the first portion 501a are covered by the oxidation preventing spacers 517, and sidewalls of the second portion 501b are covered by the device isolation patterns 507. The second portion 501b is connected to the semiconductor substrate 500. Sidewalls of the third portion 501c are exposed.

Figure 17A:
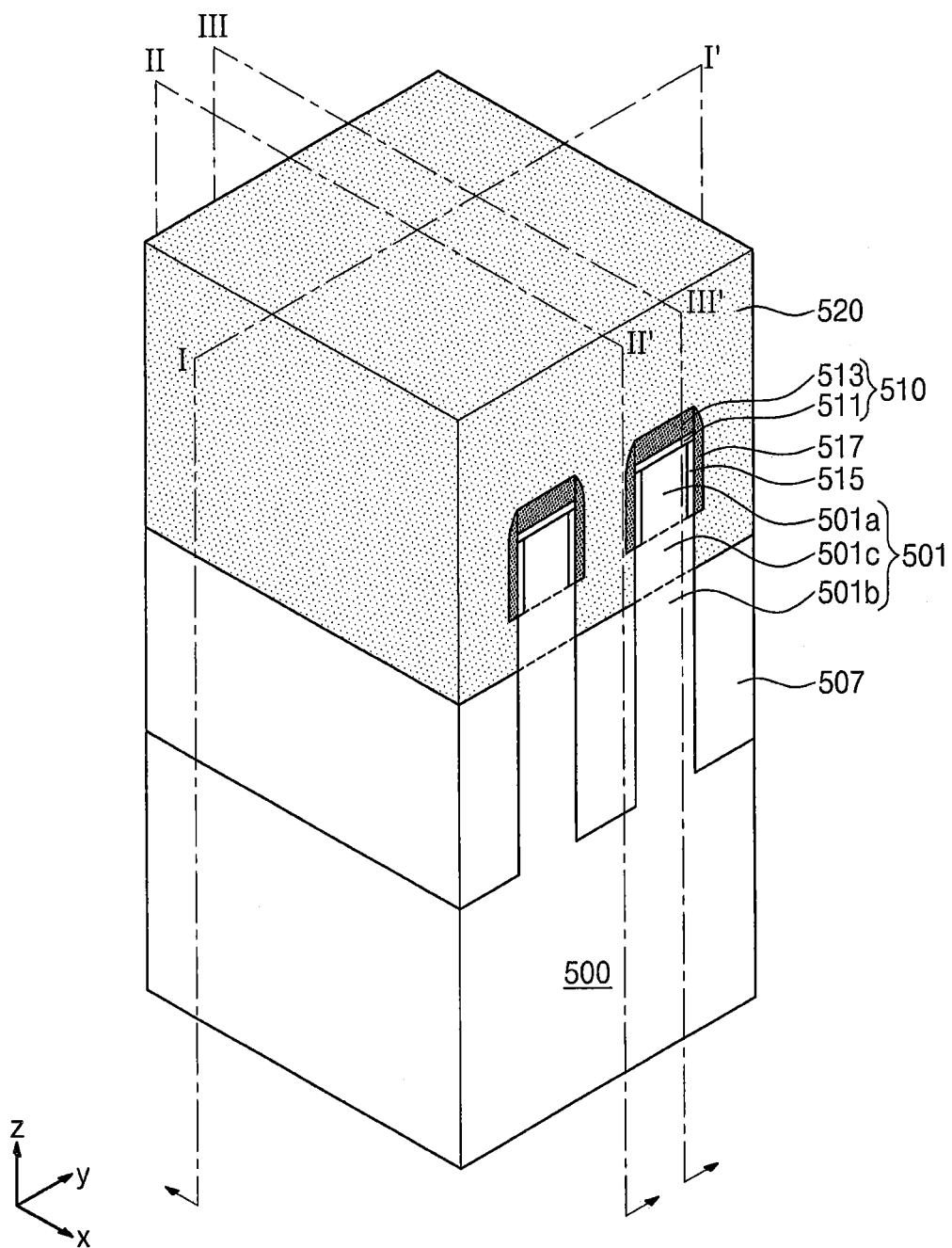
Figure 17B:
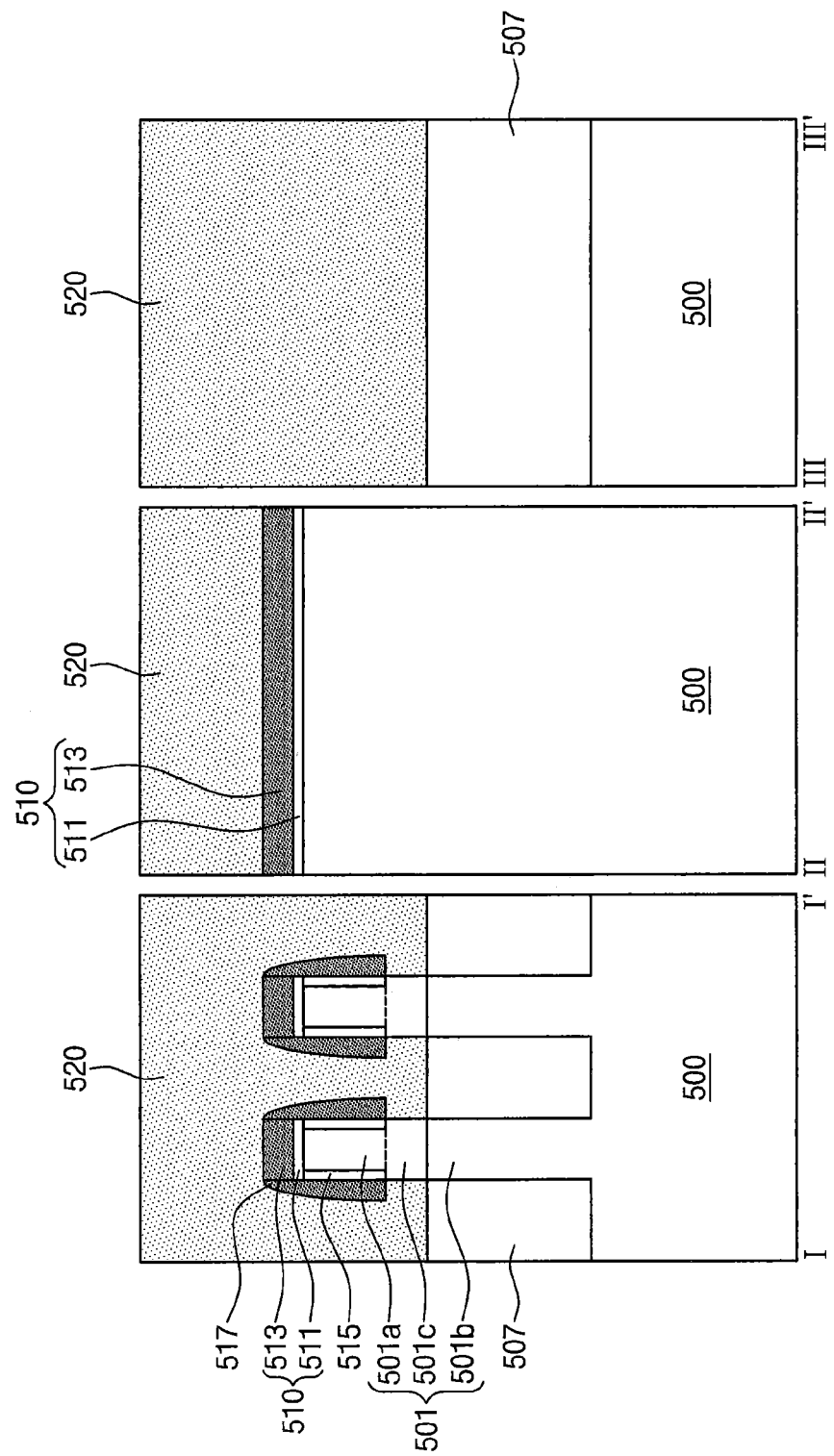

Referring to FIGS. 17A and 17B, a dummy gate layer 520 is formed on an entire surface of the semiconductor substrate 500 having the device isolation patterns 507.

The dummy gate layer 520 may fill the trenches 503 in which the device isolation patterns 507 are formed. Additionally, the dummy gate layer 520 may also be formed on the mask pattern 510. The dummy gate layer 520 in, and in some embodiments filling, the trenches 503 may be in direct contact with the third portion 501c of the active pattern 501.

The dummy gate layer 520 may be formed of a material having an etch selectivity with respect to the device isolation pattern 507, the oxidation preventing spacer 517, and the active pattern 501. For example, the dummy gate layer 520 may be formed of a poly-silicon layer doped with dopants, an undoped poly-silicon layer, a silicon-germanium layer, and/or a silicon carbide layer.

The dummy gate layer may be formed by a chemical vapor deposition (CVD) method, a physical vapor deposition (PVD) method, and/or an atomic layer deposition (ALD) method. After the dummy gate layer 520 is formed using the above deposition method, a top surface of the dummy gate layer 520 may be planarized.

Figure 18A:
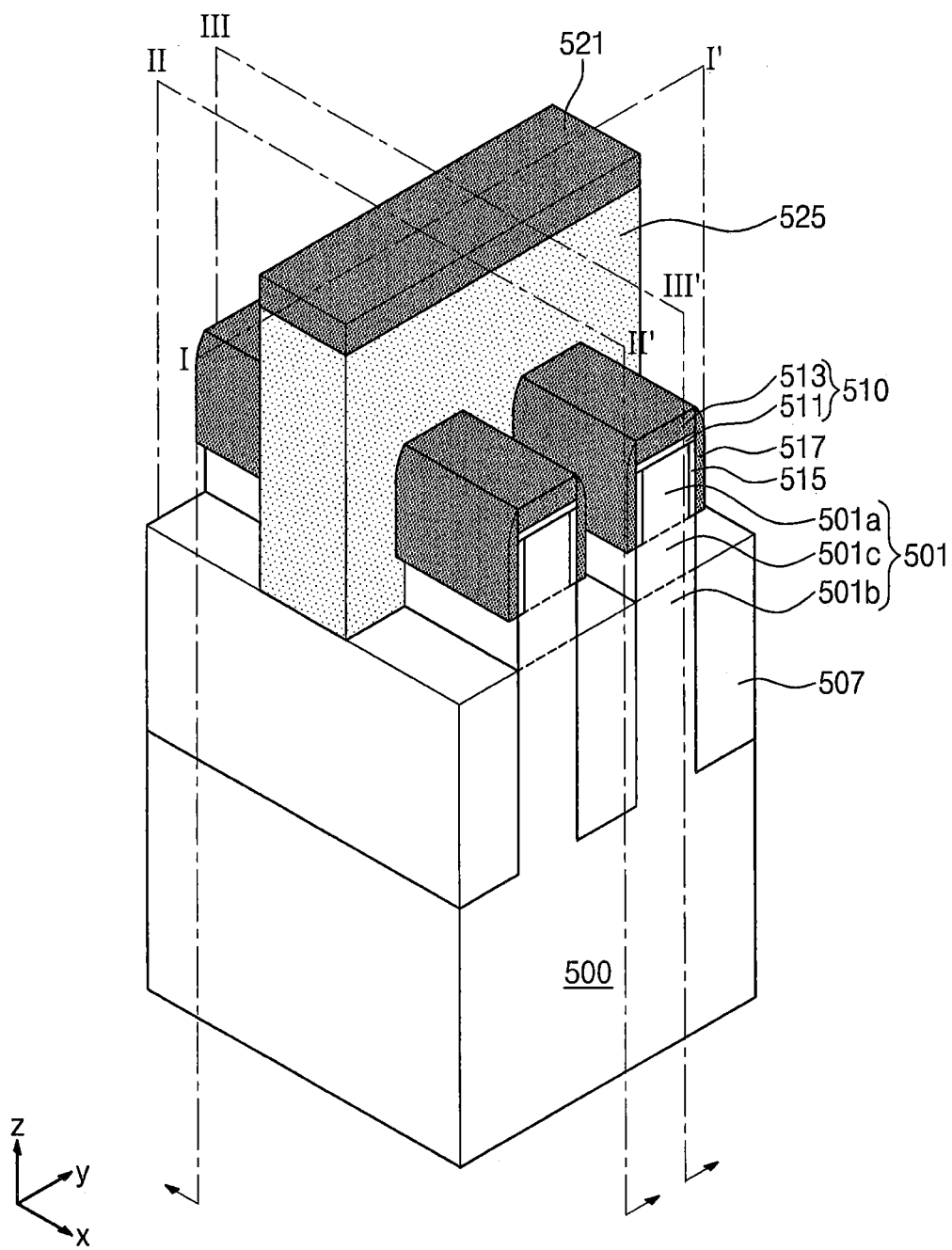
Figure 18B:
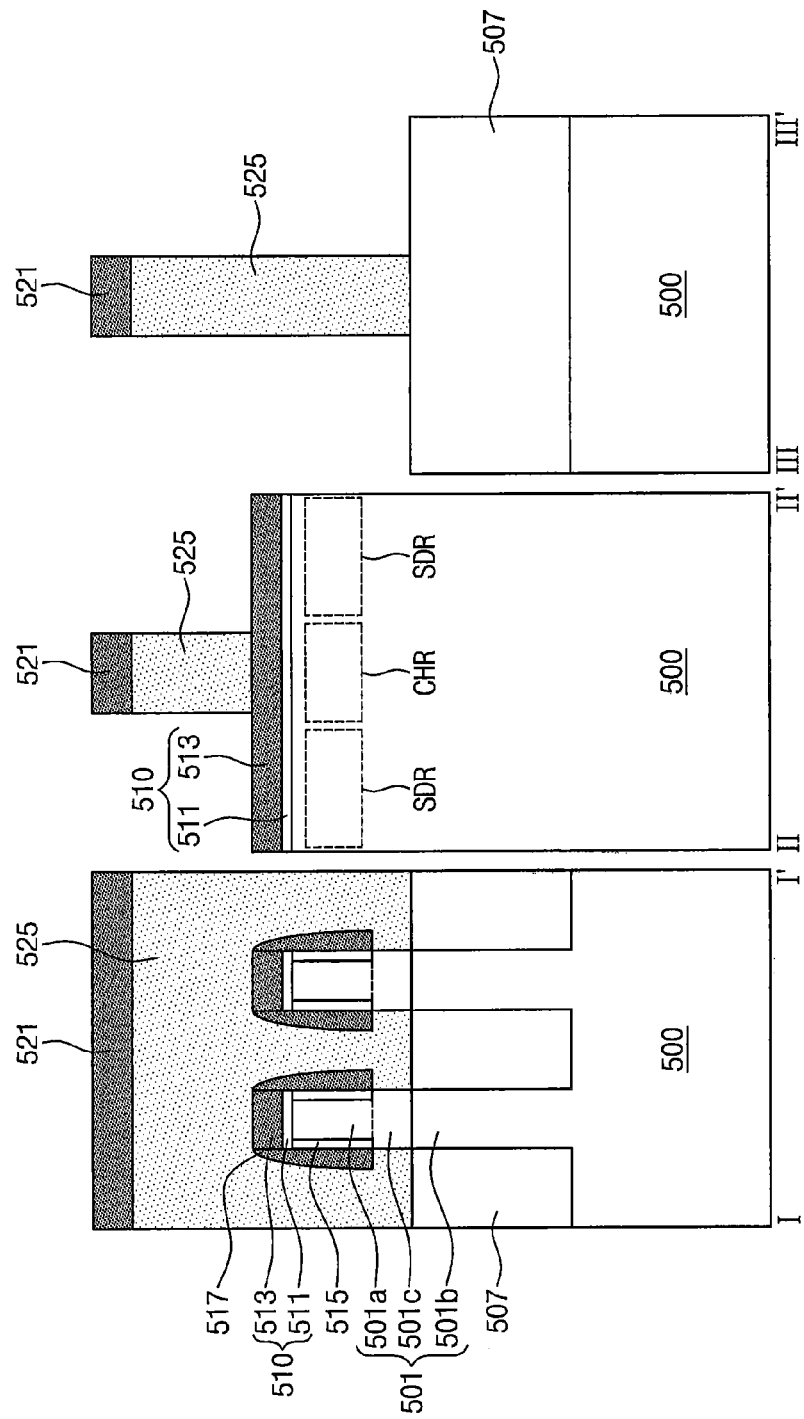

Referring to FIGS. 12, 18A and 18B, a dummy gate pattern 525 is formed to cross over the active pattern 501 (which may correspond to Block S1230 of FIG. 12).

Forming the dummy gate pattern 525 includes forming a gate mask pattern 521 crossing over the active pattern 501 on the dummy gate layer 520, and anisotropically etching the dummy gate layer 520 using the gate mask pattern 521 as an etch mask. The hard mask pattern 513 and the device isolation patterns 507 may be used as etch stop layers when the dummy gate layer 520 is anisotropically etched.

Due to the formation of the dummy gate pattern 525, a channel region CHR and source/drain regions SDR may be defined in the first portion 501a of the active pattern 501. The channel region CHR may be a portion of the active pattern 501 disposed under the dummy gate pattern 525, the source/drain regions SDR may be other portions of the active pattern 501 that are disposed at both sides of the dummy gate pattern 525 and are laterally separated from each other by the channel region CHR.

Figure 19A:
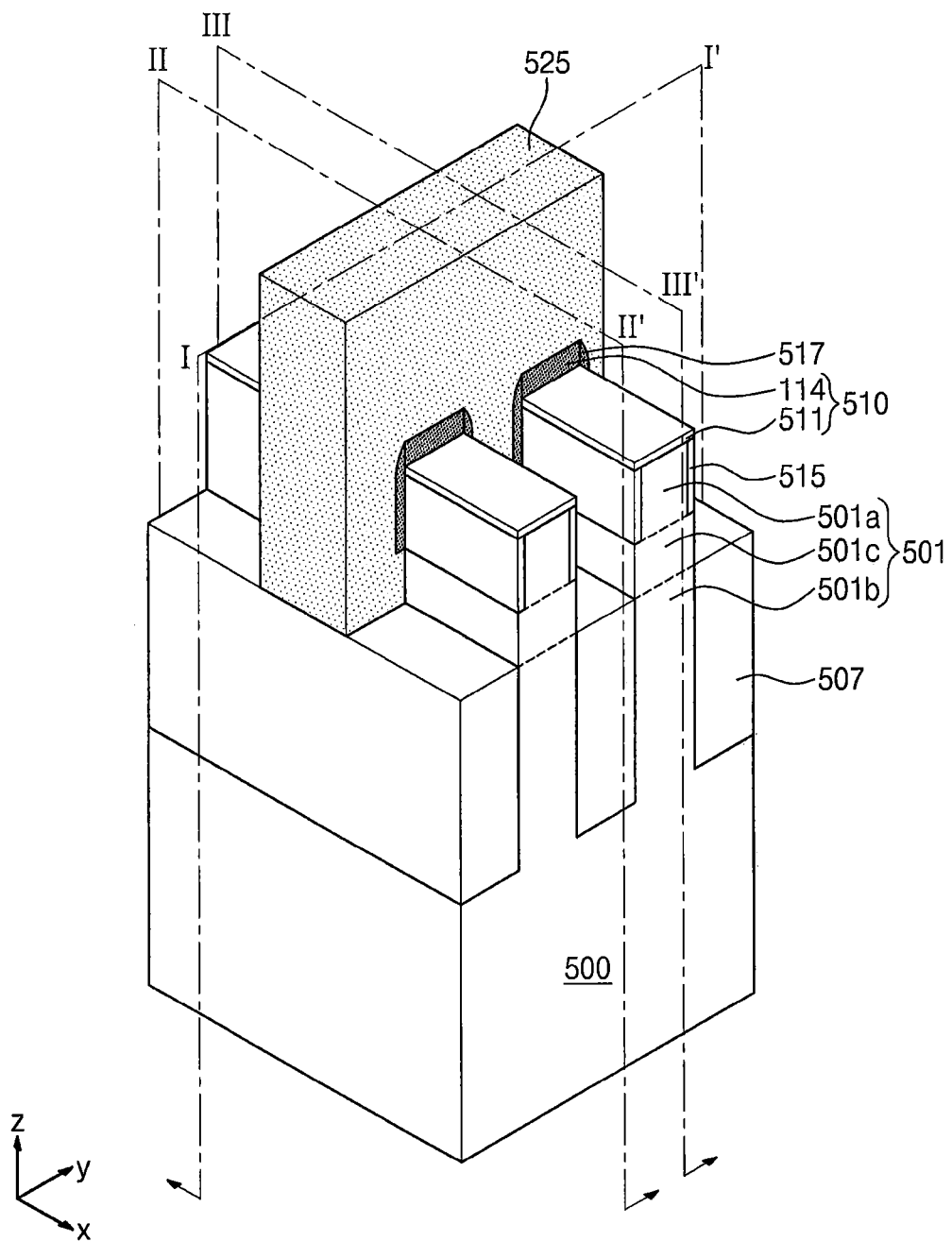
Figure 19B:
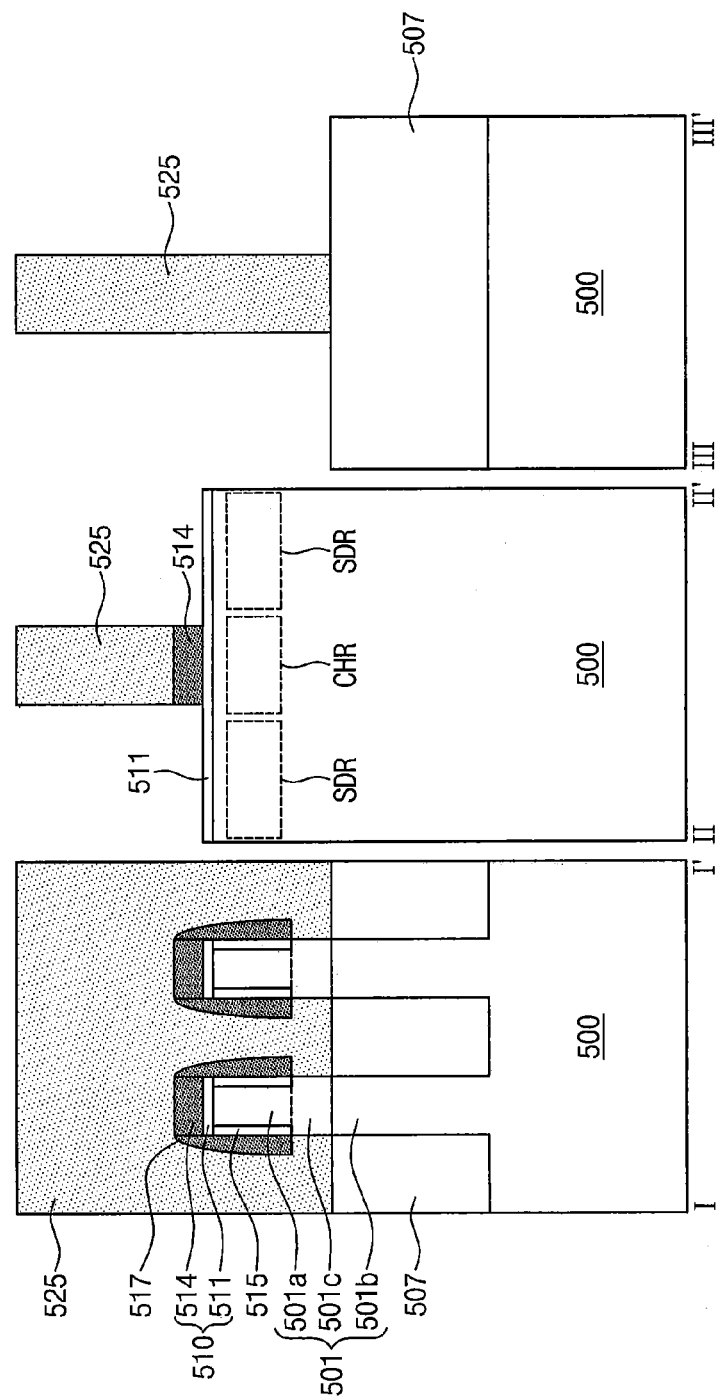

Referring to FIGS. 19A and 19B, portions of the mask pattern 510 are anisotropically etched using the dummy gate pattern 525 as an etch mask. Thus, the oxide pattern 511 on the active pattern 501 of the source/drain regions SDR may be exposed. Additionally, a residual hard mask pattern 514 and oxidation preventing spacers 517 may be locally formed under the dummy gate pattern 525.

Figure 20A:
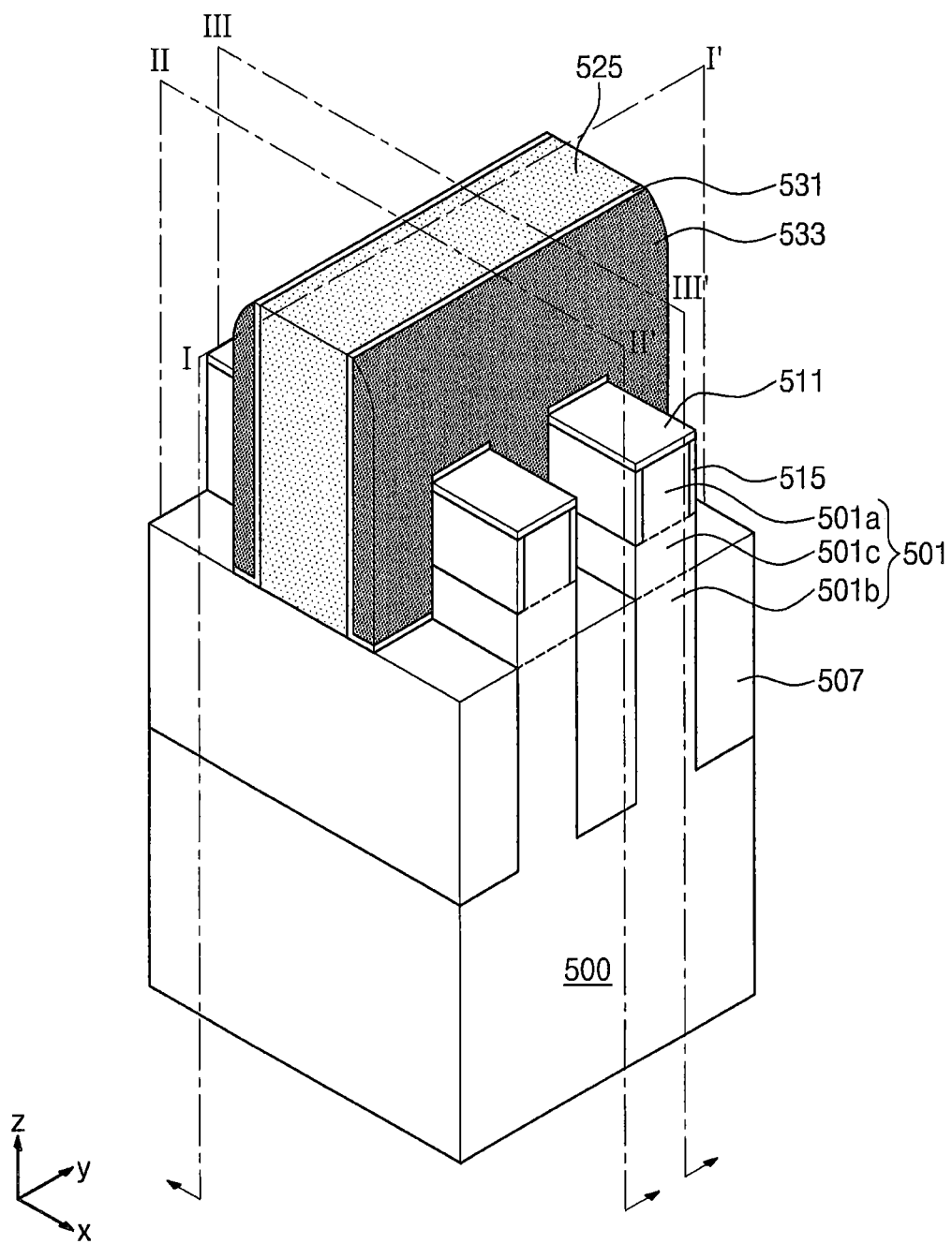
Figure 20B:
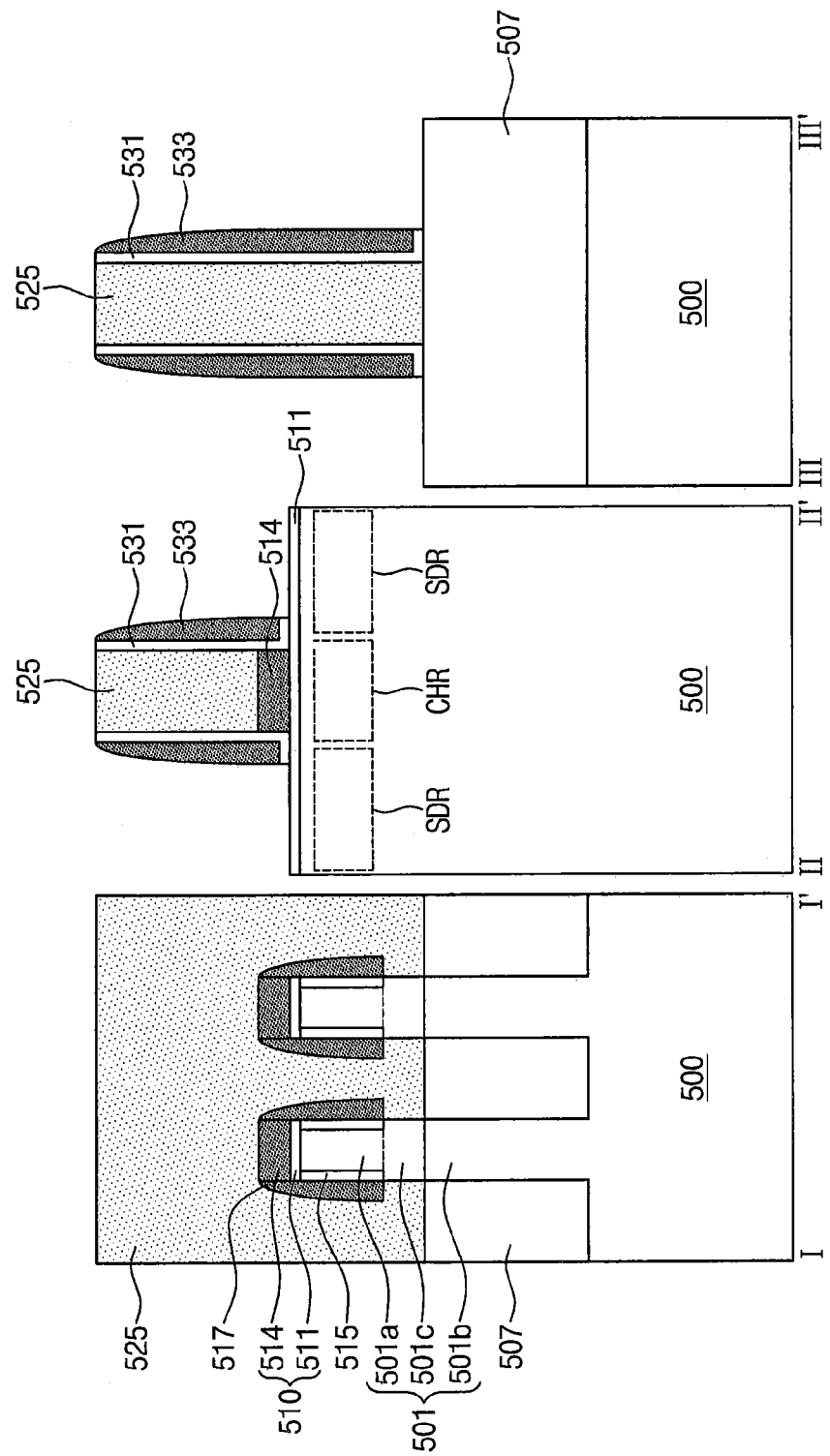

Referring to FIGS. 12, 20A, and 20B, protecting spacers 531 and sidewall spacers 533 are sequentially formed on both sidewalls of the dummy gate pattern 525, respectively (which may correspond to Block S1240 of FIG. 12). The protecting spacers 531 may be in direct contact with the both sidewalls of the dummy gate pattern 525.

Forming the protecting spacers 531 and the sidewall spacers 533 includes conformally forming a protecting spacer layer and a sidewall spacer layer on the semiconductor substrate 500 having the dummy gate pattern 525, and anisotropically etching the sidewall spacer layer and the protecting spacer layer by a blanket anisotropic etching process.

In some embodiments, the protecting spacers 531 may be formed of a material having an etch selectivity with respect to the oxidation preventing spacers 517. For example, the protecting spacers 531 may be formed of at least one of metal oxide layers such as a tantalum oxide layer, a titanium oxide layer, a hafnium oxide layer, a zirconium oxide layer, an aluminum oxide layer, an yttrium oxide layer, a niobium oxide layer, a cesium oxide layer, an indium oxide layer, an iridium oxide layer, a barium-strontium titanate (BST) layer, and/or a lead zirconate titanate (PZT) layer.

The sidewall spacers 533 may be formed of a material having an etch selectivity with respect to the protecting spacers 531. For example, the sidewall spacers 533 may be formed of a silicon nitride layer or a silicon oxynitride layer.

Meanwhile, in other embodiments, the sidewall spacers may be omitted. In this case, the protecting spacers 531 may be in direct contact with an interlayer insulating layer 540.

Figure 21A:
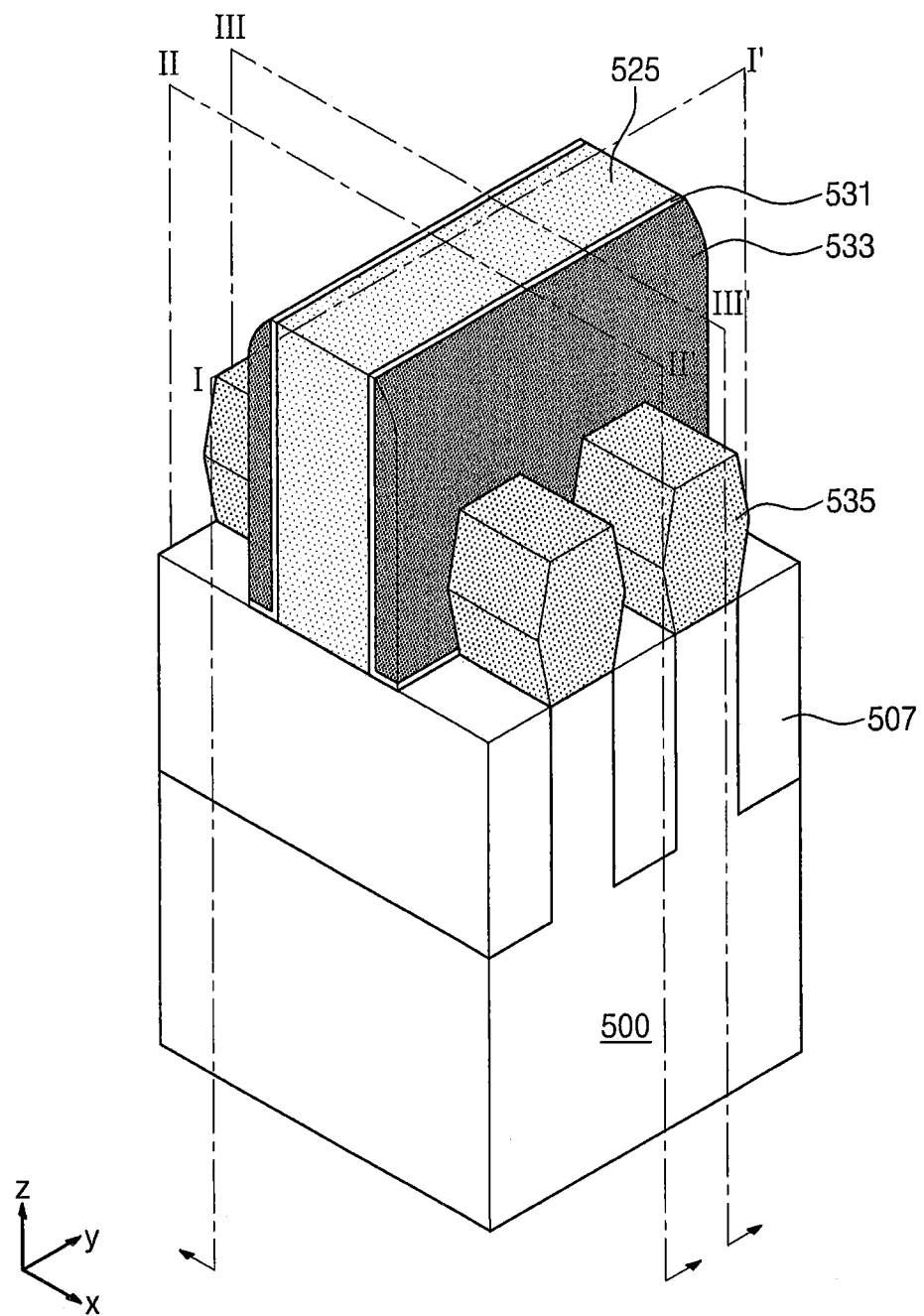
Figure 21B:
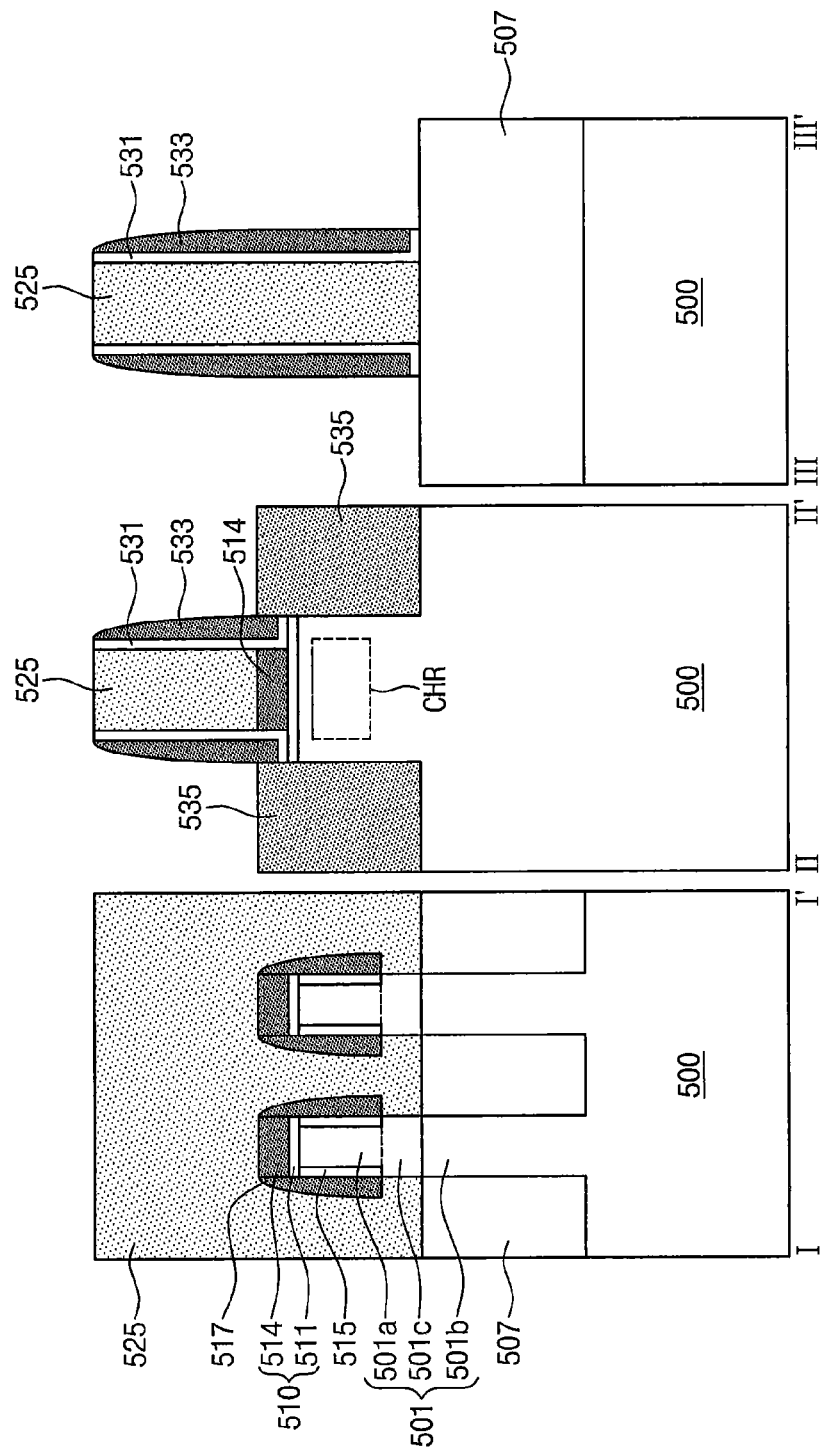

Referring to FIGS. 12, 21A, and 21B, sour/drain electrodes 535 are formed on or in the active pattern 501 at both sides of the dummy gate pattern 525 (which may correspond to Block S1250 of FIG. 12).

The source/drain electrodes 535 may be formed at positions of the source/drain regions SDR of the active pattern 501. Thus, the channel region CHR of the active pattern 501 may be disposed between the source/drain electrodes 535.

In some embodiments, forming the source/drain electrodes 535 may include removing the source/drain regions SDR of the active pattern 501, and forming an epitaxial layer. If the semiconductor device includes a CMOS structure, forming the epitaxial layer may include forming a first epitaxial layer for a source/drain electrode of a NMOSFET and forming a second epitaxial layer for a source/drain electrode of a PMOSFET. In some embodiments, the first epitaxial layer may be configured to generate a tensile strain, and the second epitaxial layer may be configured to generate a compressive strain. For example, the first epitaxial layer may be formed of silicon carbide (SiC), and the second epitaxial layer may be formed of silicon-germanium (SiGe). However, embodiments of the inventive concepts are not limited thereto. Further, a metal silicide (not shown) may be formed on each source/drain electrode 535. The metal silicide may be nickel silicide, cobalt silicide, tungsten silicide, titanium silicide, niobium silicide, or tantalum silicide.

In other embodiments, forming the source/drain electrodes 535 may include implanting n-type or p-type dopant ions into the source/drain regions SDR of the active pattern 501 using the dummy gate pattern 525 as an ion implantation mask.

Figure 22A:
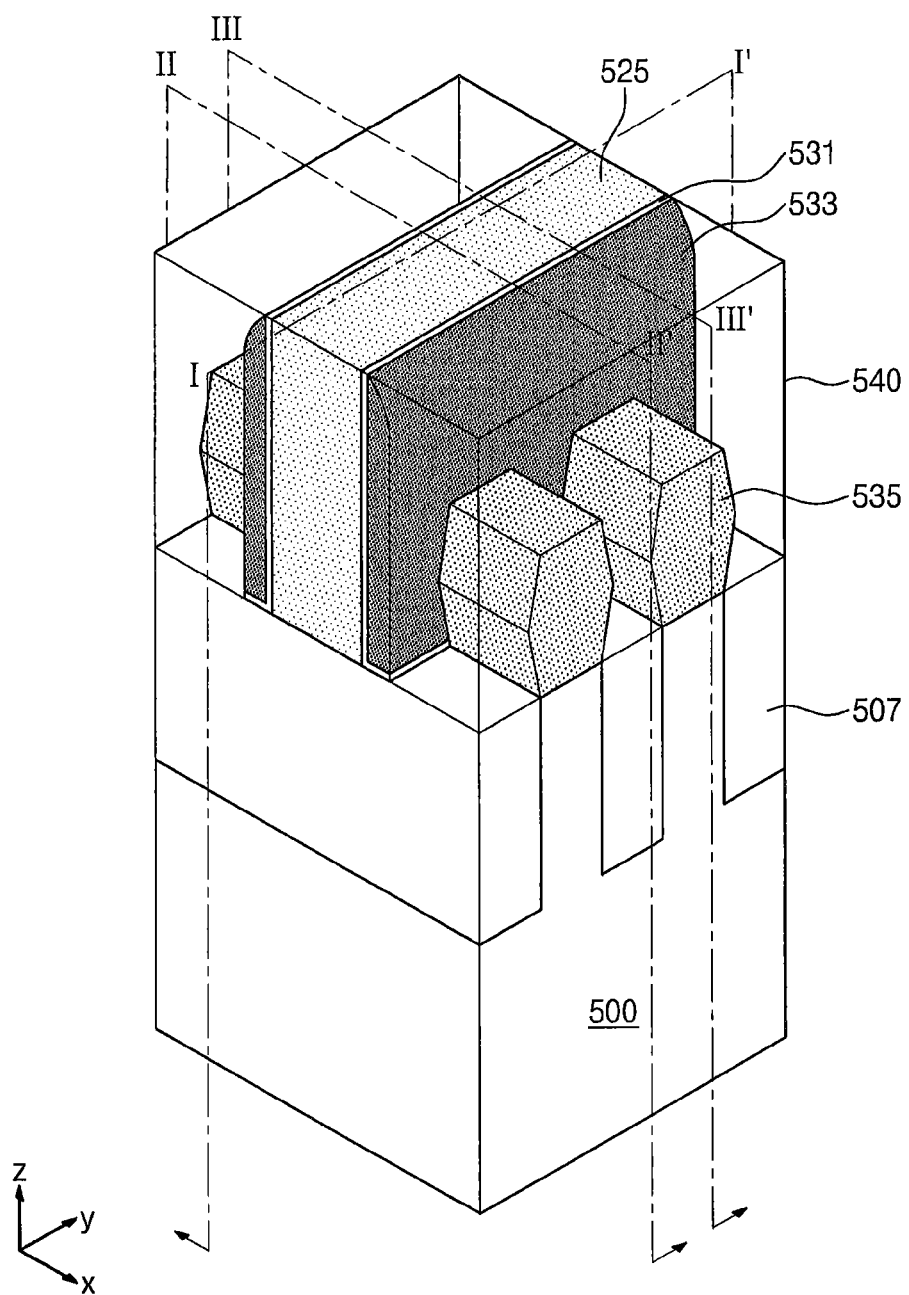
Figure 22B:
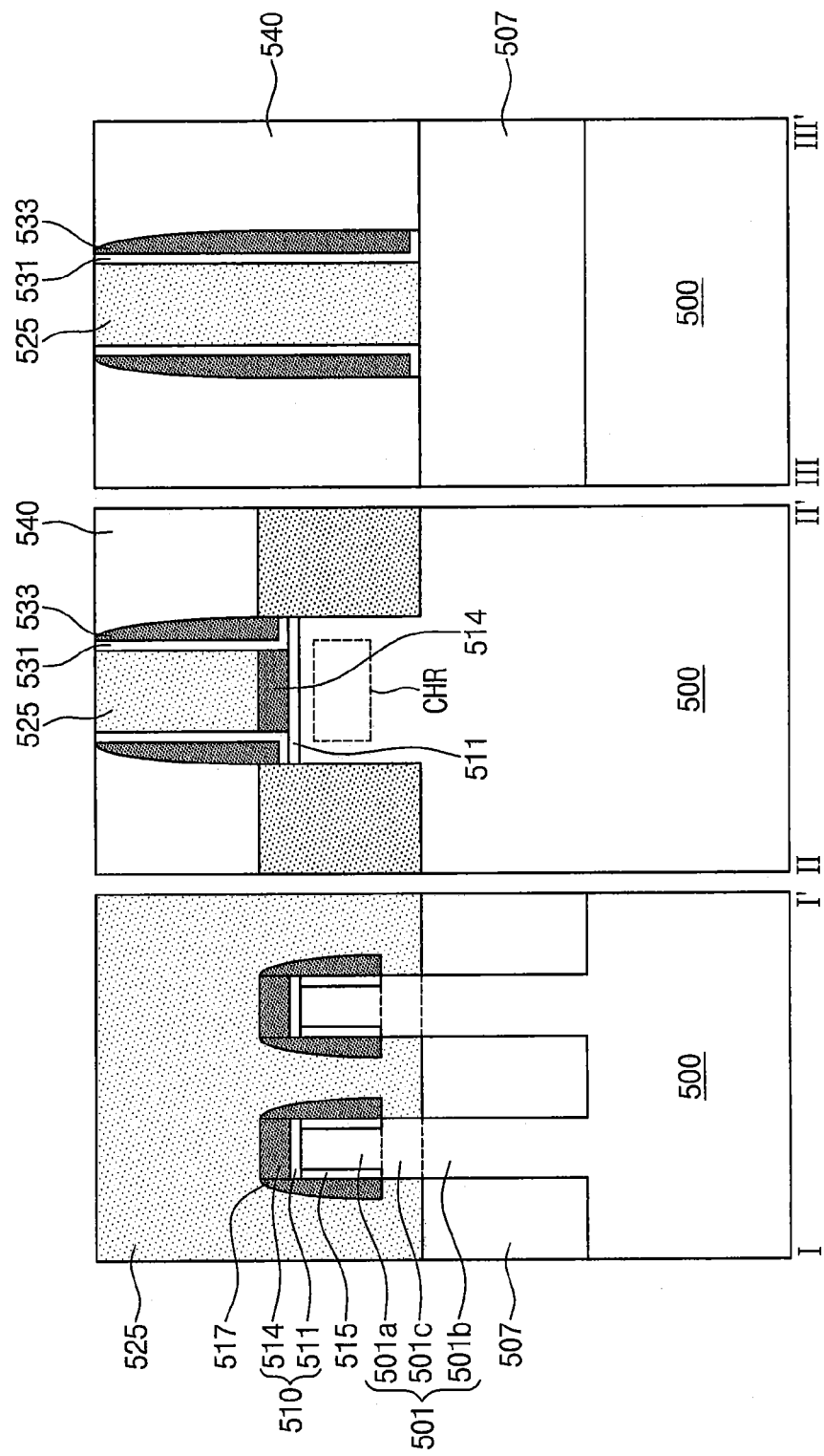

Referring to FIGS. 22A and 22B, an interlayer insulating layer 540 exposing a top surface of the dummy gate pattern 525 is formed on the semiconductor substrate 500.

Forming the interlayer insulating layer 540 may include forming an insulating layer on, and in some embodiments covering, the resultant structure having the source/drain electrodes 535, and planarizing the insulating layer until the top surface of the dummy gate pattern 525 is exposed. The interlayer insulating layer 540 may include at least one of a silicon oxide layer, a silicon nitride layer, a silicon oxynitride layer, and/or one or more low-k dielectric layers.

Figure 23A:
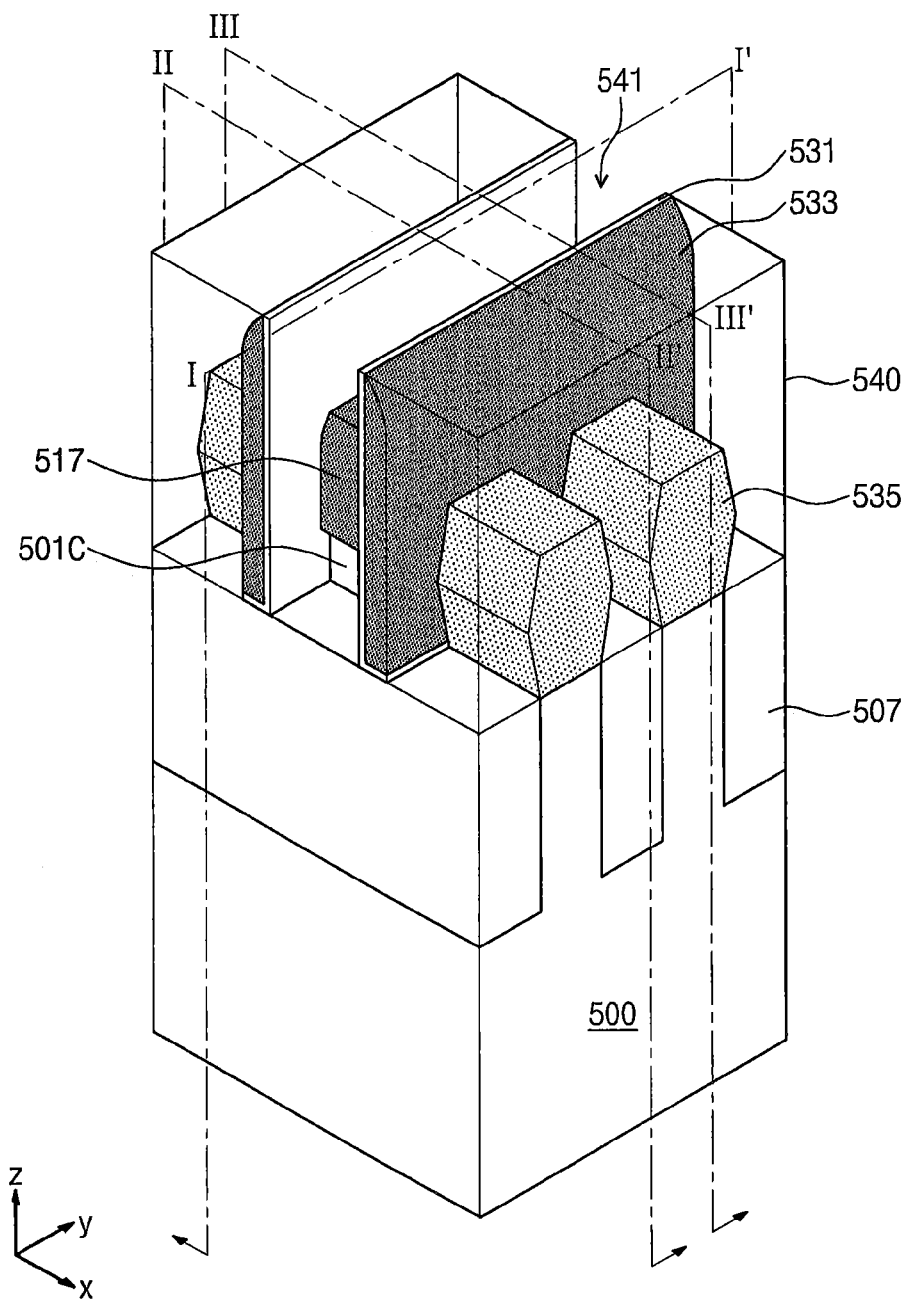
Figure 23B:
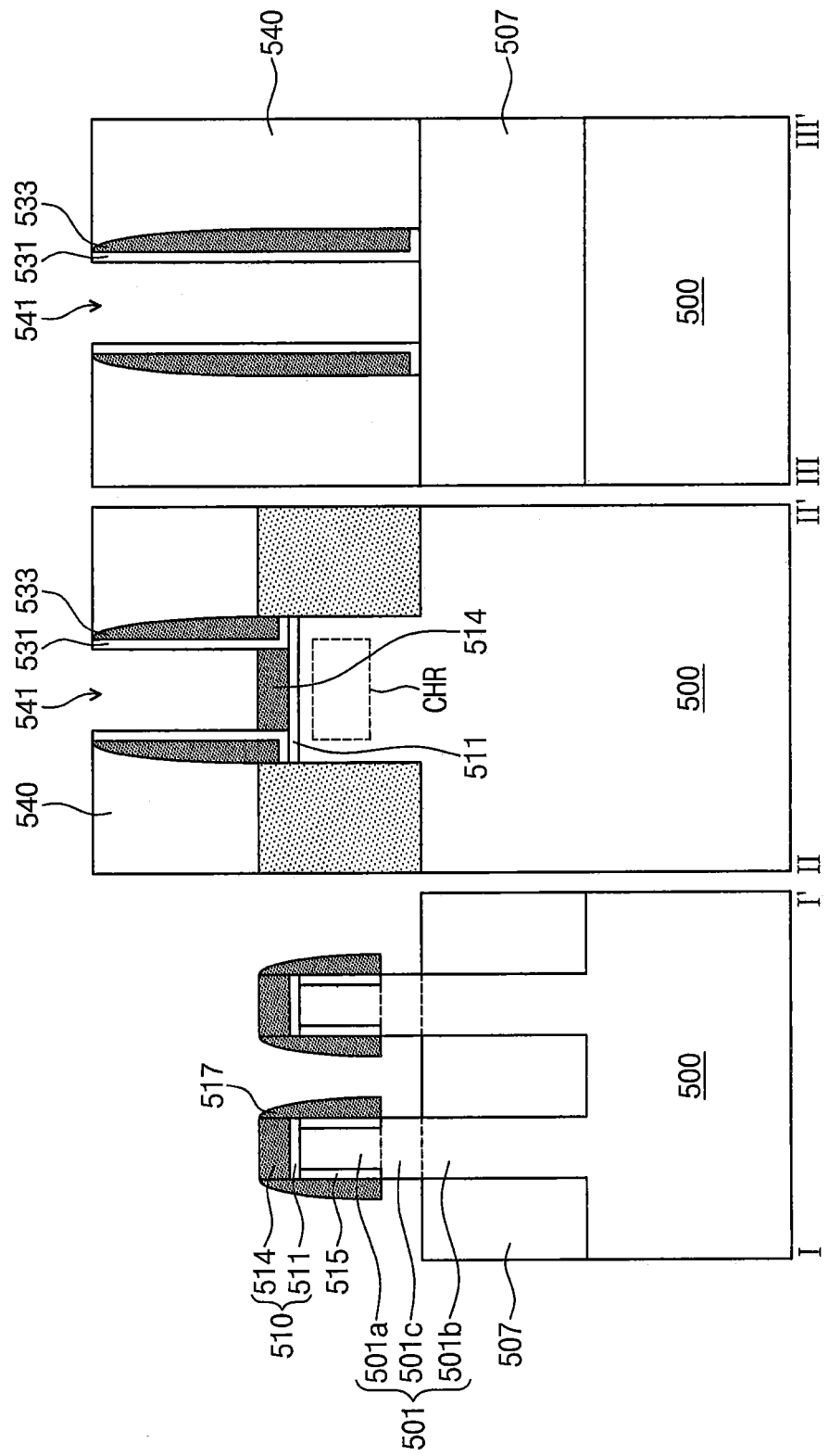

Referring to FIGS. 23A and 23B, the dummy gate pattern 525 is removed to form a gate region 541 between the protecting spacers 531.

Removing the dummy gate pattern 525 may be performed by at least one of a dry etching process and a wet etching process. In more detail, the dummy gate pattern 525 may be wet-etched using an etch recipe having an etch selectivity with respect to the interlayer insulating layer 540, the protecting spacers 531 and the oxidation preventing spacers 517. In some embodiments, if the dummy gate pattern 525 is formed of silicon-germanium (SiGe), the dummy gate pattern 525 may be removed using an etching solution including a mixture of ammonia water and hydrogen peroxide. In other embodiments, if the dummy gate pattern 525 is formed of poly-silicon, the dummy gate pattern 525 may be removed using an etching solution including a mixture of nitric acid, acetic acid, and/or hydrofluoric acid.

As described above, the dummy gate pattern 525 is removed such that portions of the lower sidewalls of the active pattern 501 may be exposed in the gate region 541. In other words, the third portion 501c of the active pattern 501 may be exposed. The first portion 501a of the active pattern 501 may be covered by the oxidation preventing spacers 517 and the mask pattern 510.

In some embodiments, a process of recessing the device isolation patterns 507 formed of an insulating material is not performed when the portions of the lower sidewalls of the active pattern 501 are exposed. Thus, it is possible to prevent the top surface of the interlayer insulating layer 540 and the top surfaces of the device isolation patterns 507 from being recessed. As a result, a thickness of the interlayer insulating layer 540 may be prevented from being reduced after the formation of the gate region 541. In other words, a height of the gate region 541 may be maintained after the formation of the gate region 541.

Figure 24A:
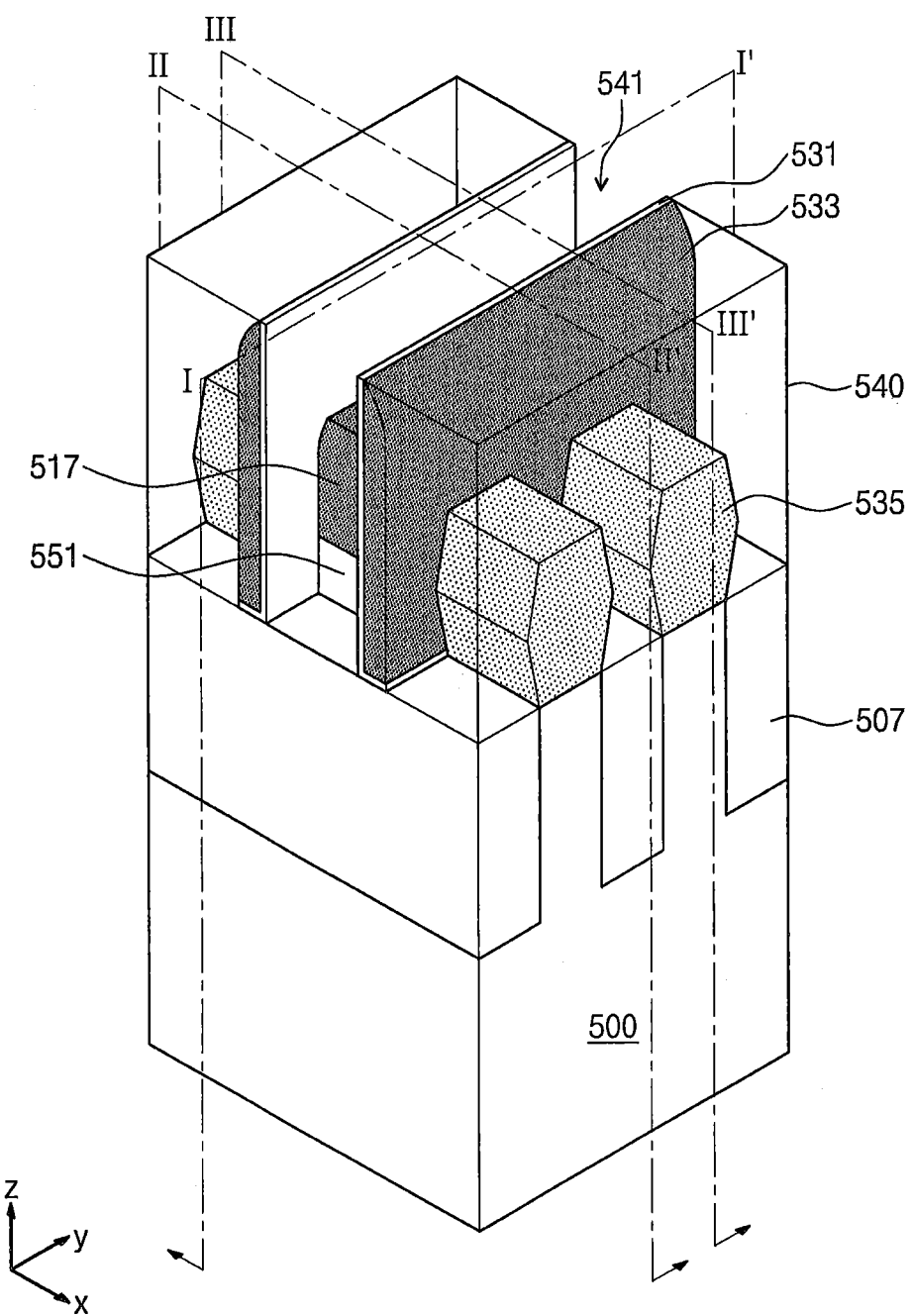
Figure 24B:
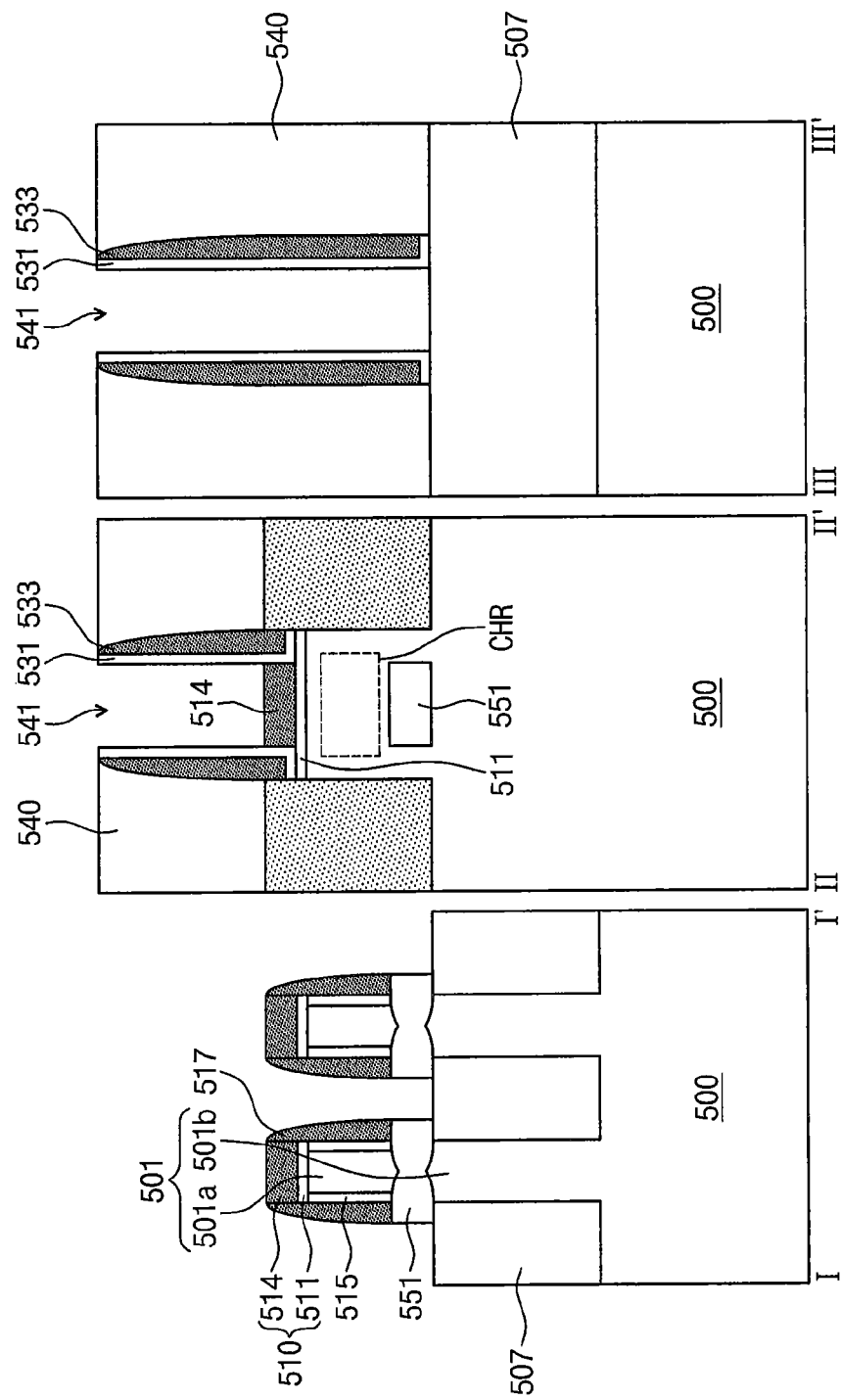

Referring to FIGS. 12, 24A, and 24B, the lower sidewalls of the active pattern 501 exposed by the gate region 541 are oxidized to form a local insulation pattern 551 under the channel region CHR of the active pattern 501 (which may correspond to Block S1260 of FIG. 12).

In some embodiments, the local insulation pattern 551 may be formed by performing an oxidation process that thermally treats the exposed lower sidewalls under a gas atmosphere including oxygen atoms. For example, the oxidation process may be a thermal oxidation process or a radical oxidation process. The thermal oxidation process may be performed by a dry oxidation method using oxygen, or a wet oxidation method using steam of an oxidizer. When the oxidation process is performed, a source gas may include an oxygen ($O_2$) gas, a $H_2O$ (g) gas (i.e., steam), a mixture gas of $H_2$ and $O_2$, and/or a mixture gas of $H_2$, $Cl_2$, and $O_2$.

Since the oxidation process described above is performed, the oxygen atoms may react with silicon atoms of the exposed third portion 501c of the active pattern 501, thereby forming the local insulation pattern 551 (e.g., silicon oxide). A width of the local insulation pattern 551 may be substantially equal to or greater than a width of the active pattern 501. Since the exposed both sidewalls of the active pattern 501 are oxidized to form the local insulation pattern 551, the local insulation pattern 551 may have an uneven top surface and an uneven bottom surface.

Figure 25A:
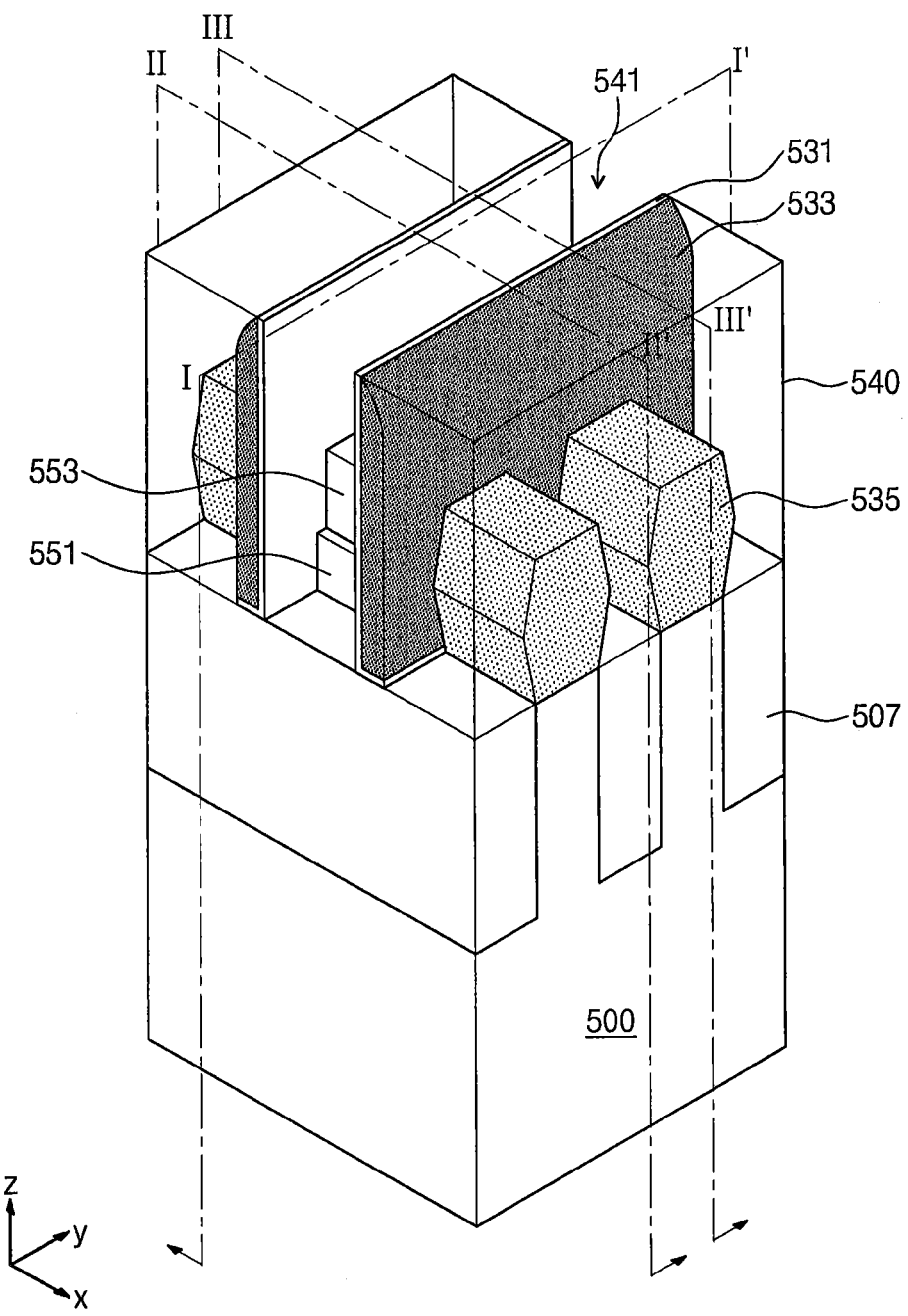

Referring to FIGS. 25A and 25B, after the formation of the local insulation pattern 551, the oxidation preventing spacers 517, the mask pattern 510, and the sidewall oxide layer 515 may be removed to expose the first portion 501a of the active pattern 501.

The oxidation preventing spacers 517, the mask pattern 510 and the sidewall oxide layer 515 may be removed by performing etching processes using etch recipes having an etch selectivity with respect to the protecting spacers 531. In some embodiments, if the oxidation preventing spacers 517 and the residual hard mask pattern 514 are formed of silicon nitride, the oxidation preventing spacers 517 and the residual hard mask pattern 514 may be removed by an etching process using an etching solution including phosphoric acid. The sidewall oxide layer 515 and the oxide pattern 511 may be removed by an etching process using an etching solution including hydrofluoric acid (HF).

In some embodiments, loss of the sidewall spacers 533 may be reduced or prevented by the protecting spacers 531 during the removal of the oxidation preventing spacers 517, the mask pattern 510 and the sidewall oxide layer 515. Thus, a width of the gate region 541 may be substantially equal to a width of the dummy gate pattern 525.

Subsequently, referring to FIGS. 25A and 25B, a gate insulating layer 553 is formed to conformally cover a surface of the first portion 501a of the active pattern 501.

The gate insulating layer 553 may be formed of at least one high-k dielectric layer such as a hafnium oxide layer, a hafnium silicate layer, a zirconium oxide layer, and/or a zirconium silicate layer. The gate insulating layer 553 may be conformally formed on a top surface and sidewalls of the active pattern 501 by an atomic layer deposition technique. Alternatively, the gate insulating layer 553 may be formed by thermally oxidizing the surface of the first portion 501a of the active pattern 501 exposed by the gate region 541.

Figure 26A:
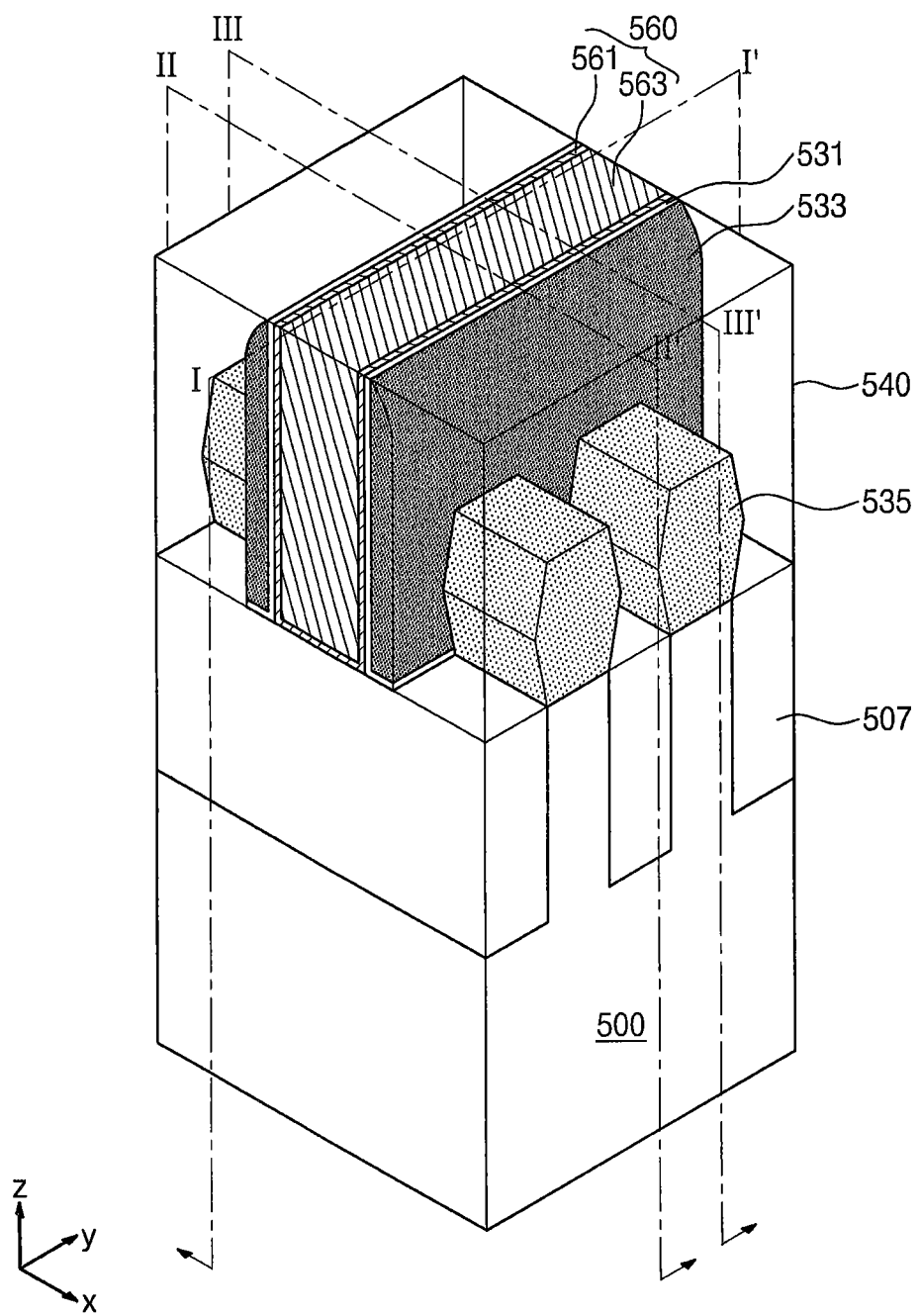
Figure 26B:
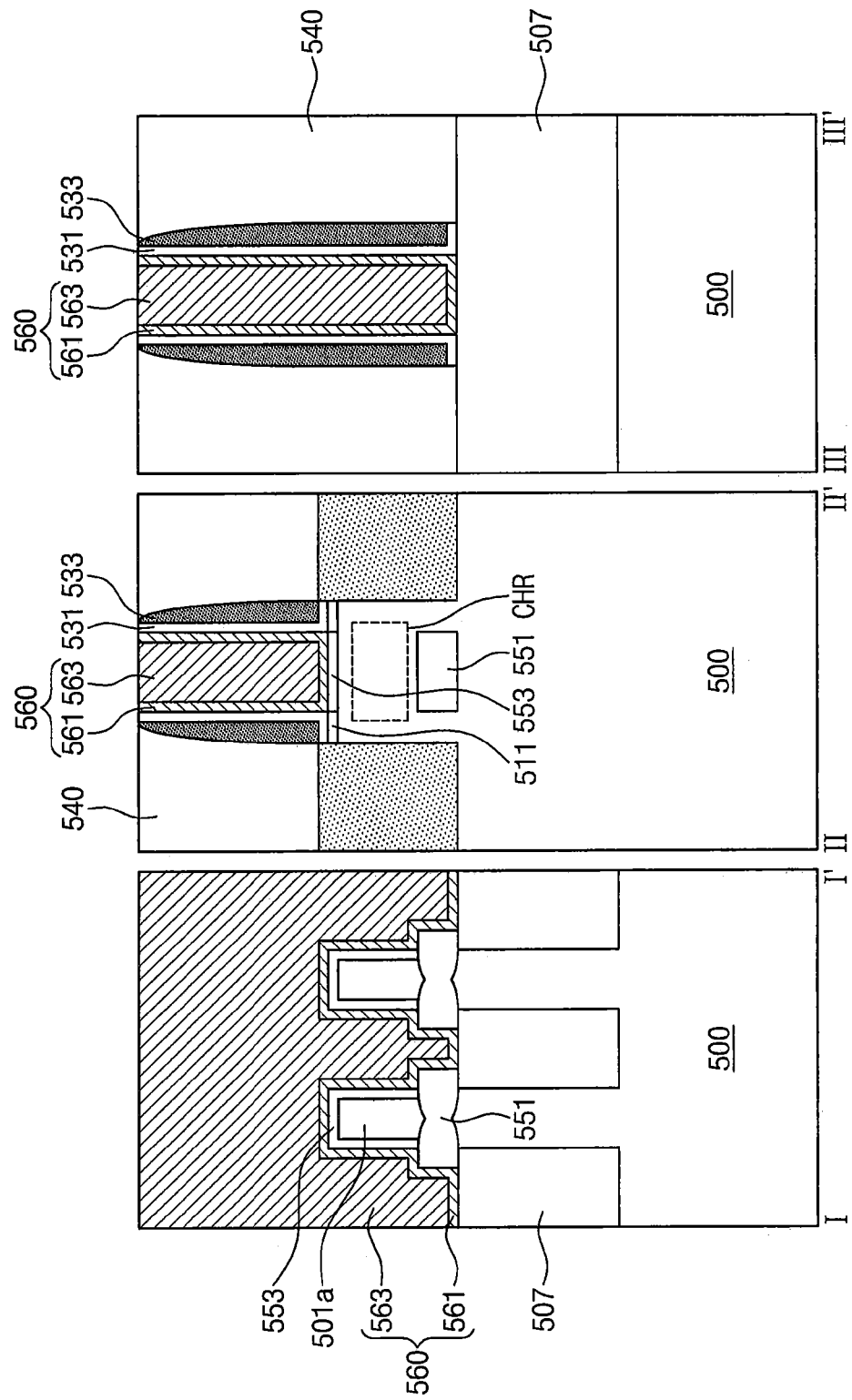

Referring to FIGS. 12, 26A, and 26B, a gate electrode 560 is formed in the gate region 541 having the gate insulating layer 553 (which may correspond to Block S1270 of FIG. 12).

In some embodiments, the gate electrode 560 may extend in a direction crossing the active pattern 501 (e.g., in a y-axis direction). The gate electrode 560 may be formed to be in contact with sidewalls of the local insulation pattern 551. The gate electrode 560 on the top surface of the device isolation pattern 507 may be thicker than the gate electrode 560 on the top surface of the active pattern 501. The gate electrode 560 may include a barrier metal pattern 561 and a metal pattern 563 that are sequentially stacked.

The barrier metal pattern 561 may be in direct contact with the protecting spacers 531. The barrier metal pattern 561 may be formed of a conductive material having a predetermined work function, so that the barrier metal pattern 561 may control a threshold voltage of the channel region CHR. In some embodiments, the barrier metal pattern 561 may be formed of one of metal nitrides. For example, the barrier metal pattern 561 may be formed of one of one or more metal nitride(s) such as titanium nitride, tantalum nitride, tungsten nitride, hafnium nitride, and/or zirconium nitride.

The metal pattern 563 may be formed one of conductive materials having a lower resistivity than the barrier metal pattern 561. For example, the metal pattern 563 may be formed of tungsten, copper, hafnium, zirconium, titanium, tantalum, aluminum, ruthenium, palladium, platinum, cobalt, nickel and/or conductive metal nitrides.

In some embodiments, forming the gate electrode 560 includes sequentially depositing a barrier metal layer and a metal layer in the gate region 541 having the gate insulating layer 553, and planarizing the metal layer and the barrier metal layer until the top surface of the interlayer insulating layer 540 is exposed.

The barrier metal layer and the metal layer may be formed using a chemical vapor deposition (CVD) technique, a physical vapor deposition (PVD) technique, and/or an atomic layer deposition (ALD) technique. The barrier metal layer may be deposited to conformally cover an inner surface of the gate region 541. In other words, the barrier metal layer may be formed to have a substantially uniform thickness on the gate insulating layer 553 and the protecting spacer 531 that are exposed by the gate region 541. The planarization process of the barrier metal layer and the metal layer may be performed using a blanket anisotropic etching process and/or a chemical mechanical polishing (CMP) process.

Meanwhile, if the semiconductor device includes a CMOS structure, forming the gate electrode 560 may include forming a gate electrode of the NMOSFET, and forming a gate electrode of the PMOSFET.

Figure 27:
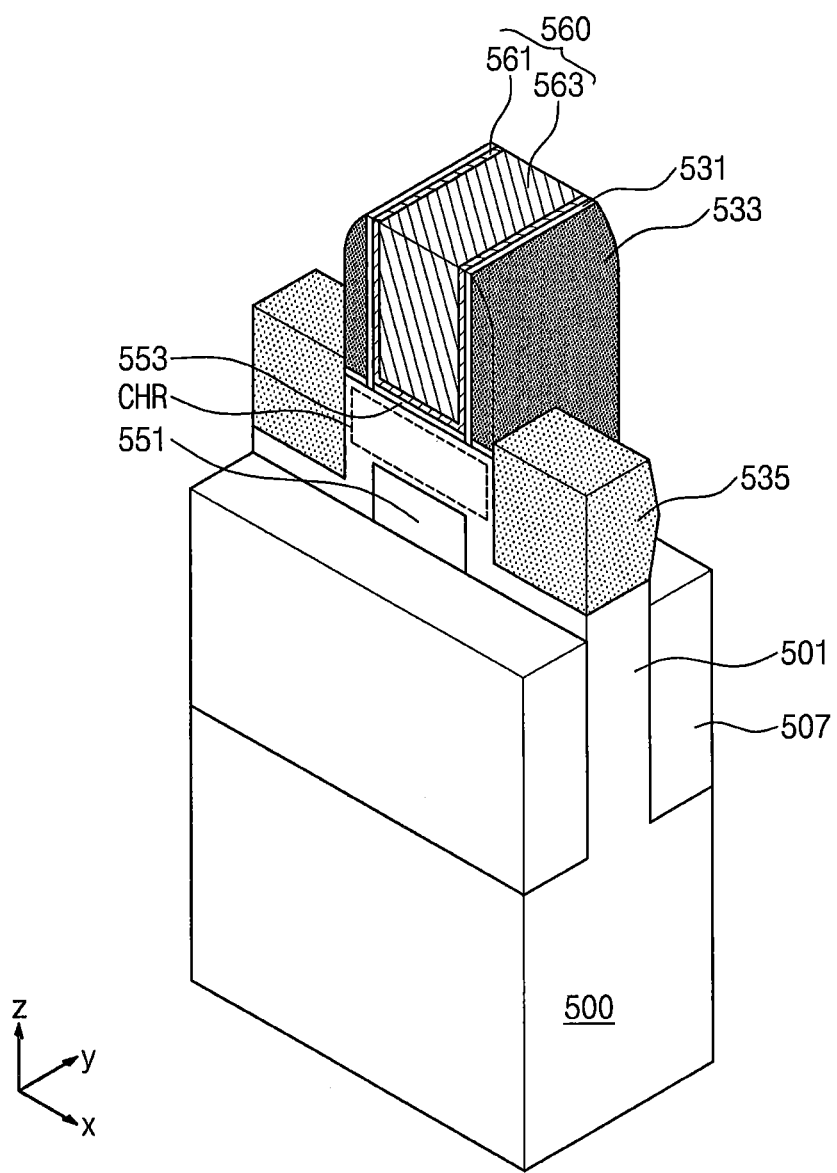
FIG. 27 is a cross-sectional view illustrating structural features of a semiconductor device according to other embodiments of the inventive concepts.

FIG. 27 is a cross-sectional view illustrating structural features of a semiconductor device according to other embodiments of the inventive concepts.

Referring to FIG. 27, a gate electrode 560 may be disposed to cross over an active pattern 501 extending from a semiconductor substrate 500.

In some embodiments, the semiconductor substrate 500 may be a bulk silicon wafer, and the active pattern 501 may have a bar-shape extending in one direction (i.e., an x-axis direction). The active pattern 501 may include a channel region CHR under the gate electrode 560 and source/drain regions at both sides of the channel region CHR in a horizontal view. Source/drain electrodes 535 may be disposed at the source/drain regions of the active pattern 501. In some embodiments, the source/drain electrodes 535 may include epitaxial patterns epitaxially grown from the active pattern 501.

In some embodiments, a local insulation pattern 551 is locally disposed between the channel region CHR and the semiconductor substrate 501 in a vertical view. The local insulation pattern 551 may be disposed between the source/drain electrodes 535 in a horizontal view. The local insulation pattern 551 may be formed of silicon oxide. A width of the local insulation pattern 551 may be substantially equal to or greater than a width of the active pattern 501. A top surface of the local insulation pattern 551 may be higher than a top surface of the device isolation pattern 507. Sidewalls of the local insulation pattern 551 may be in contact with the gate electrode 560, as illustrated in FIG. 26B.

In some embodiments, the gate electrode 560 may extend in a direction crossing the active pattern 501 (i.e., a y-axis direction). The gate electrode 560 on the top surface of the device isolation pattern 507 may be thicker than the gate electrode 560 on the top surface of the active pattern 501. Since the gate electrode 560 covers the sidewalls of the local insulation pattern 551, a bottommost surface of the gate electrode 560 may be lower than the top surface of the local insulation pattern 551. The gate electrode 560 may include a barrier metal pattern 561 and a metal pattern 562 that are sequentially stacked.

A gate insulating layer 553 may be disposed between the gate electrode 560 and the channel region CHR. In some embodiments, the gate insulating layer 553 may be formed to surround the channel region CHR of the active pattern 501. The gate insulating layer 553 may include at least one high-k dielectric layer. For example, the gate insulating layer 553 may be formed of a hafnium oxide layer, a hafnium silicate layer, a zirconium oxide layer, and/or a zirconium silicate layer.

In some embodiments, sidewall spacers 533 may be disposed on both sidewalls of the gate electrode 560, respectively. A protecting spacer 531 may be disposed between each of the sidewall spacers 533 and each of the sidewalls of the gate electrode 560.

In more detail, the sidewall spacer 533 may have a horn-shape and may be formed of an insulating material. The protecting spacer 531 may be formed of an insulating material having an etch selectivity with respect to the sidewall spacer 533. The protecting spacer 531 may have an L-shape on, and in some embodiments covering, the sidewall of the gate electrode 560 and a bottom surface of the sidewall spacer 533. For example, the sidewall spacer 533 may be formed of silicon nitride and/or silicon oxynitride. The protecting spacer 531 may be formed of at least one metal oxide layer such as a tantalum oxide layer, a titanium oxide layer, a hafnium oxide layer, a zirconium oxide layer, an aluminum oxide layer, an yttrium oxide layer, a niobium oxide layer, a cesium oxide layer, an indium oxide layer, an iridium oxide layer, a barium-strontium titanate (BST) layer, and/or a lead zirconate titanate (PZT) layer.

Figure 28:
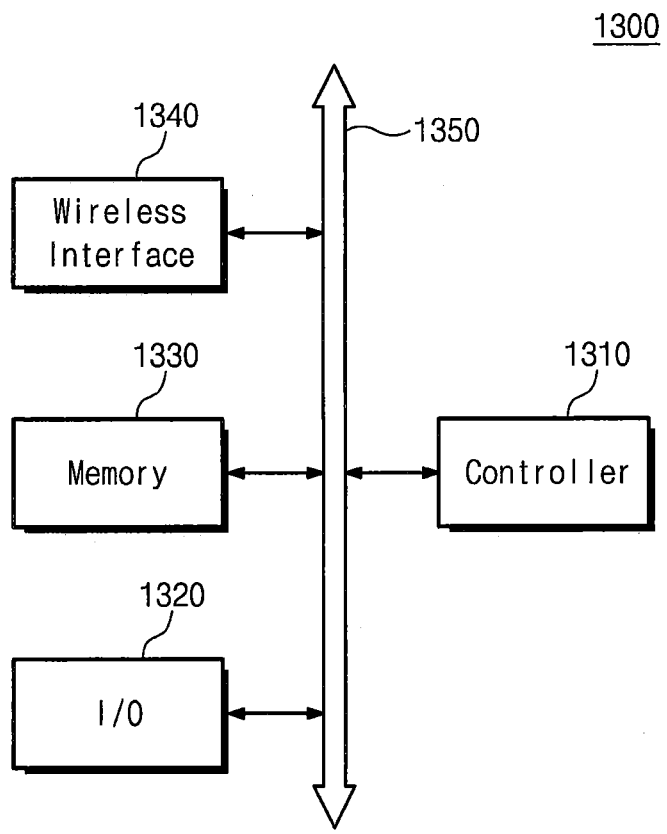
FIG. 28 is a schematic block diagram illustrating an example of electronic devices including semiconductor devices according to embodiments of the inventive concepts.
Figure 29:
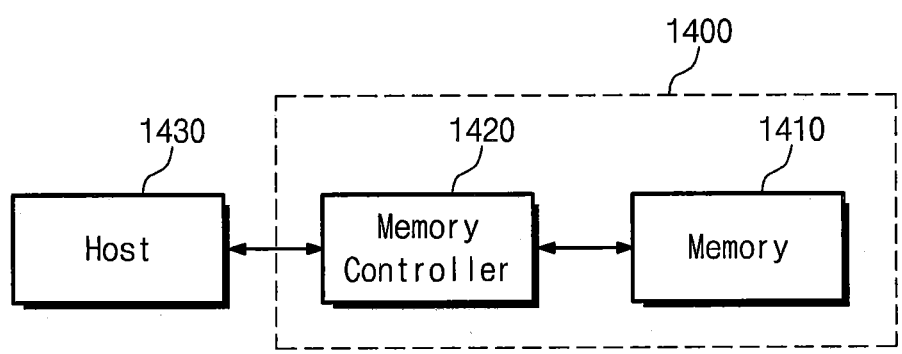
FIG. 29 is a schematic block diagram illustrating an example of memory cards including semiconductor devices according to embodiments of the inventive concepts.

FIG. 28 is a schematic block diagram illustrating an example of electronic devices including semiconductor devices according to embodiments of the inventive concepts. FIG. 29 is a schematic block diagram illustrating an example of memory cards including semiconductor devices according to embodiments of the inventive concepts.

Referring to FIG. 28, an electronic device 1300 including the semiconductor device according to embodiments of the inventive concepts may be one of a personal digital assistant (PDA), a laptop computer, a portable computer, a web tablet, a wireless phone, a mobile phone, a digital music player, a cable/wireless electronic device, or any composite electronic device including at least two thereof. The electronic device 1300 may include a controller 1310, an input/output (I/O) unit 1320 (e.g., a keypad, a keyboard, or a display), a memory device 1330, a wireless interface unit 1340 that are coupled to each other through a data bus 1350. For example, the controller 1310 may include a microprocessor, a digital signal processor, a microcontroller, and/or another logic device having a similar function to any one thereof. For example, the memory device 1330 may store commands executed by the controller 1310. Additionally, the memory device 1330 may store user's data. The memory device 1330, the controller 1310, the wireless interface 1340 and/or the I/O unit 1320 may include at least one of the semiconductor devices in the aforementioned embodiments of the inventive concepts. The electronic device 1300 may use the wireless interface unit 1340 in order to transmit data to a wireless communication network communicating with a radio frequency (RF) signal or in order to receive data from the network. For example, the wireless interface unit 1340 may include an antenna and/or a wireless transceiver. The electronic device 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, and/or MMDS.

Referring to FIG. 29, the semiconductor devices according to embodiments of the inventive concepts may be used in order to realize memory systems. A memory system 1400 may include a memory device 1410 and a memory controller 1420 that are provided in order to store massive data. The memory controller 1420 may control the memory device 1410 in order to read or write data from/into the memory device 1410 in response to read/write request of a host 1430. The memory controller 1420 may make an address mapping table for mapping an address provided from the host 1430 (e.g., a mobile device or a computer system) into a physical address of the memory device 1410. The memory device 1410 and/or the memory controller 1420 may include at least one of the semiconductor devices according to the above embodiments of the inventive concepts.

The semiconductor devices in the aforementioned embodiments may be encapsulated using various packaging techniques. For example, the semiconductor devices in the aforementioned embodiments may be encapsulated using a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and/or a wafer-level processed stack package (WSP) technique.

The package in which the semiconductor device according to one of the above embodiments is mounted may further include a controller and/or a logic device for controlling the semiconductor device.

According to embodiments of the inventive concepts, the insulation pattern is formed under the channel region, so that the short channel effect may be improved or reduced in the fin field effect transistors. Additionally, the source/drain regions are directly connected to the substrate, so that the fin field effect transistors with improved self-heating characteristics may be provided.

Moreover, according to embodiments of the inventive concepts, when the gate electrode is formed after the formation of the source/drain electrodes, the width of the dummy gate pattern may be substantially equal to the width of the gate electrode in the method of manufacturing the fin field effect transistor having the local insulation pattern under the channel region.

Furthermore, a process of recessing the device isolation layer is not performed after the dummy gate pattern is removed. Thus, it is possible to prevent the height of the interlayer insulating layer defining the height of the gate region from being reduced by the process of recessing the device isolation layer. As a result, a height of the gate electrode may, be prevented from being reduced.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of manufacturing a semiconductor device, the method comprising:
    patterning a semiconductor substrate to form an active pattern;
    forming oxidation reducing spacers on upper sidewalls of the active pattern;
    forming device isolation patterns spaced apart from bottom surfaces of the oxidation reducing spacers, the device isolation patterns exposing portions of lower sidewalls of the active pattern;
    forming a dummy gate pattern crossing over the active pattern and the oxidation reducing spacers, the dummy gate pattern being in direct contact with the active pattern between the device isolation pattern and the oxidation reducing spacers;
    forming protecting spacers on both sidewalls of the dummy gate pattern, the protecting spacers comprising a material having an etch selectivity with respect to the oxidation reducing spacers;
    removing the dummy gate pattern to form a gate region exposing lower sidewalls of the active pattern between the protecting spacers;
    oxidizing the lower sidewalls of the active pattern exposed by the gate region to form a local insulation pattern in the active pattern; and
    forming a gate electrode in the gate region.

2. The method of claim 1, wherein patterning the semiconductor substrate to form the active pattern comprises:
    forming a mask pattern defining the active pattern on the semiconductor substrate;
    etching the semiconductor substrate using the mask pattern as an etch mask, thereby forming trenches; and
    forming device isolation layers exposing upper sidewalls of the active pattern in the trenches,
    wherein the oxidation reducing spacers are formed on the device isolation layers.

3. The method of claim 2, further comprising:
    recessing top surfaces of the device isolation layers to form device isolation patterns exposing lower sidewalls of the active pattern after forming the oxidation reducing spacers.

4. The method of claim 1, wherein the gate electrode is in direct contact with a sidewall of the local insulation pattern.

5. The method of claim 4, further comprising:
    forming device isolation patterns spaced apart from bottom surfaces of the oxidation reducing spacers before forming the dummy gate pattern, the device isolation patterns exposing portions of the lower sidewalls of the active pattern.

6. The method of claim 5, wherein the dummy gate pattern is in direct contact with the active pattern between the device isolation pattern and the oxidation reducing spacer.

7. The method of claim 4, further comprising:
    forming sidewall spacers on sidewalls of the protecting spacers before the gate region is formed,
    wherein the sidewall spacers comprise a different insulating material from the protecting spacers.

8. The method of claim 1, wherein forming the gate electrode comprises:
    removing the oxidation reducing spacers to expose an upper portion of the active pattern; and
    forming a conductive layer in the gate region exposing the upper portion of the active pattern, the conductive layer directly contacting the protecting spacers.

9. The method of claim 1, wherein the active pattern includes a channel region under the dummy gate pattern and source/drain regions at both sides of the channel region, the method further comprising:
    forming an epitaxial layer at the source/drain regions of the active pattern before the gate region is formed.

10. A method of manufacturing a semiconductor device, the method comprising:
    patterning a semiconductor substrate to form an active pattern;
    forming oxidation reducing spacers on upper sidewalls of the active pattern;
    forming a dummy gate pattern crossing over the active pattern and the oxidation reducing spacers;
    forming protecting spacers on both sidewalls of the dummy gate pattern, the protecting spacers comprising a material having an etch selectivity with respect to the oxidation reducing spacers;
    forming sidewall spacers on sidewalls of the protecting spacers, the sidewall spacers comprising a different insulating material from the protecting spacers;
    forming an interlayer insulating layer on the semiconductor substrate to cover the sidewall spacers and to expose a top surface of the dummy gate pattern;
    removing the dummy gate pattern to form a gate region exposing lower sidewalls of the active pattern between the protecting spacers;
    oxidizing the lower sidewalls of the active pattern exposed by the gate region to form a local insulation pattern in the active pattern; and
    forming a gate electrode in the gate region.

11. The method of claim 10, further comprising:
    forming device isolation patterns spaced apart from bottom surfaces of the oxidation reducing spacers before forming the dummy gate pattern, the device isolation patterns exposing portions of the lower sidewalls of the active pattern.

12. The method of claim 11, wherein the dummy gate pattern is in direct contact with the active pattern between the device isolation pattern and the oxidation reducing spacer.

13. The method of claim 11, wherein each of the protecting spacers includes a first portion on the sidewall of the dummy gate pattern and a second portion on the device isolation pattern, and
    wherein each of the sidewall spacers is spaced apart from the device isolation pattern with the second portion interposed therebetween.

14. The method of claim 10, wherein the gate electrode is in direct contact with a sidewall of the local insulation pattern.

15. A method of manufacturing a semiconductor device, the method comprising:
    patterning a semiconductor substrate to form an active pattern;

forming oxidation reducing spacers on upper sidewalls of the active pattern;

forming a dummy gate pattern crossing over the active pattern and the oxidation reducing spacers;

forming protecting spacers on both sidewalls of the dummy gate pattern, the protecting spacers comprising a material having an etch selectivity with respect to the oxidation reducing spacers;

removing the dummy gate pattern to form a gate region exposing lower sidewalls of the active pattern between the protecting spacers;

oxidizing the lower sidewalls of the active pattern exposed by the gate region to form a local insulation pattern in the active pattern, a first height of the local insulation pattern under the oxidation reducing spacer being greater than a second height of the local insulation layer under the active pattern between the protecting spacers; and forming a gate electrode in the gate region.

16. The method of claim 15, wherein the local insulation pattern has an uneven top surface and an uneven bottom surface.

* * * * *